United States Patent
Lin

(10) Patent No.: US 7,639,048 B2
(45) Date of Patent: Dec. 29, 2009

(54) SYSTEM AND METHOD OF DETECTING A PHASE, A FREQUENCY AND AN ARRIVAL-TIME DIFFERENCE BETWEEN SIGNALS

(75) Inventor: Wen T. Lin, Spring House, PA (US)

(73) Assignee: Keystone Semiconductor, Inc., Spring House, PA (US)

( * ) Notice: Subject to any disclaimer, the term of this patent is extended or adjusted under 35 U.S.C. 154(b) by 0 days.

(21) Appl. No.: 11/815,377

(22) PCT Filed: Jul. 28, 2005

(86) PCT No.: PCT/US2005/026842

§ 371 (c)(1),
(2), (4) Date: Aug. 2, 2007

(87) PCT Pub. No.: WO2006/083324

PCT Pub. Date: Aug. 10, 2006

(65) Prior Publication Data

US 2008/0150588 A1 Jun. 26, 2008

Related U.S. Application Data

(60) Provisional application No. 60/649,233, filed on Feb. 2, 2005, provisional application No. 60/654,835, filed on Feb. 22, 2005, provisional application No. 60/678,841, filed on May 6, 2005.

(51) Int. Cl.
*H03D 13/00* (2006.01)
(52) U.S. Cl. .............................................. 327/3; 327/7
(58) Field of Classification Search ........................ None
See application file for complete search history.

(56) References Cited

U.S. PATENT DOCUMENTS

| 3,292,083 | A | 12/1966 | Presbrey, Jr. | 324/76.41 |
| 4,814,726 | A | 3/1989 | Byrd et al. | 331/1 A |
| 5,650,754 | A | 7/1997 | Joshi et al. | 331/36 C |
| 6,157,218 | A | 12/2000 | Chen | 327/7 |
| 6,385,267 | B1 | 5/2002 | Bowen et al. | 375/376 |
| 6,611,161 | B1 | 8/2003 | Kumar et al. | 327/157 |
| 6,987,406 | B1 * | 1/2006 | Chiu | 327/156 |
| 7,215,207 | B2 * | 5/2007 | Hsieh | 331/14 |
| 2003/0231707 | A1 | 12/2003 | French et al. | 375/226 |
| 2004/0201425 | A1 | 10/2004 | Lesso | 331/1 A |

(Continued)

*Primary Examiner*—Lincoln Donovan
*Assistant Examiner*—Hiep Nguyen
(74) *Attorney, Agent, or Firm*—Fox Rothschild LLP; Richard C. Woodbridge

(57) ABSTRACT

A system and method for detecting a phase and a frequency and an arrival-time difference between two signals (118 and 120) that minimizes delay and jitter, and has stable operation even when the two signals (118 and 120) are essentially identical. The system includes two single-ended charge-pump (188), phase-frequency detection (PFD) circuits (280). The first PFD is stable when a reference signal, supplied to a polarity determining flip-flop, leads the signal to be synchronized. A second, complementary, PFD circuit is stable, but has an inverted polarity output, when the signal to be synchronized, supplied to a polarity determining flip-flop, leads the reference signal. A polarity-selection logic-circuit (284) ensures that the first activated PFD controls the polarity a single-ended charge pump (188) for a time-period determined by the delay between the activation of the polarity determining and non-polarity determining flip-flops of the selected PFD.

34 Claims, 33 Drawing Sheets

A TYPICAL BPFD WITHOUT DEAD ZONE AND LINEAR STATE AS A PERFECT ARRIVAL-TIME DETECTOR AS THE SECOND EMBODIMENT

U.S. PATENT DOCUMENTS

| | | |
|---|---|---|
| 2005/0030001 A1* | 2/2005 | Jasa et al. ............... 324/76.53 |
| 2005/0250192 A1* | 11/2005 | Shanmugam et al. ....... 435/139 |
| 2005/0286505 A1* | 12/2005 | Harrison .................... 370/359 |
| 2006/0250192 A1* | 11/2006 | Hsieh ......................... 331/16 |
| 2007/0041483 A1* | 2/2007 | Iwata et al. ................ 375/374 |
| 2007/0071156 A1* | 3/2007 | Gregorius et al. ........... 375/376 |
| 2007/0109030 A1* | 5/2007 | Park ........................... 327/156 |
| 2008/0101524 A1* | 5/2008 | Jeong et al. ................. 375/376 |
| 2008/0125060 A1* | 5/2008 | Lin et al. .................... 455/126 |
| 2008/0152879 A1* | 6/2008 | Nashiki et al. .............. 428/212 |

\* cited by examiner

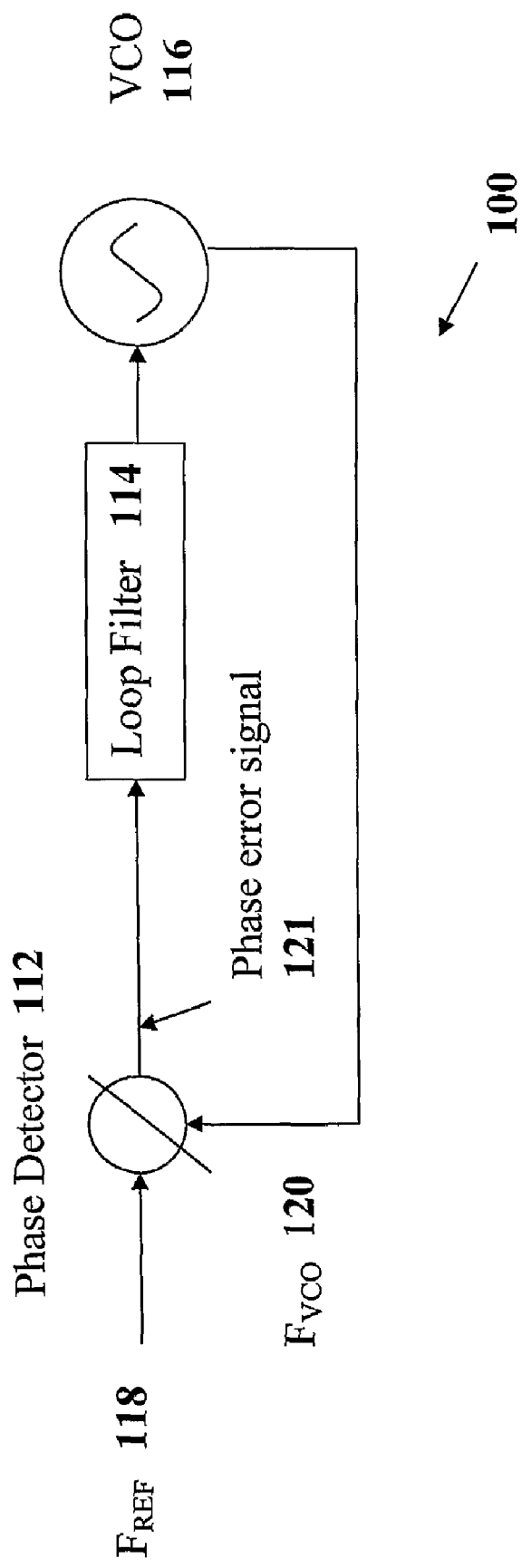
FIGURE 1 THE BUILDING BLOCKS OF A PHASE LOCKED LOOP

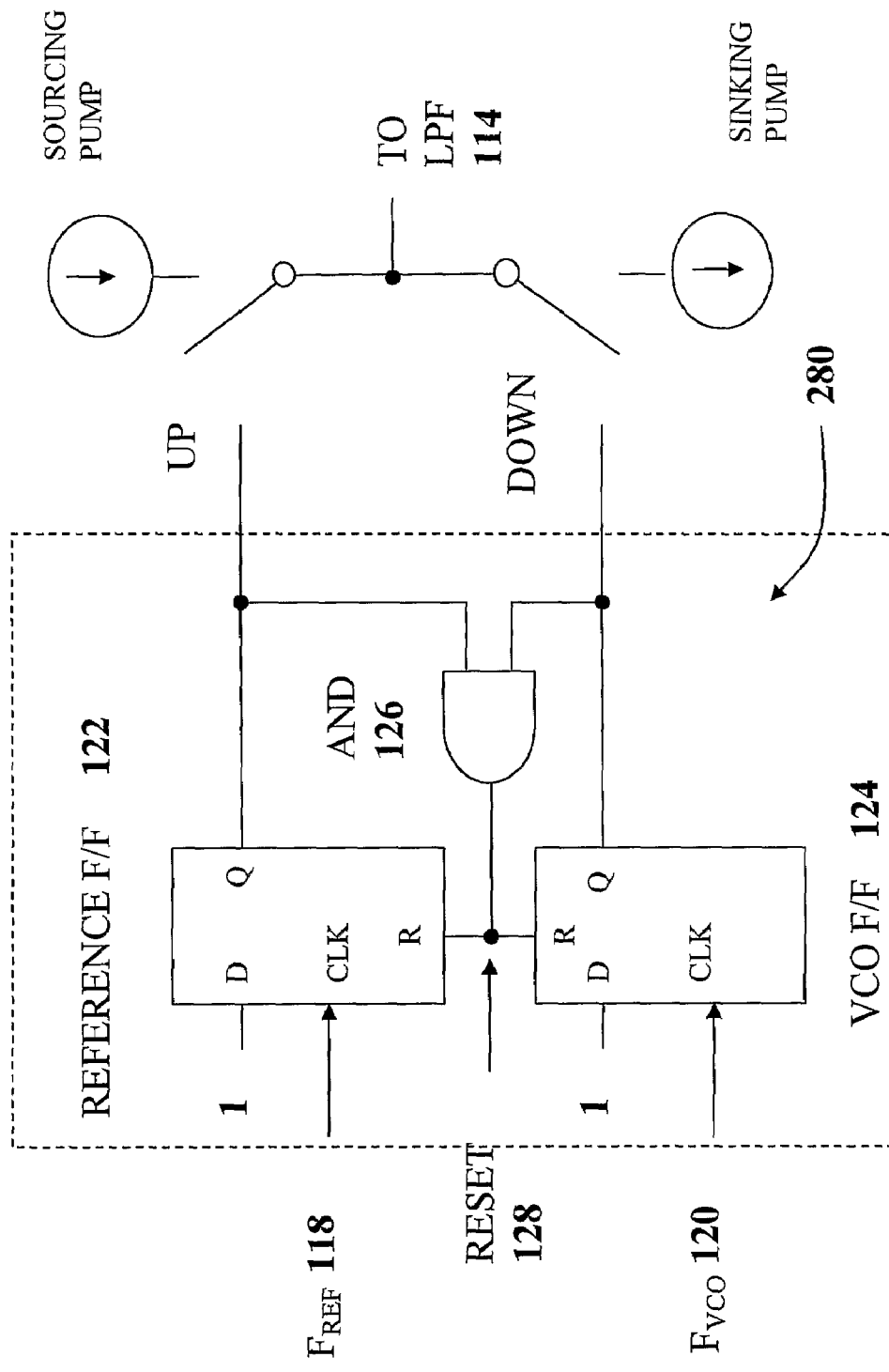
FIGURE 2 THE BASIC DIGITAL PHASE FREQUENCY DETECTOR WITH DOUBLE-ENDED CHARGE PUMPS

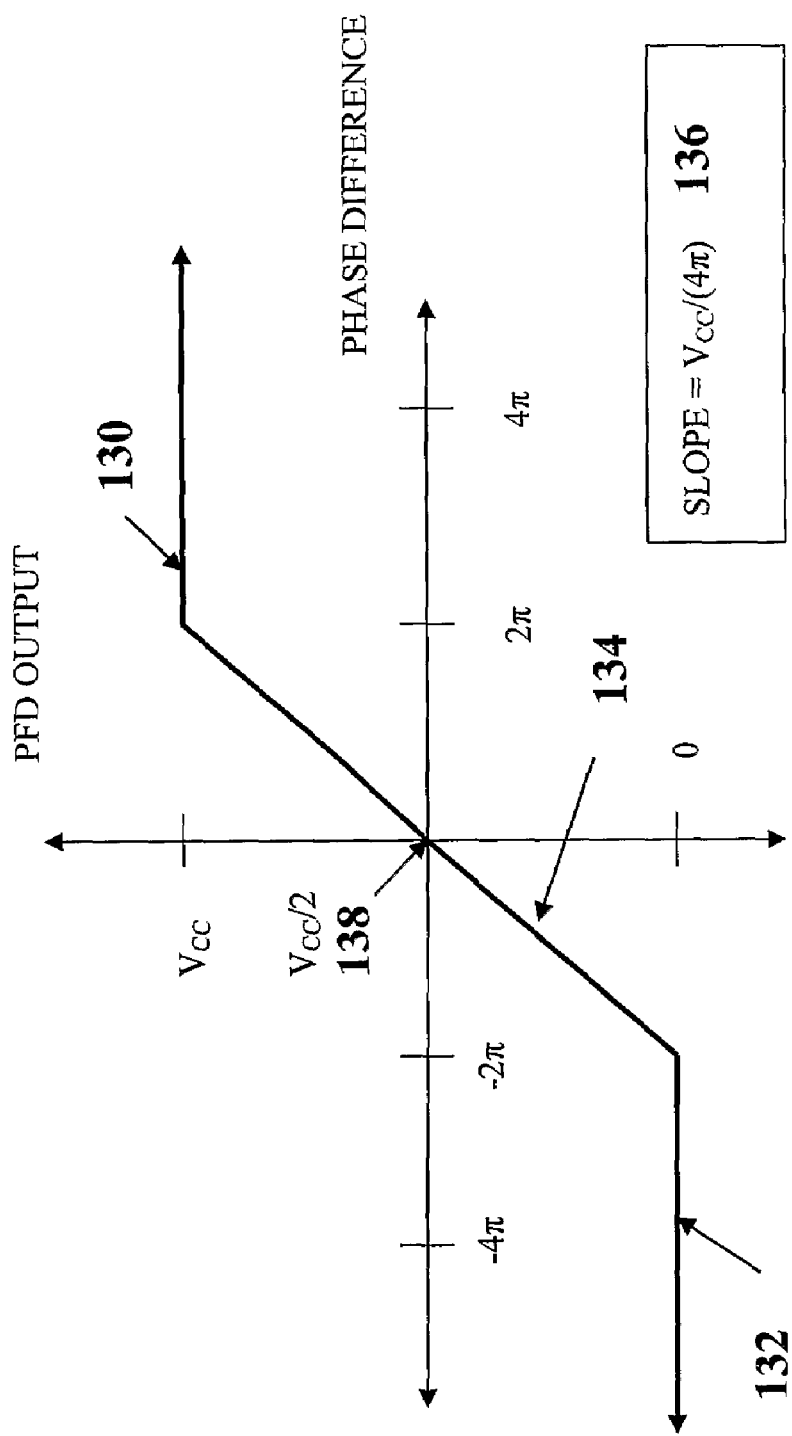
FIGURE 3  THE IDEAL CHARACTERISTIC OF PFD (CONCEPTUALLY)

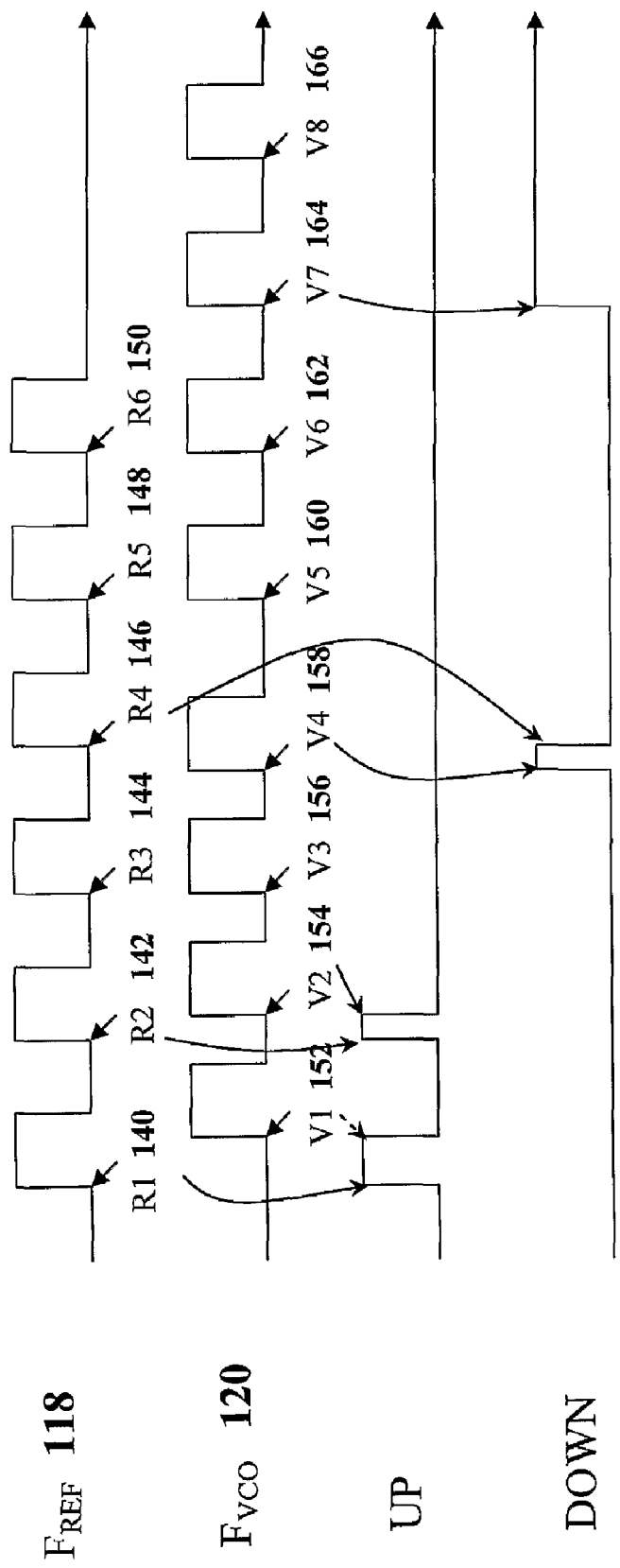
FIGURE 4   AN ILLUSTRATION FOR THE OPERATION OF AN IDEAL PFD

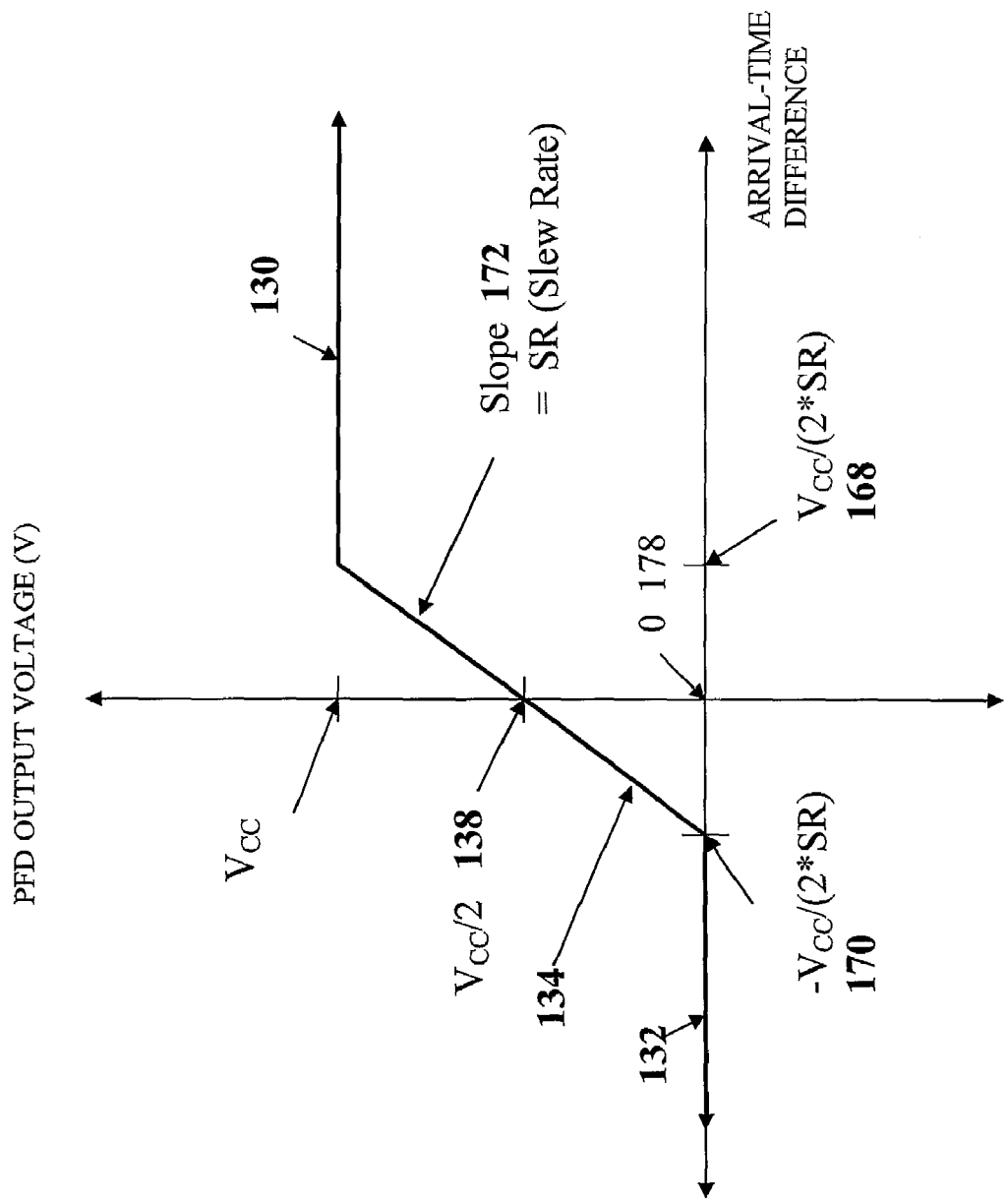
FIGURE 5 THE OUTPUT CHARACTERISTIC OF A PFD

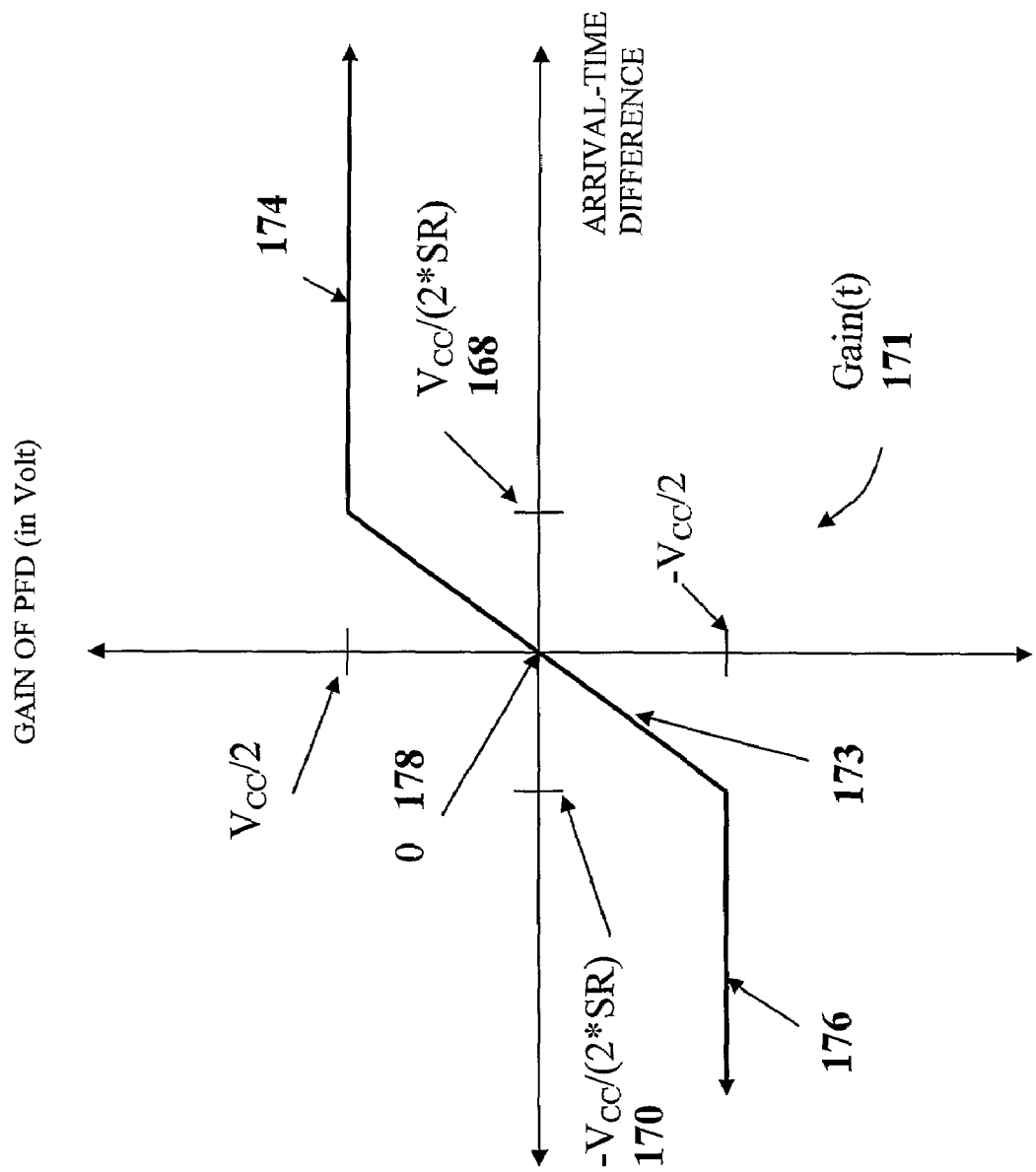
FIGURE 6 THE TRANSFER CHARACTERISTIC OF AN IDEAL PFD

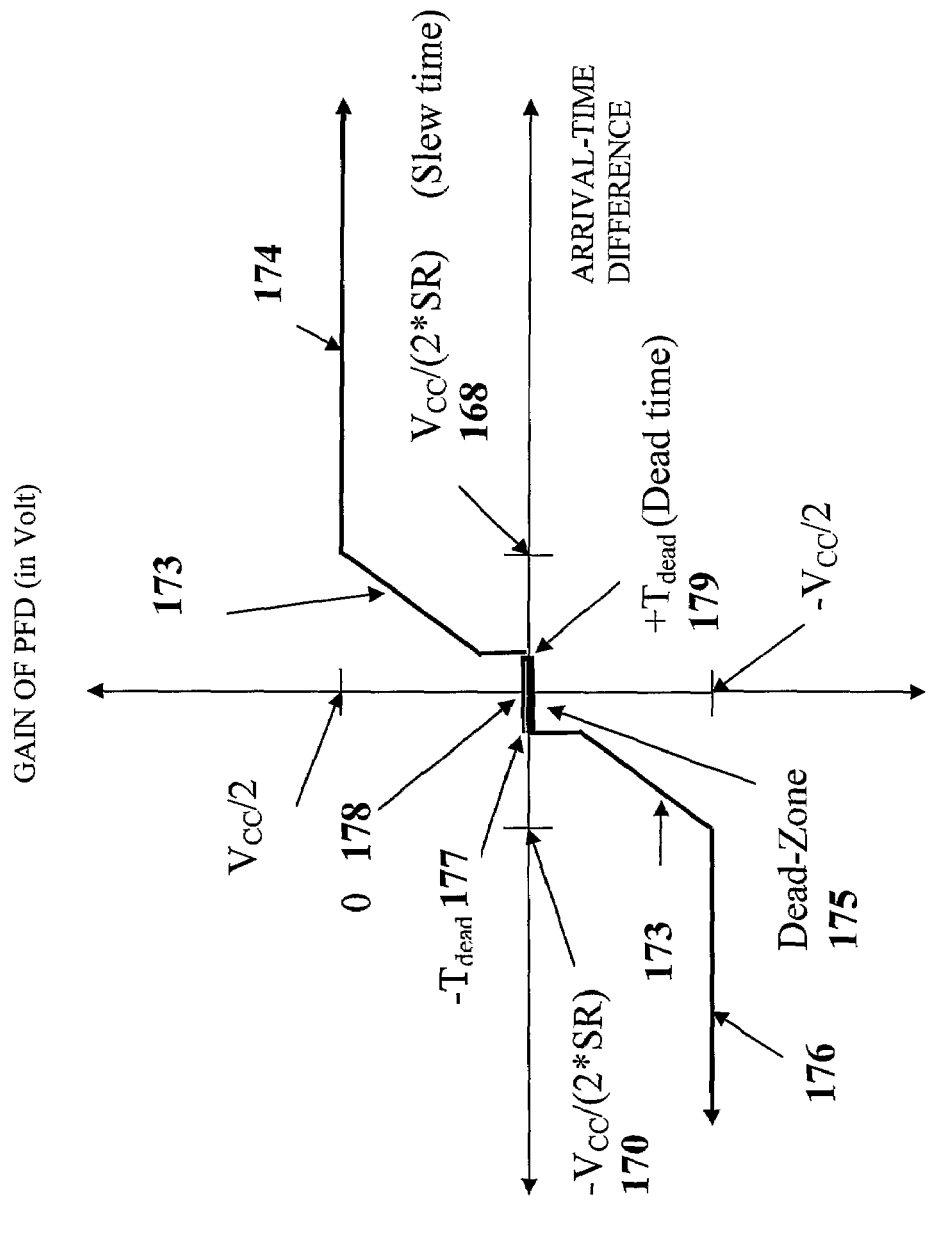
FIGURE 7 THE TRANSFER CHARACTERISTIC OF A PFD WITH A DEAD ZONE

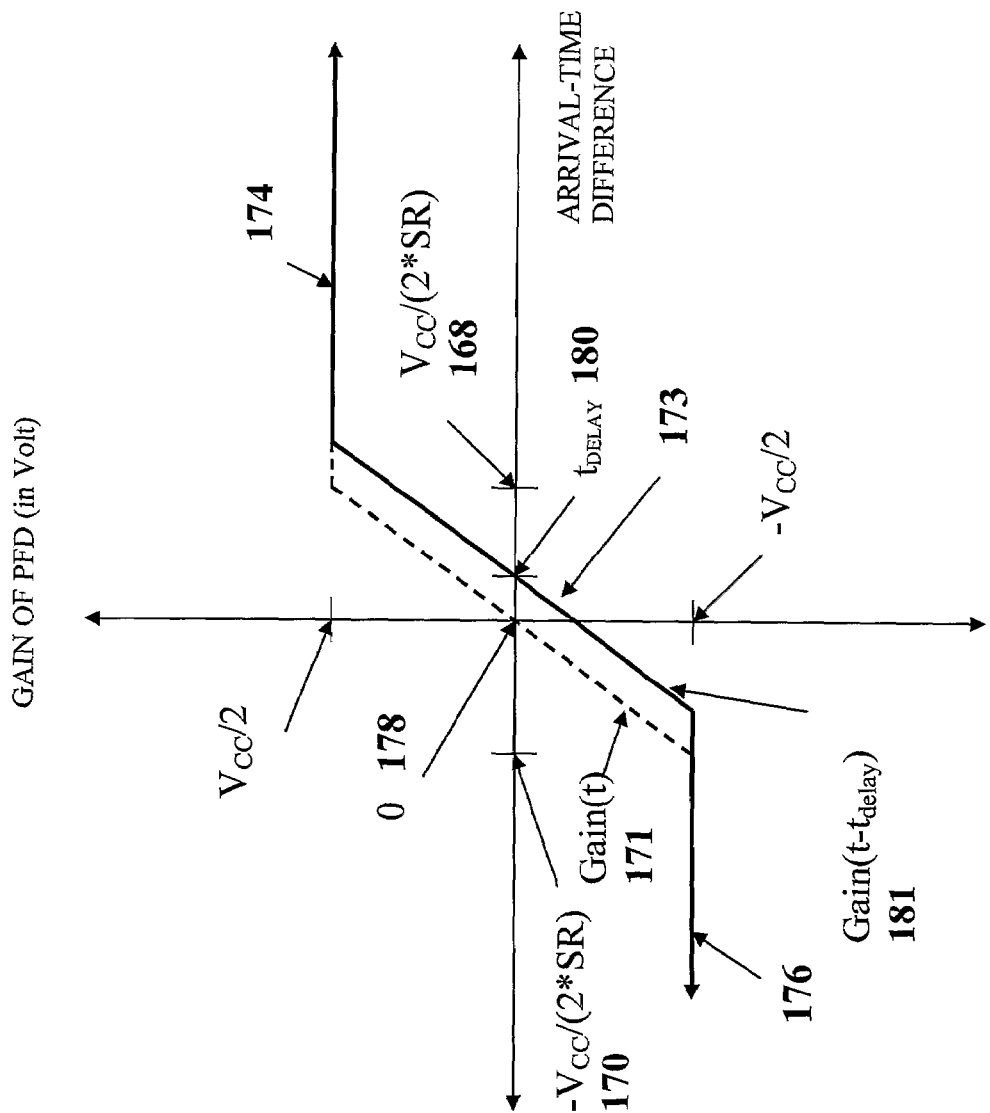
FIGURE 8 THE TRANSFER CHARACTERISTIC OF A PFD WITH A DELAY ERROR

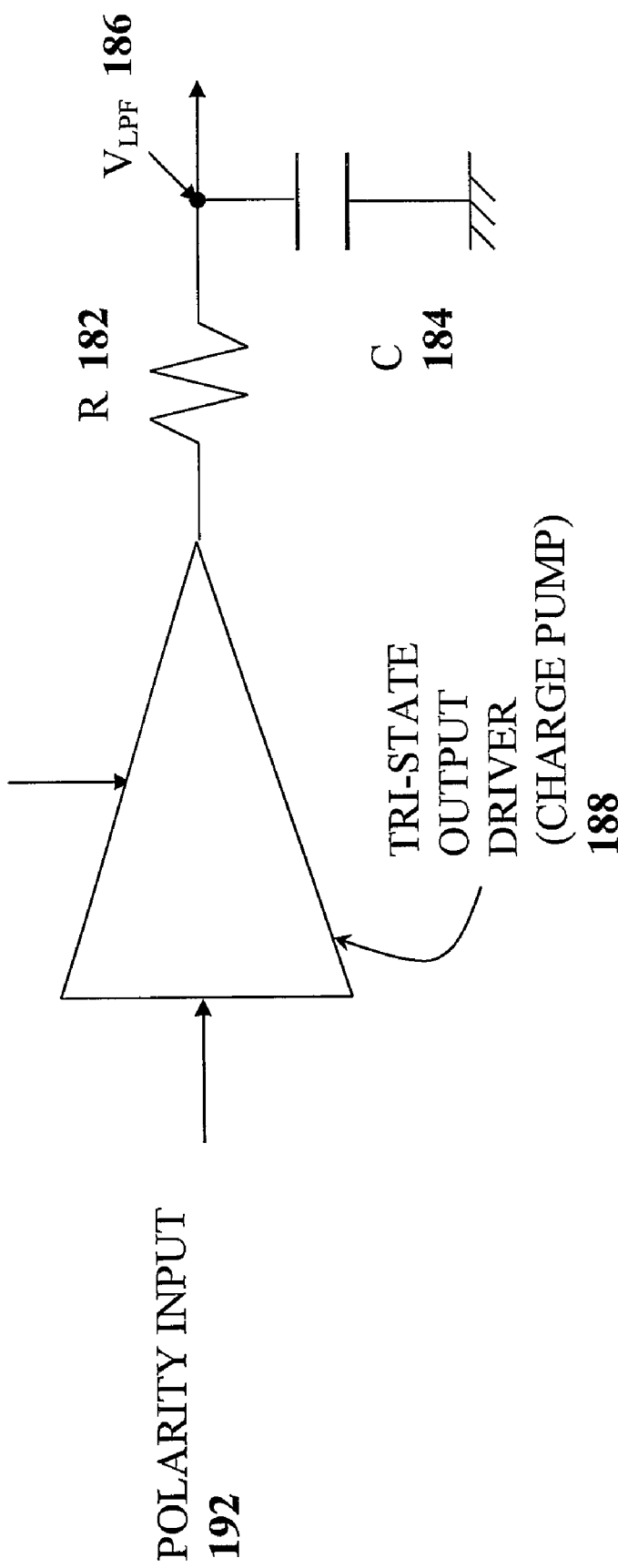
FIGURE 9 A TRI-STATE OUTPUT DRIVER AS A VOLTAGE CHARGE PUMP

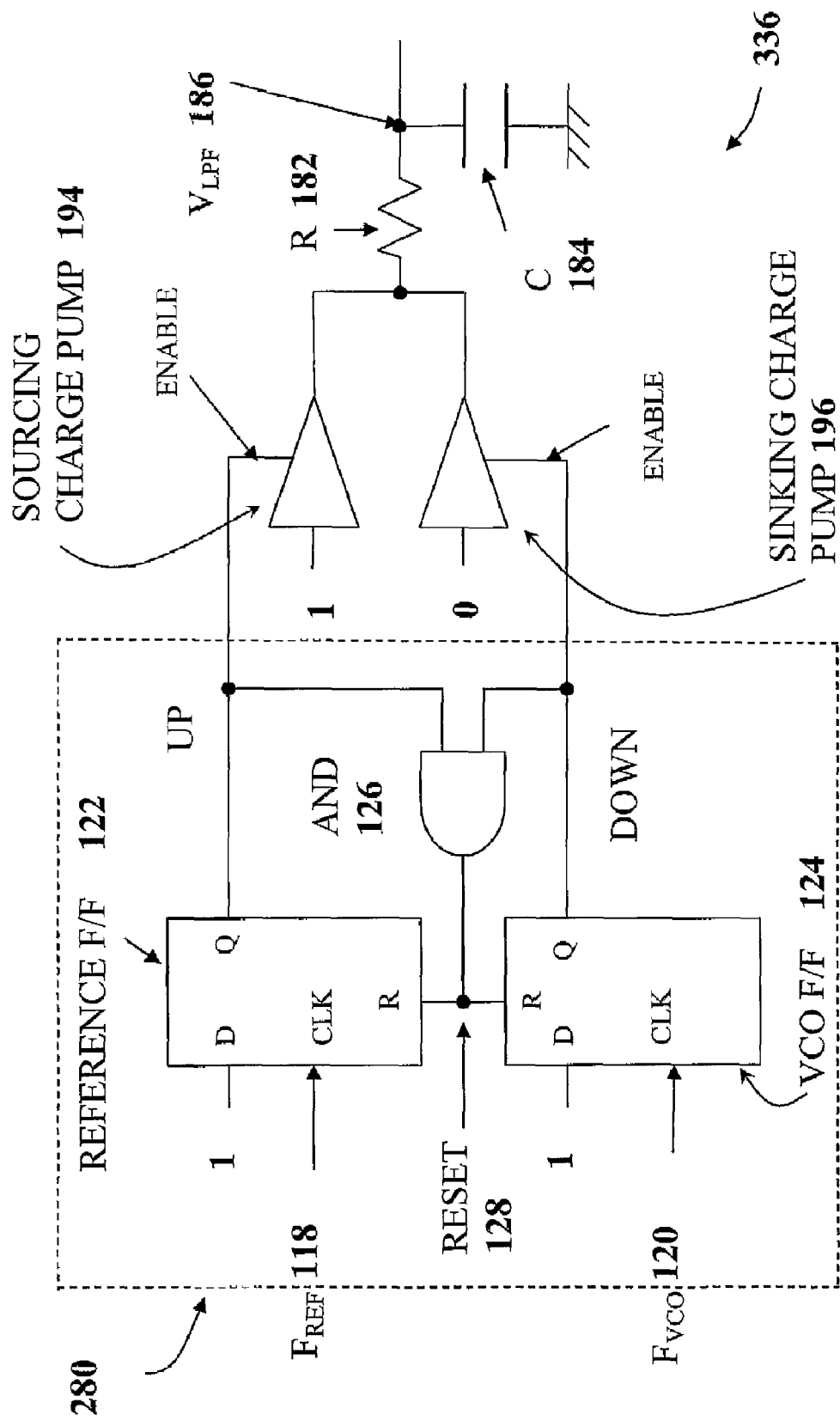
FIGURE 10 THE BASIC DIGITAL PHASE FREQUENCY DETECTOR WITH A DOUBLE-ENDED CHARGE PUMP OUTPUT

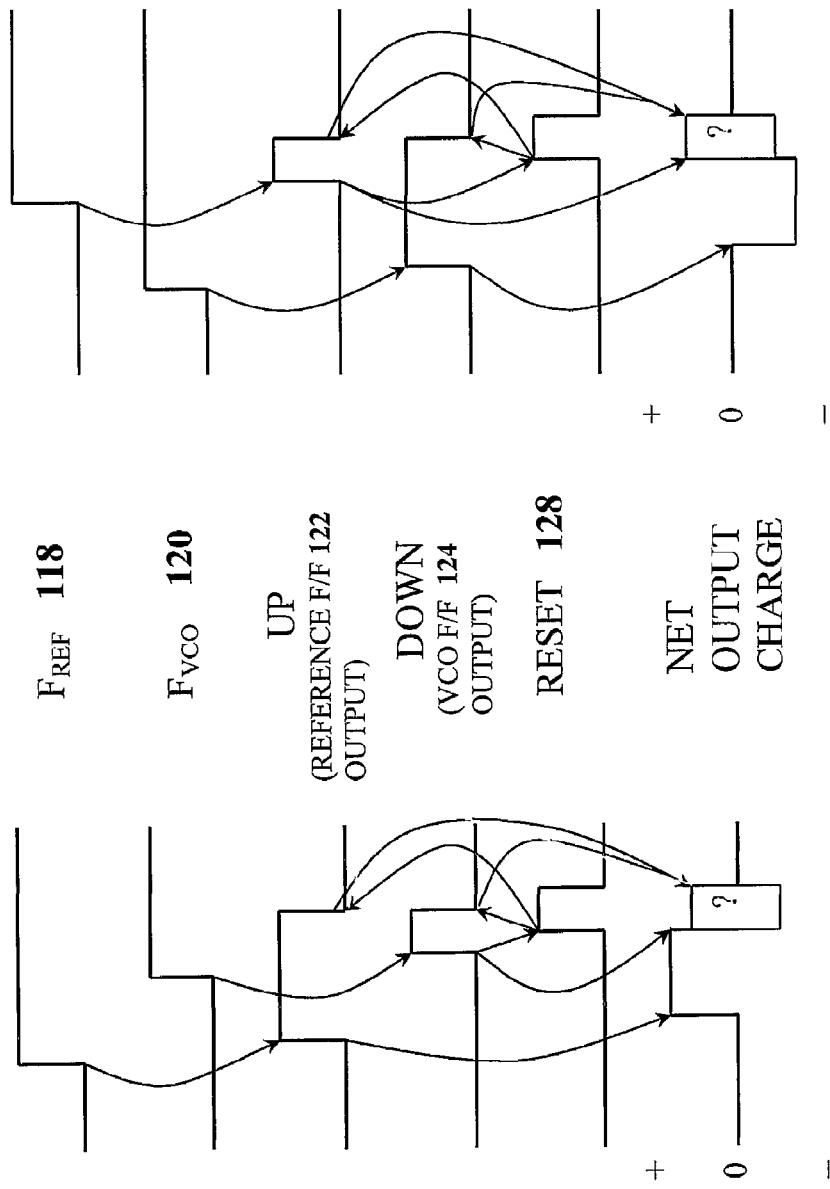
FIGURE 11   THE TIMING DIAGRAM FOR THE BASIC PFD WITH DOUBLE-ENDED CHARGE PUMP OUTPUT IN FIGURE 10

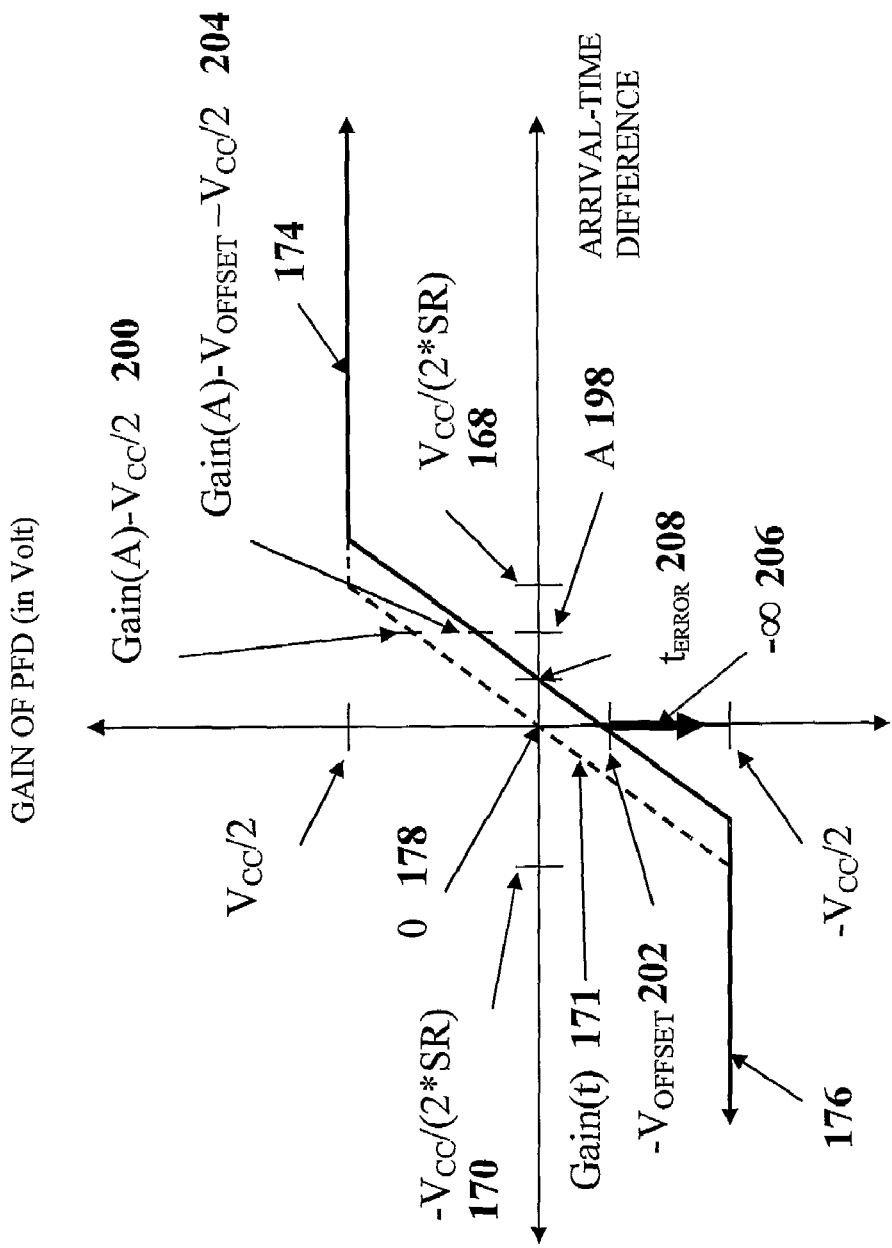
FIGURE 12 THE TRANSFER CHARACTERISTIC OF A PFD WITH A DOUBLE-ENDED CHARGE PUMP OUTPUT AND A NEGATIVE GLITCH AS ILLUSTRATED IN FIGURE 10

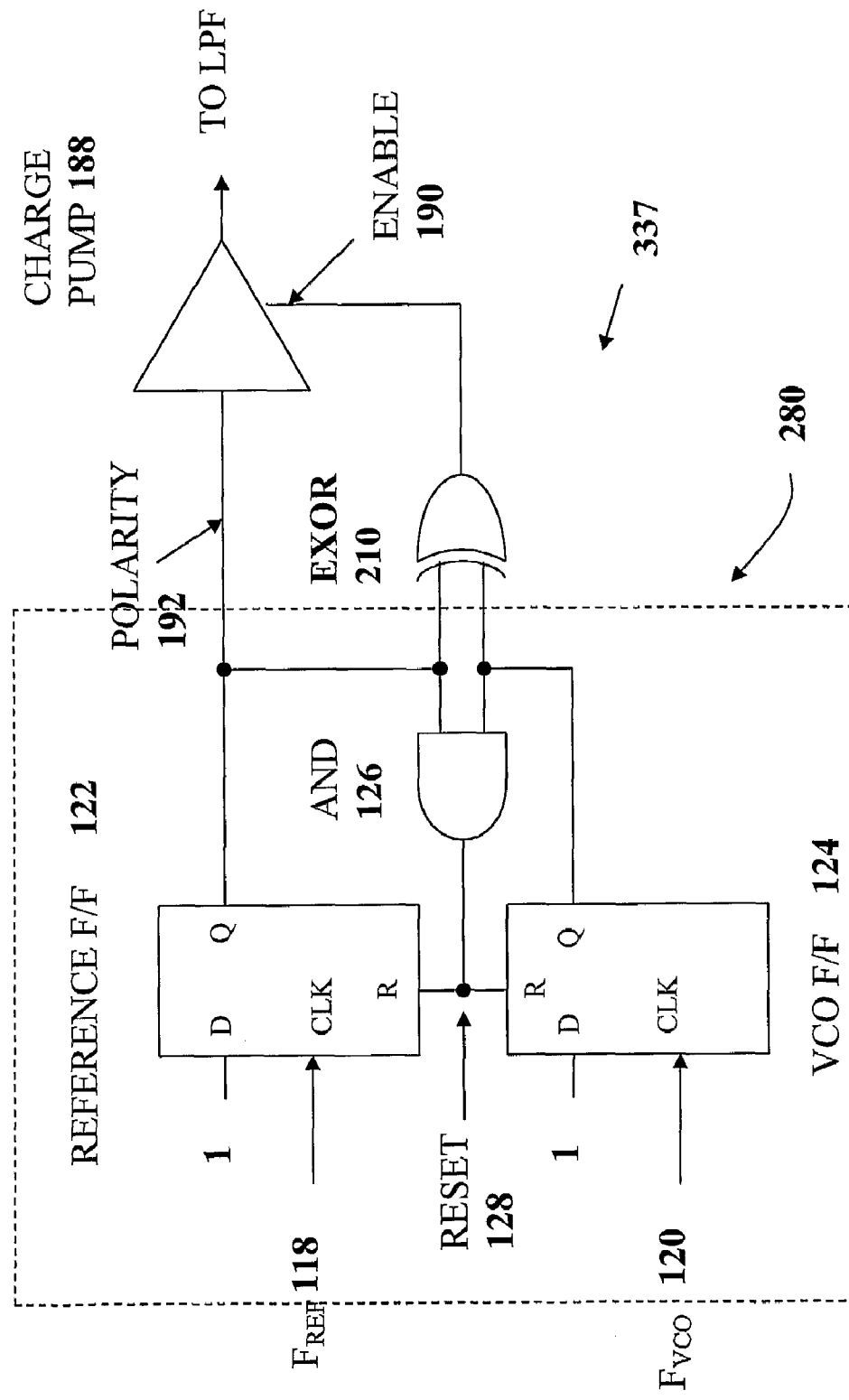
FIGURE 13 THE DIGITAL PHASE FREQUENCY DETECTOR WITH A SINGLE-ENDED CHARGE PUMP OUTPUT

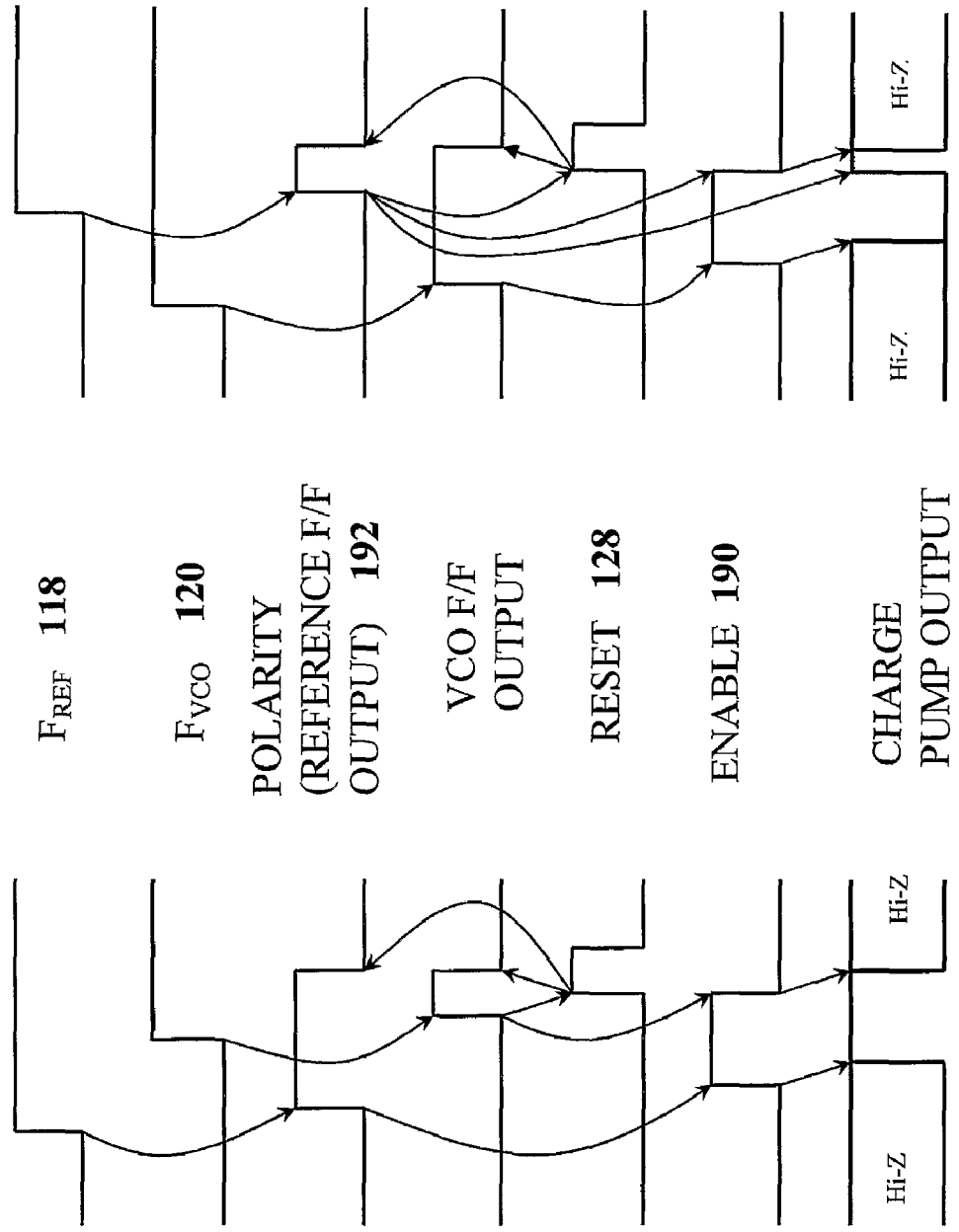
FIGURE 14  THE TIMING DIAGRAM FOR THE PFD WITH SINGLE-ENDED CHARGE PUMP OUTPUT AS ILLUSTRATED IN FIGURE 13

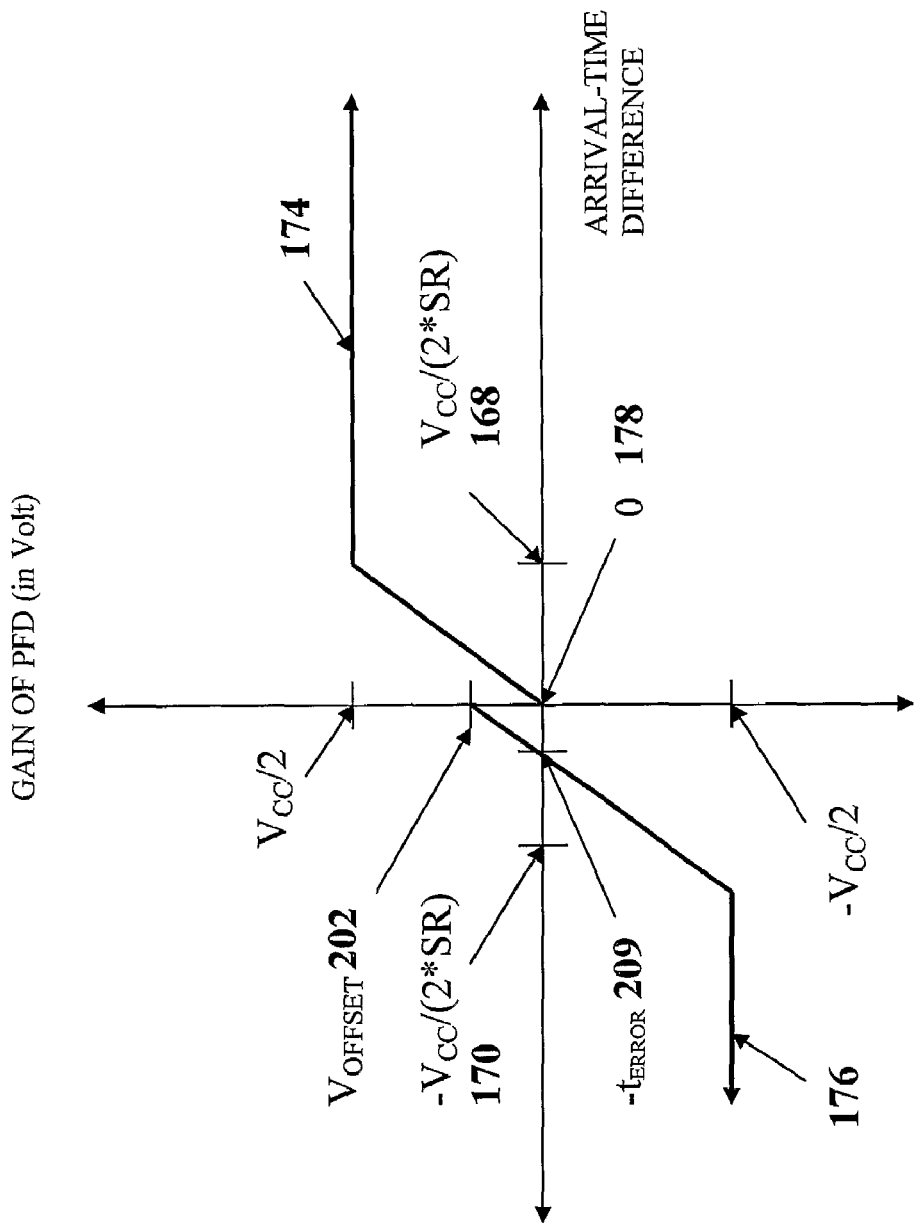
FIGURE 15 THE TRANSFER CHARACTERISTIC OF A PFD WITH A SINGLE-ENDED CHARGE PUMP OUTPUT AS ILLUSTRATED IN FIGURE 13

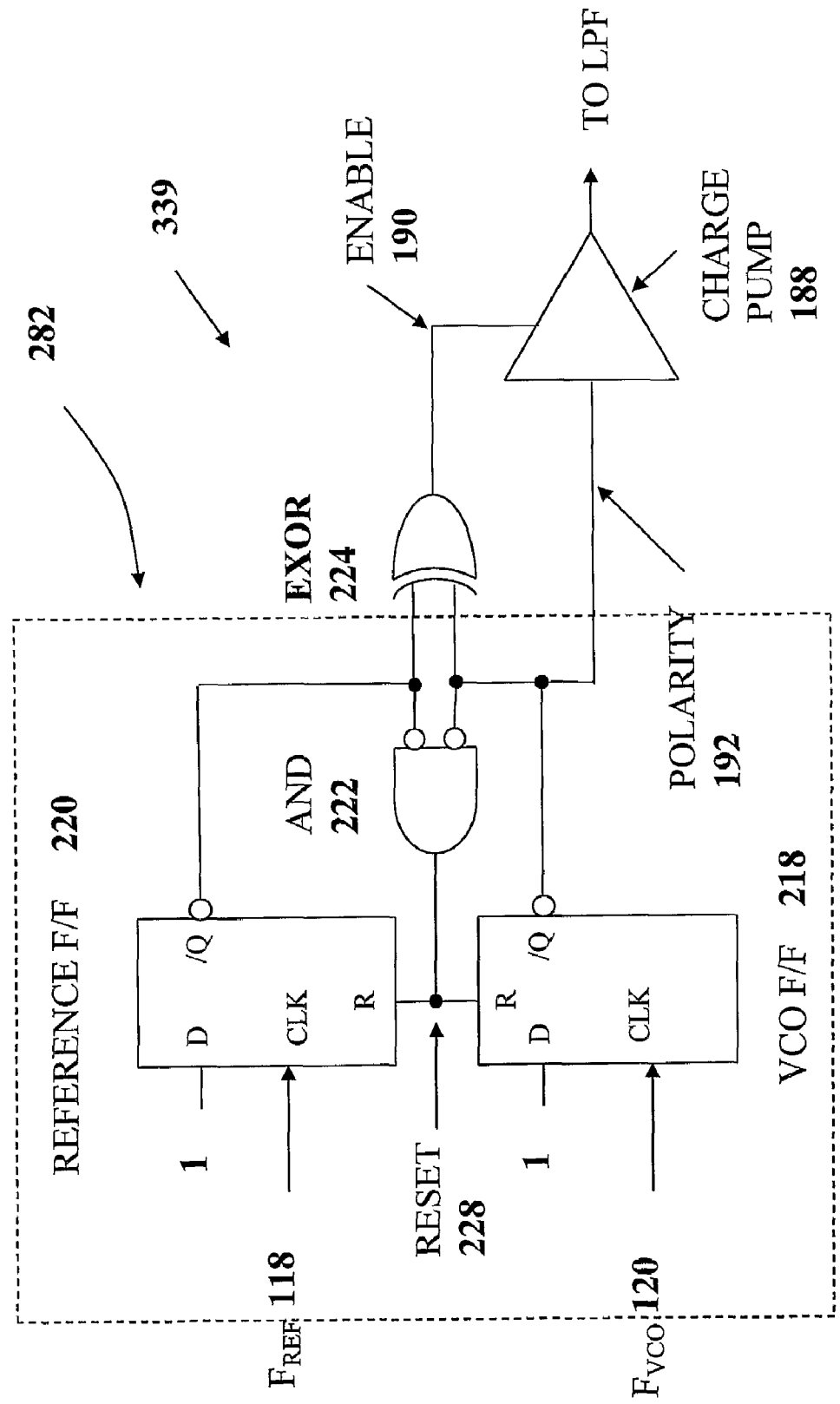
FIGURE 16 COMPLEMENTARY DIGITAL PHASE FREQUENCY DETECTOR WITH A SINGLE-ENDED CHARGE PUMP OUTPUT

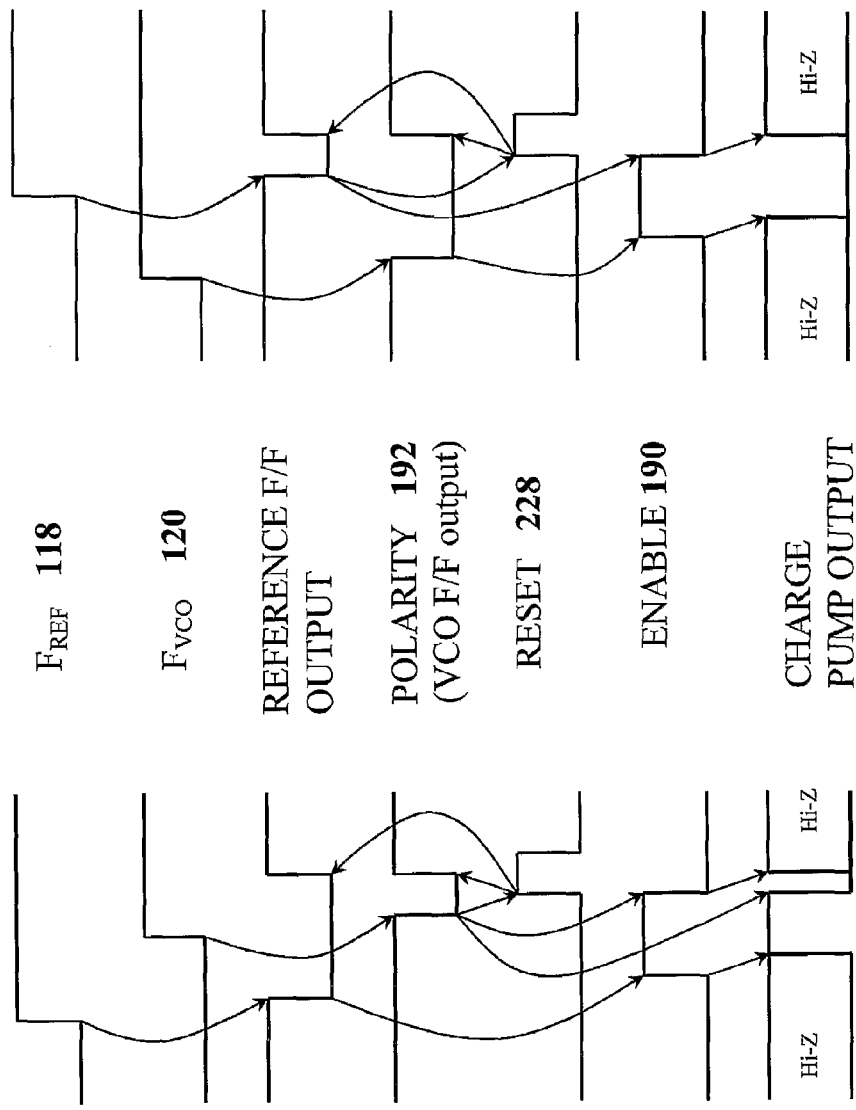
FIGURE 17 THE TIMING DIAGRAM FOR THE COMPLEMENTARY PFD WITH SINGLE-ENDED CHARGE PUMP OUTPUT AS ILLUSTRATED IN FIGURE 16

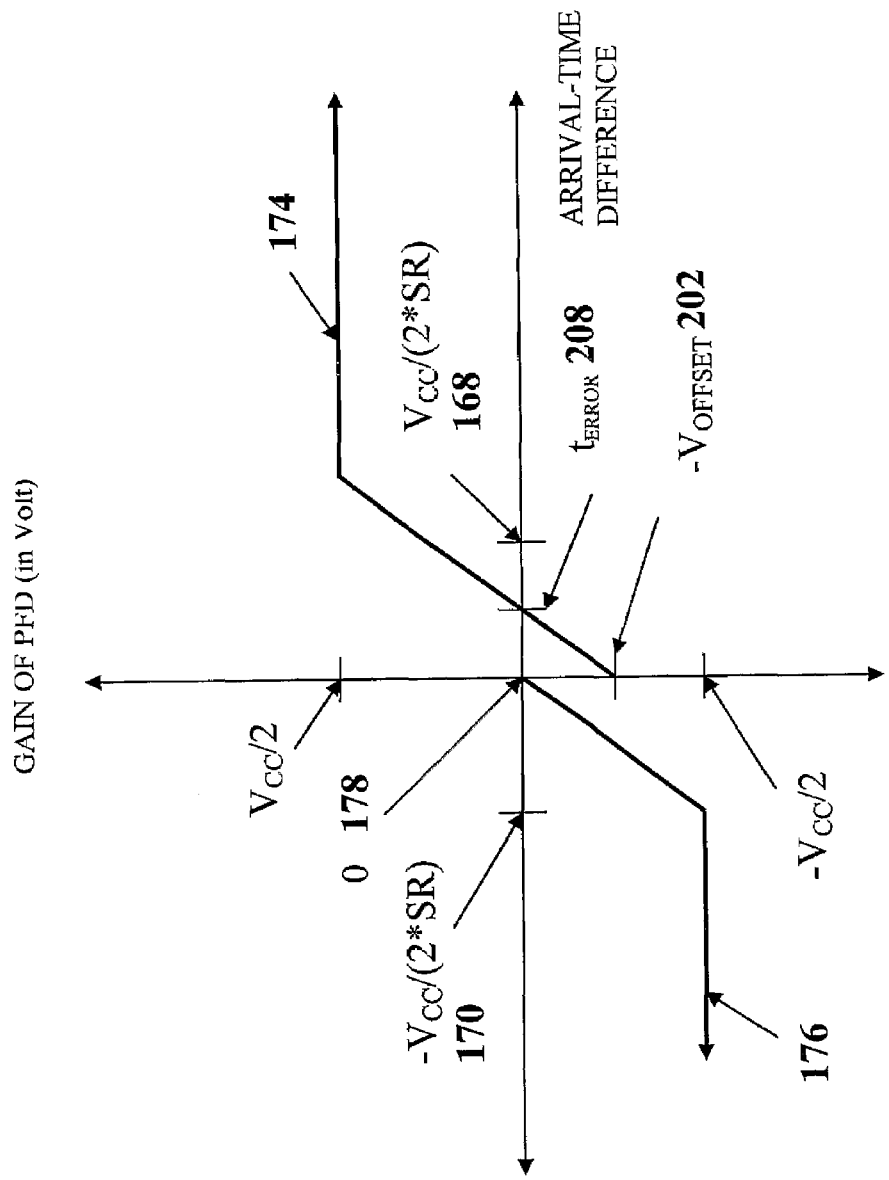
FIGURE 18 THE TRANSFER CHARACTERISTIC OF THE COMPLEMENTARY PFD WITH A SINGLE-ENDED CHARGE PUMP OUTPUT AS ILLUSTRATED IN FIGURE 16

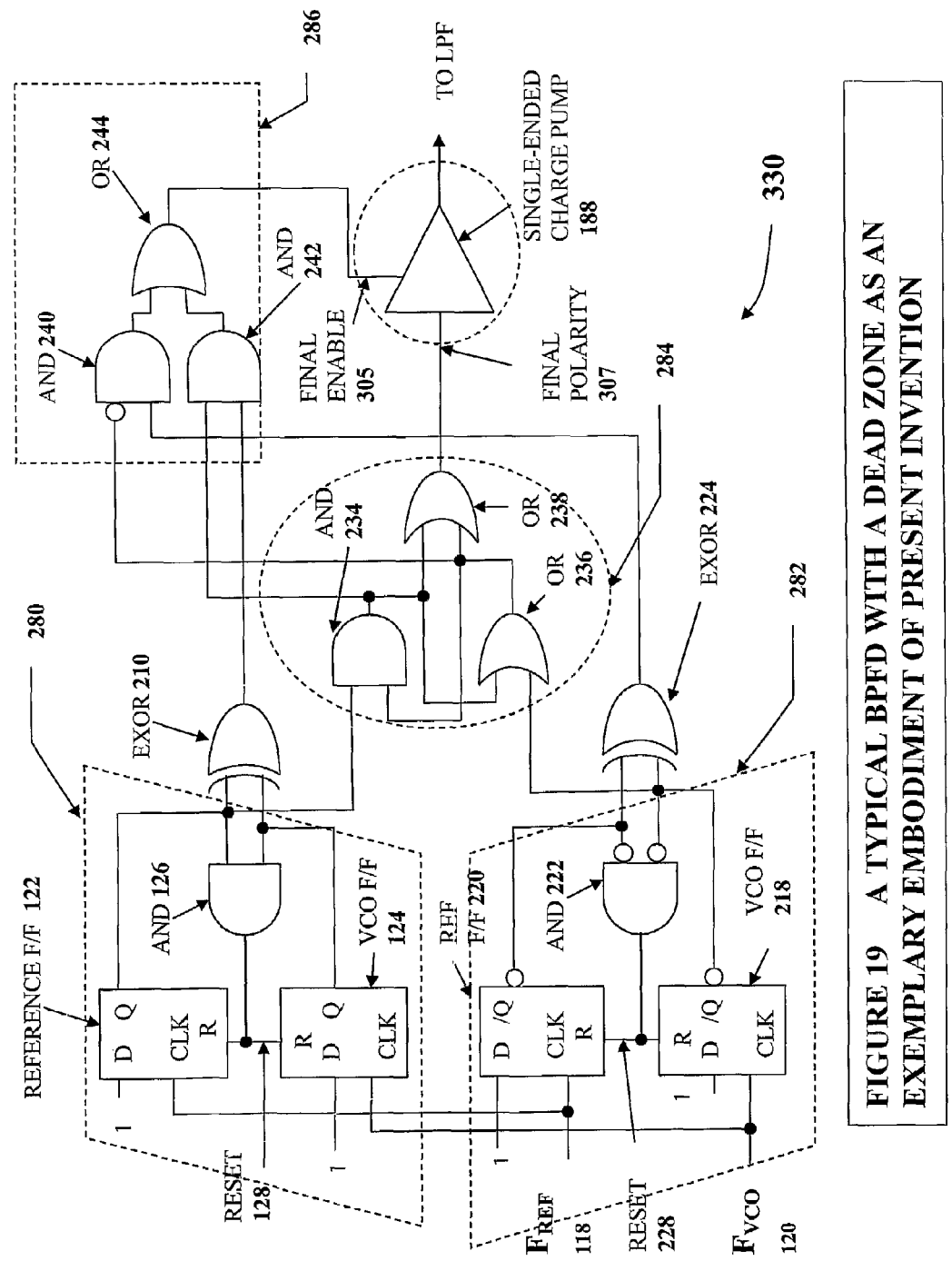
FIGURE 19 A TYPICAL BPFD WITH A DEAD ZONE AS AN EXEMPLARY EMBODIMENT OF PRESENT INVENTION

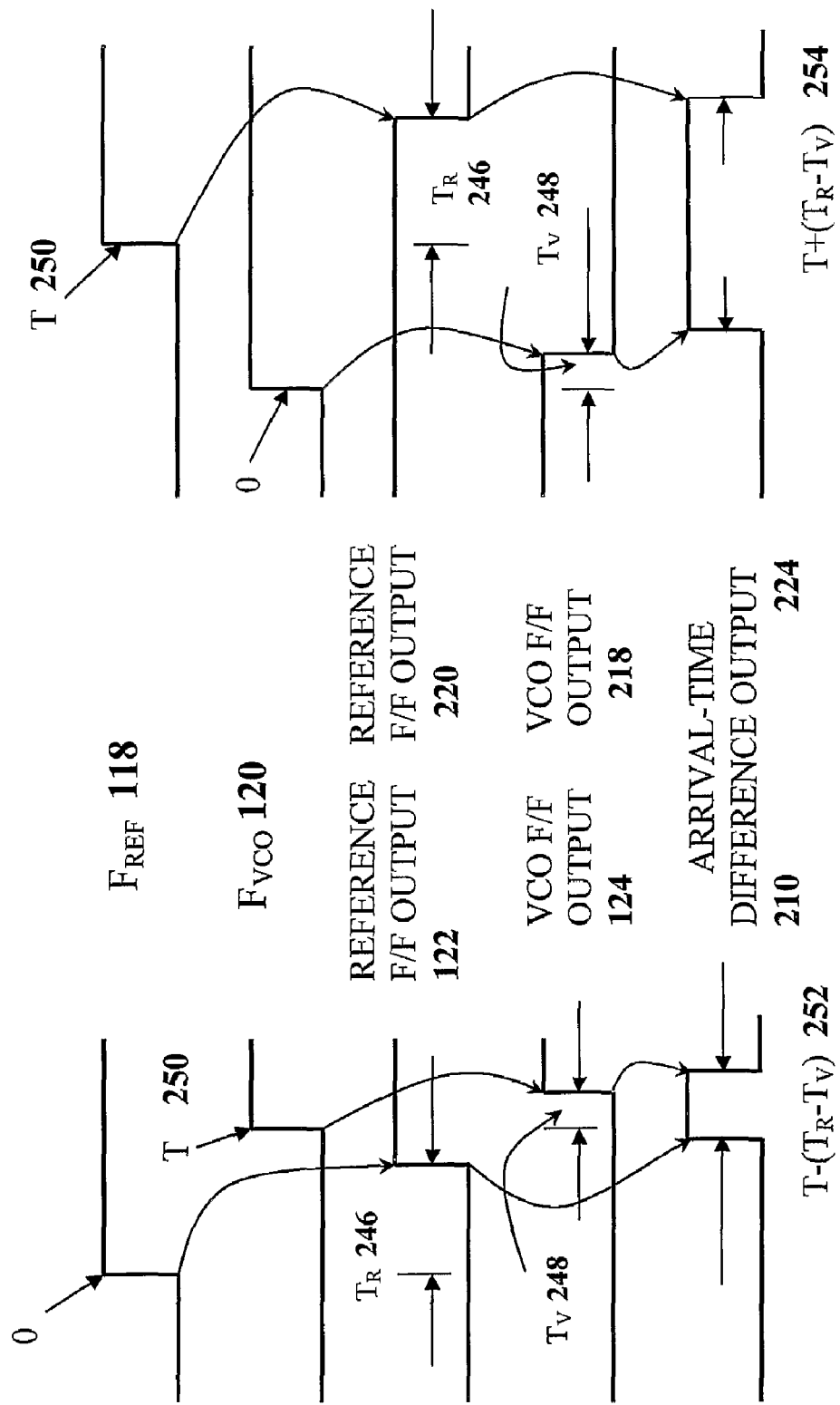
FIGURE 20 THE EFFECT OF DELAY TIME MISMATCH FOR THE BPFD AS ILLUSTRATED IN FIGURE 19

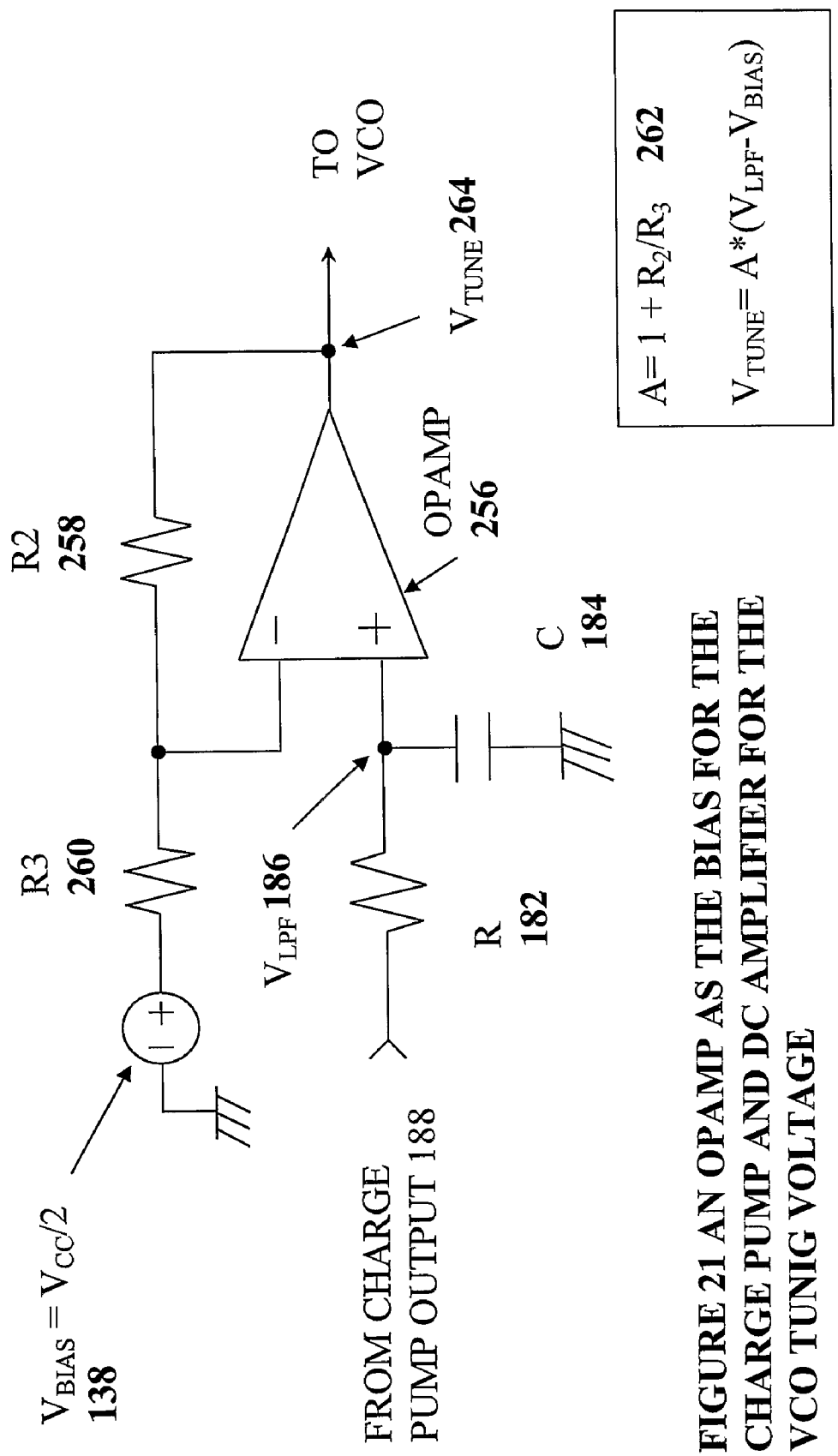
FIGURE 21 AN OPAMP AS THE BIAS FOR THE CHARGE PUMP AND DC AMPLIFIER FOR THE VCO TUNIG VOLTAGE

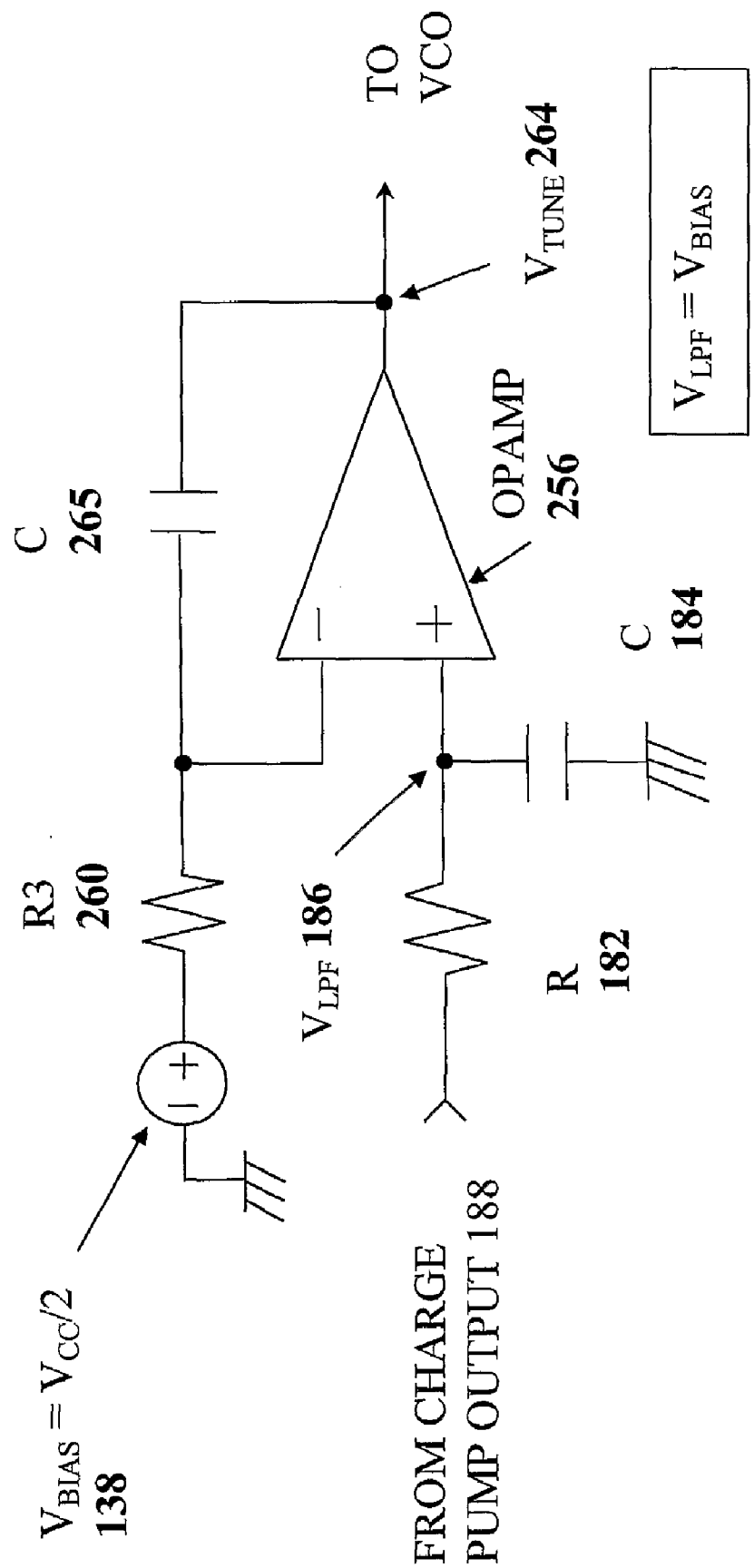
FIGURE 22 AN OPAMP AS THE BIAS FOR THE CHARGE PUMP AND ACTIVE FILTER

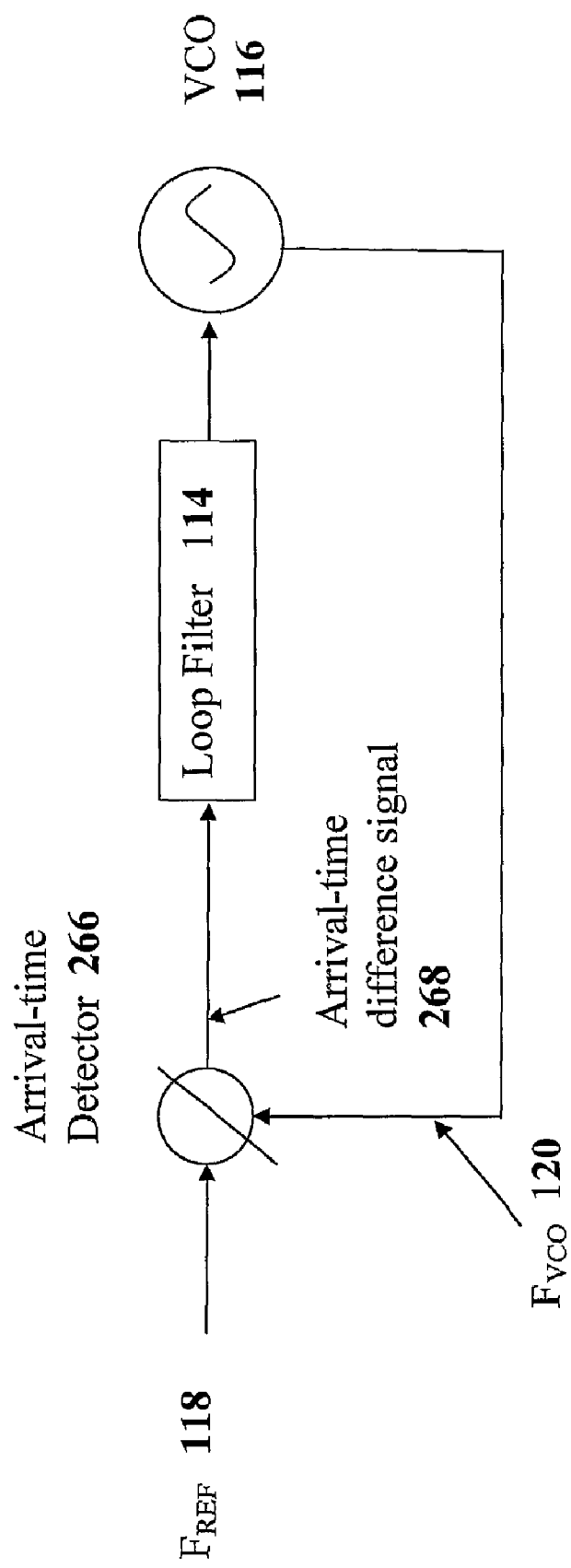
FIGURE 23 THE CORRECT BUILDING BLOCKS OF A PHASE LOCKED LOOP

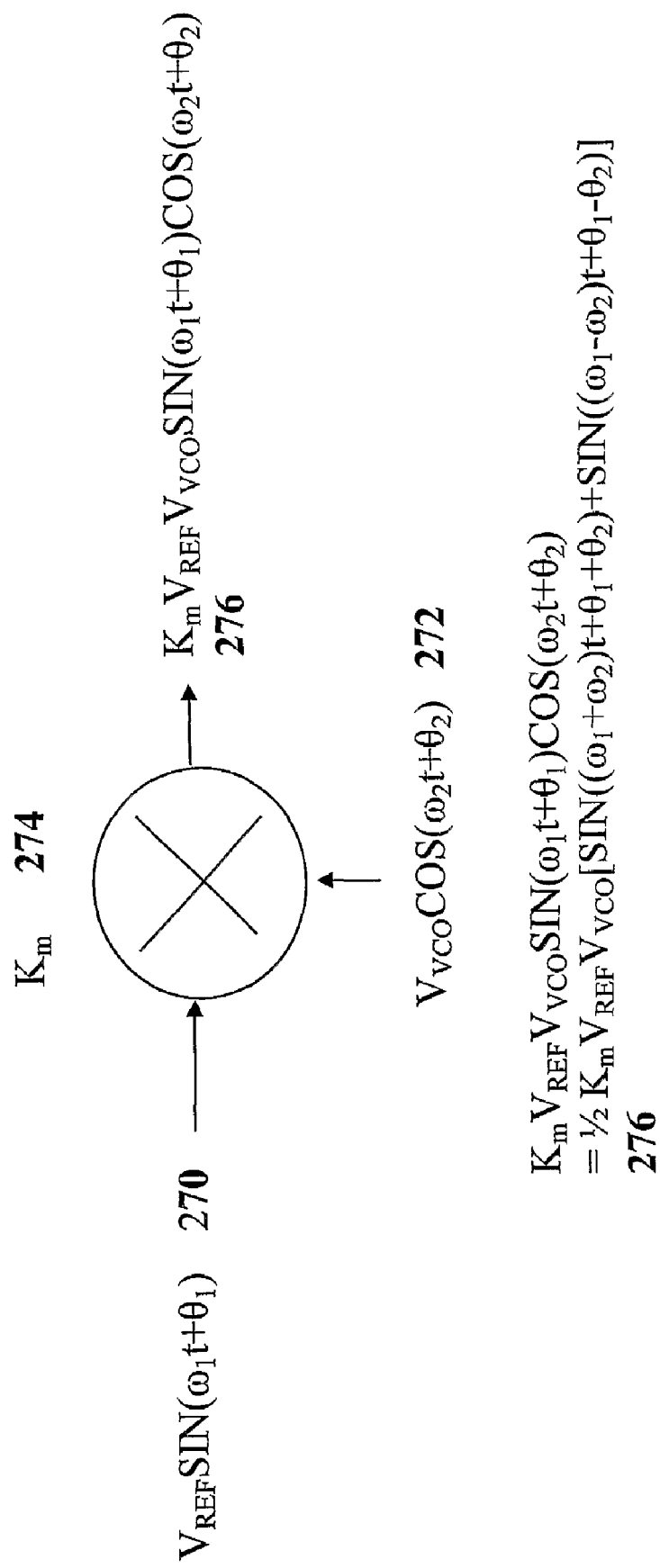
FIGURE 24 A MIXER AS A PHASE DETECTOR

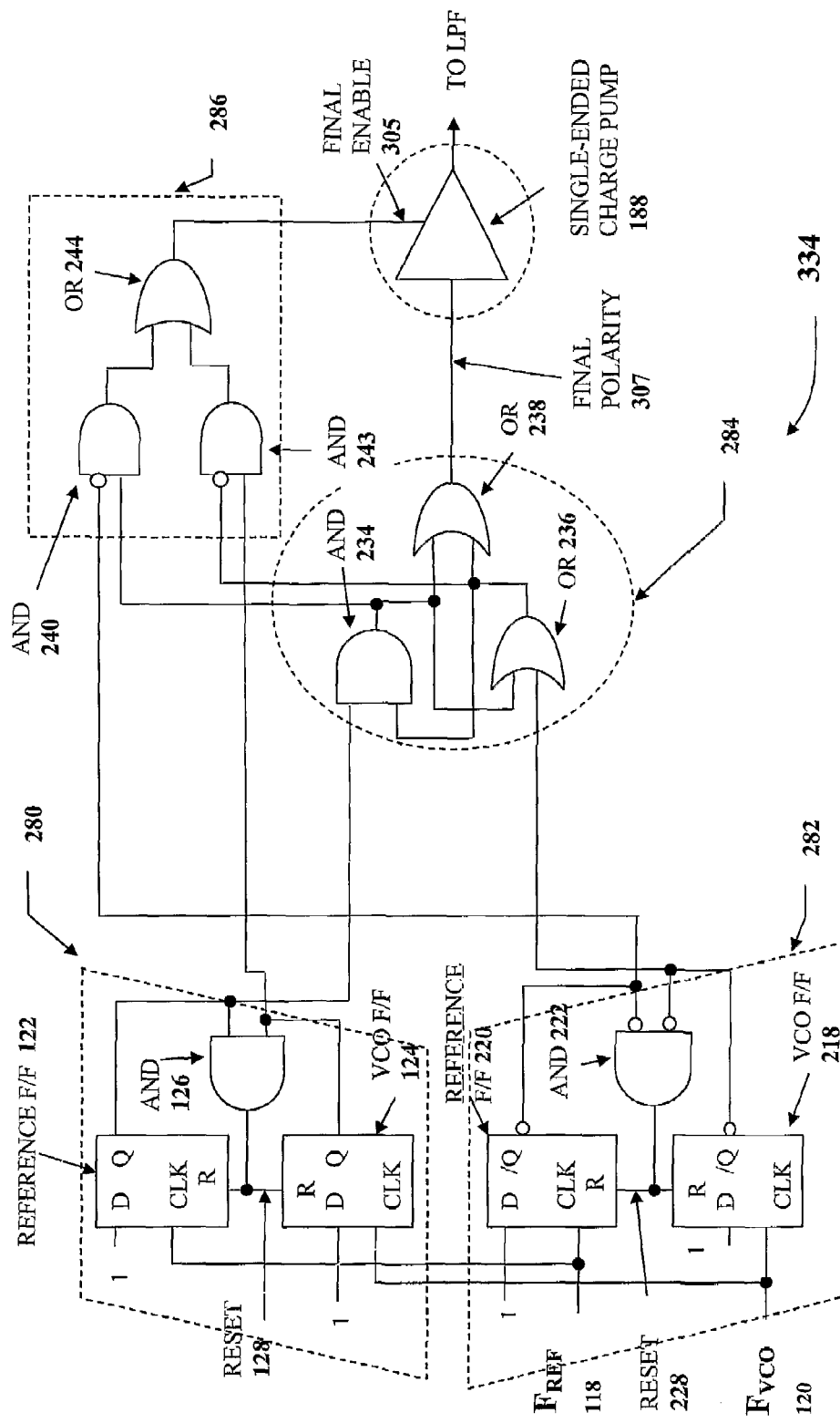
FIGURE 25 A TYPICAL BPFD WITHOUT DEAD ZONE AND LINEAR STATE AS A PERFECT ARRIVAL-TIME DETECTOR AS THE SECOND EMBODIMENT

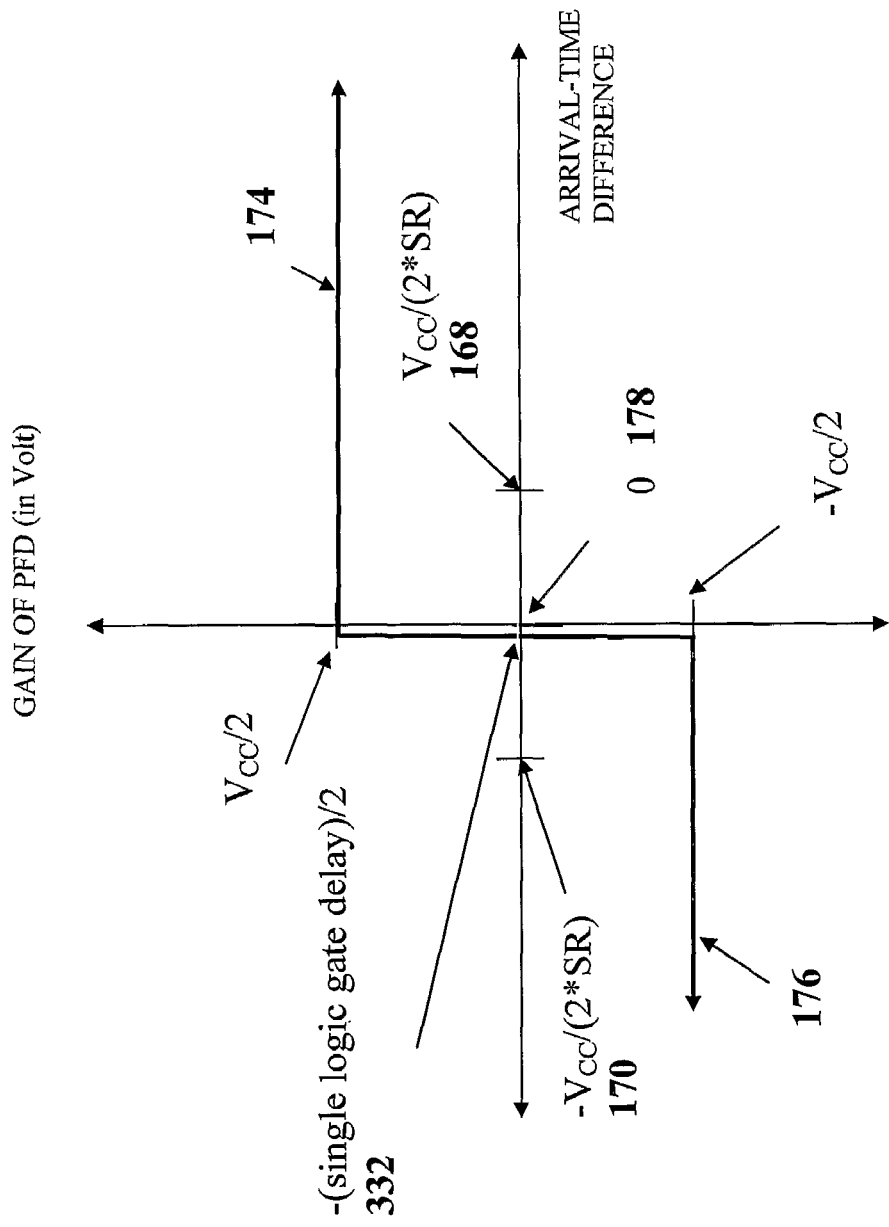
FIGURE 26 THE TRANSFER CHARACTERISTIC OF A PFD WITHOUT DEAD ZONE AND LINEAR STATE AS A PERFECT ARRIVAL-TIME DETECTOR AS THE SECOND EMBODIMENT

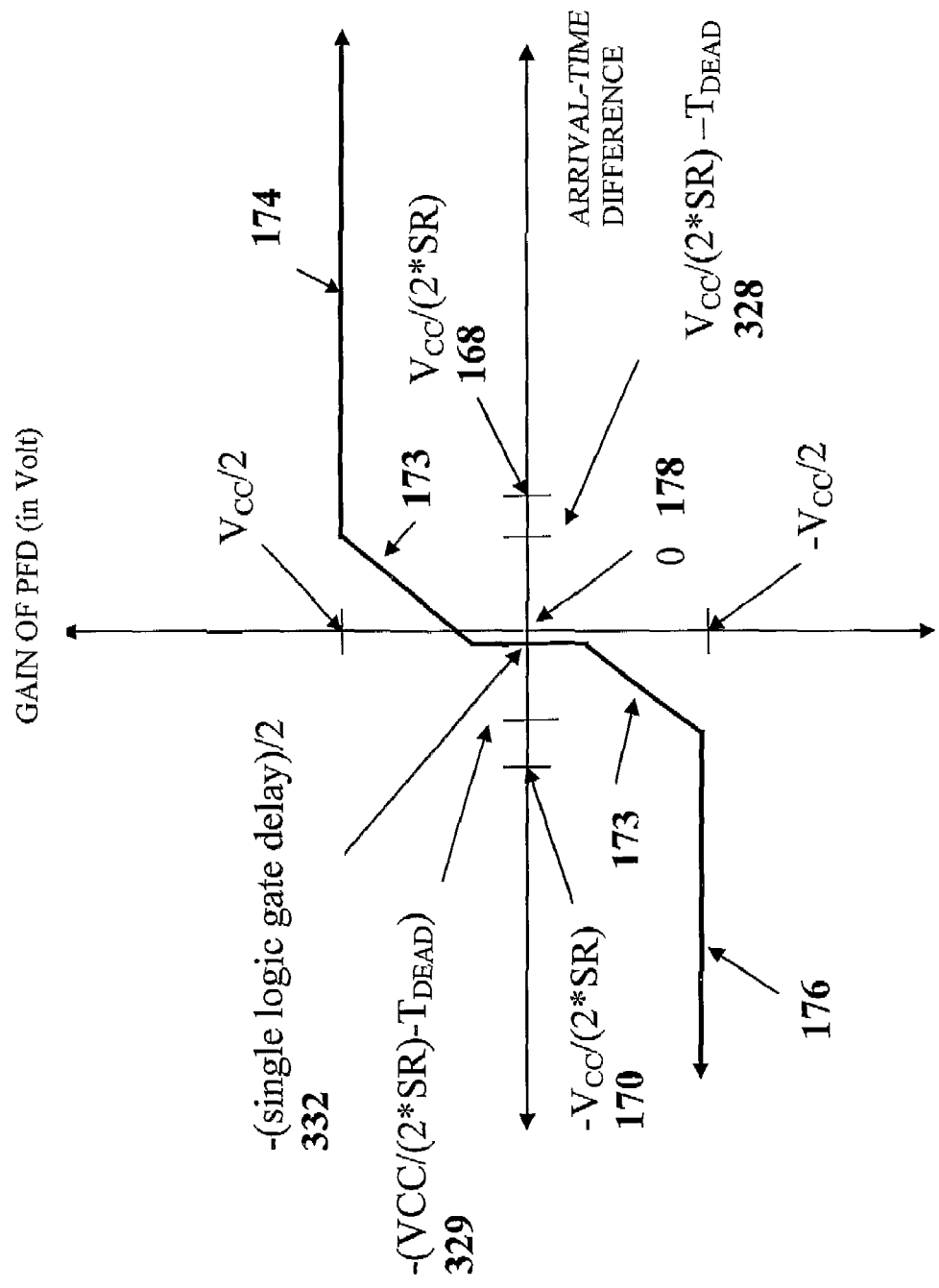
FIGURE 27 THE TRANSFER CHARACTERISTIC OF A BPFD WITHOUT DEAD ZONE AS THE THIRD EMBODIMENT

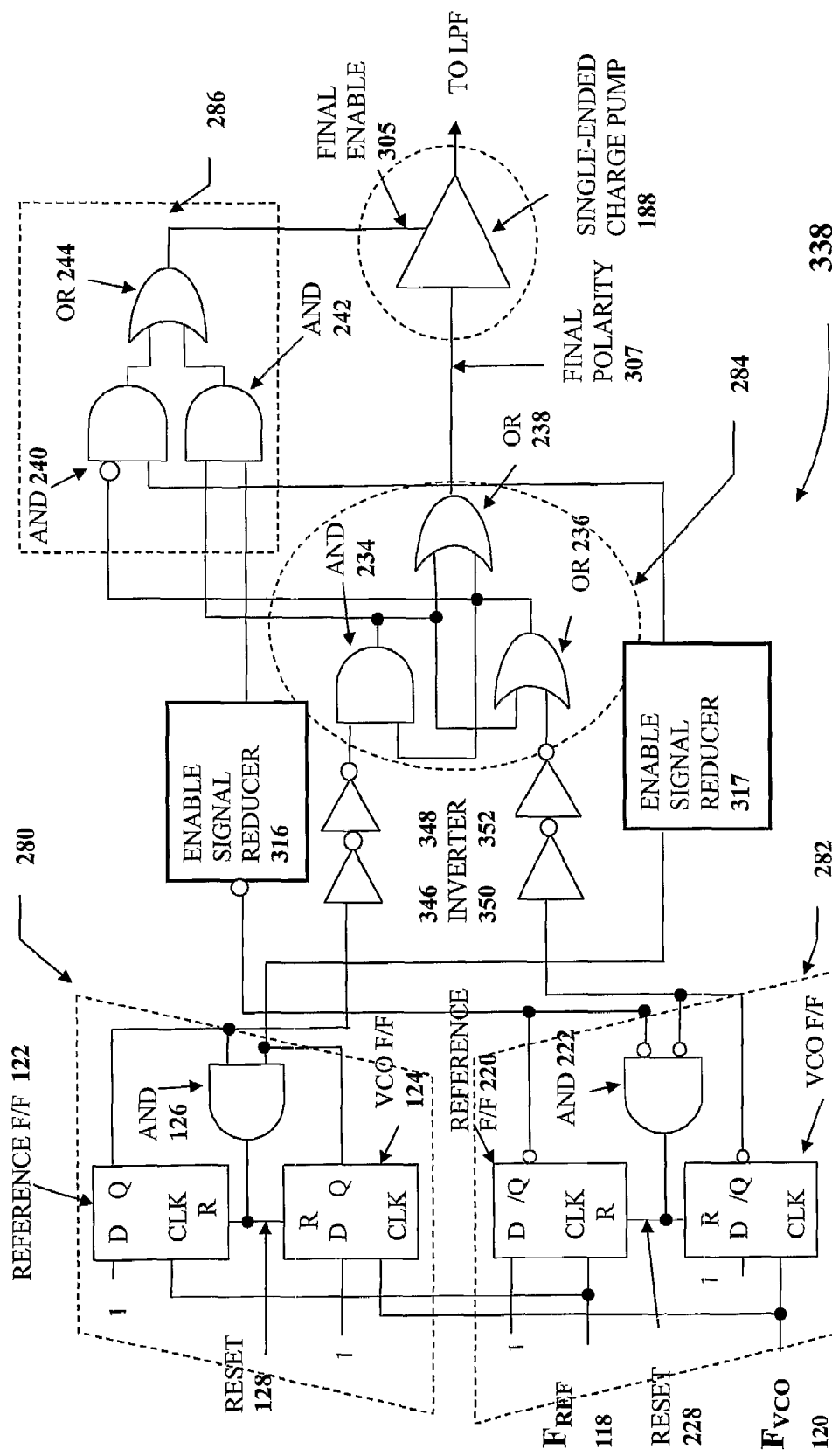
FIGURE 28 A BPFD WITH NO DEAD-ZONE AS THE THIRD EMBODIMENT

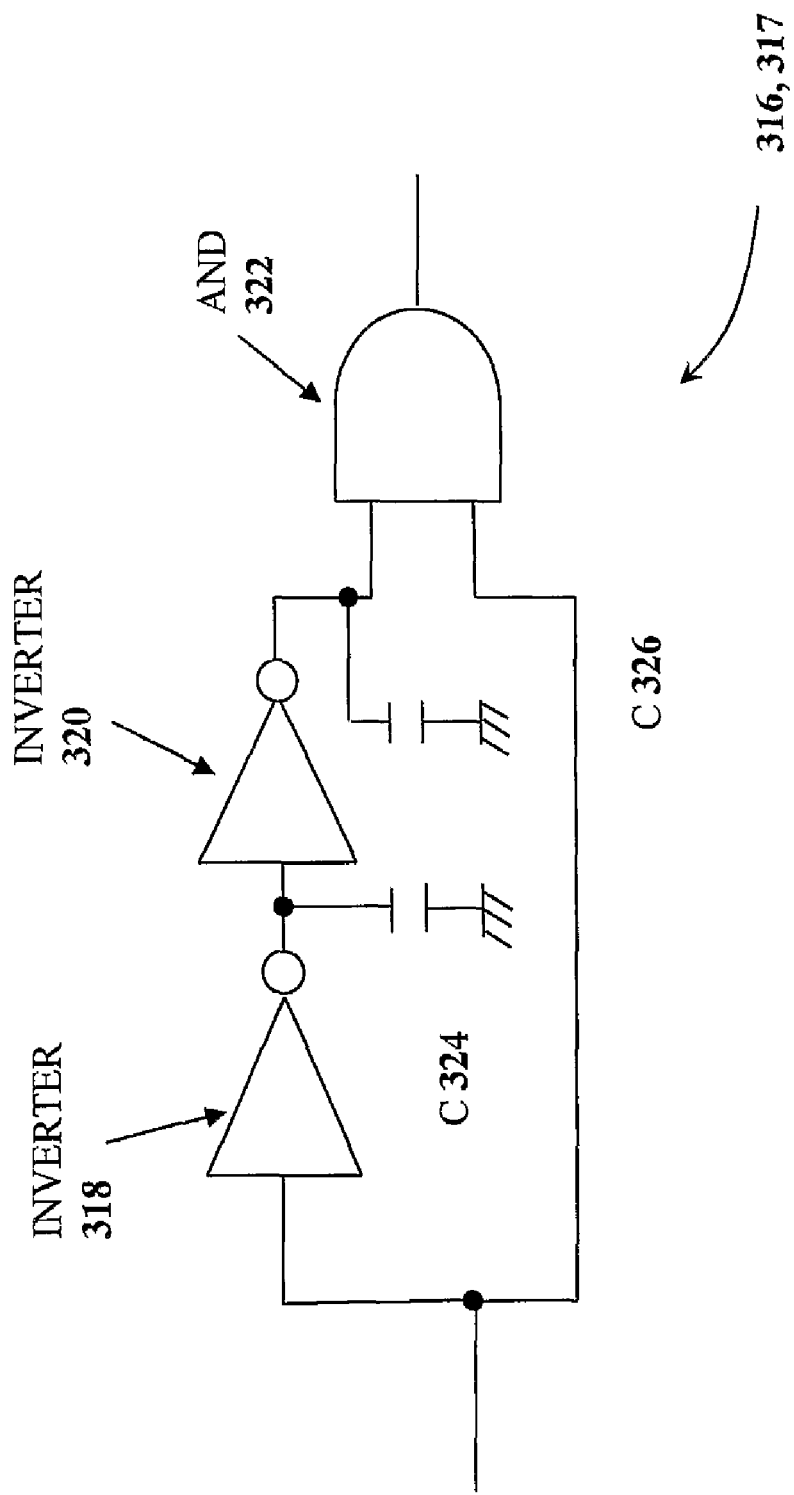
FIGURE 29 ENABLE SIGNAL REDUCER

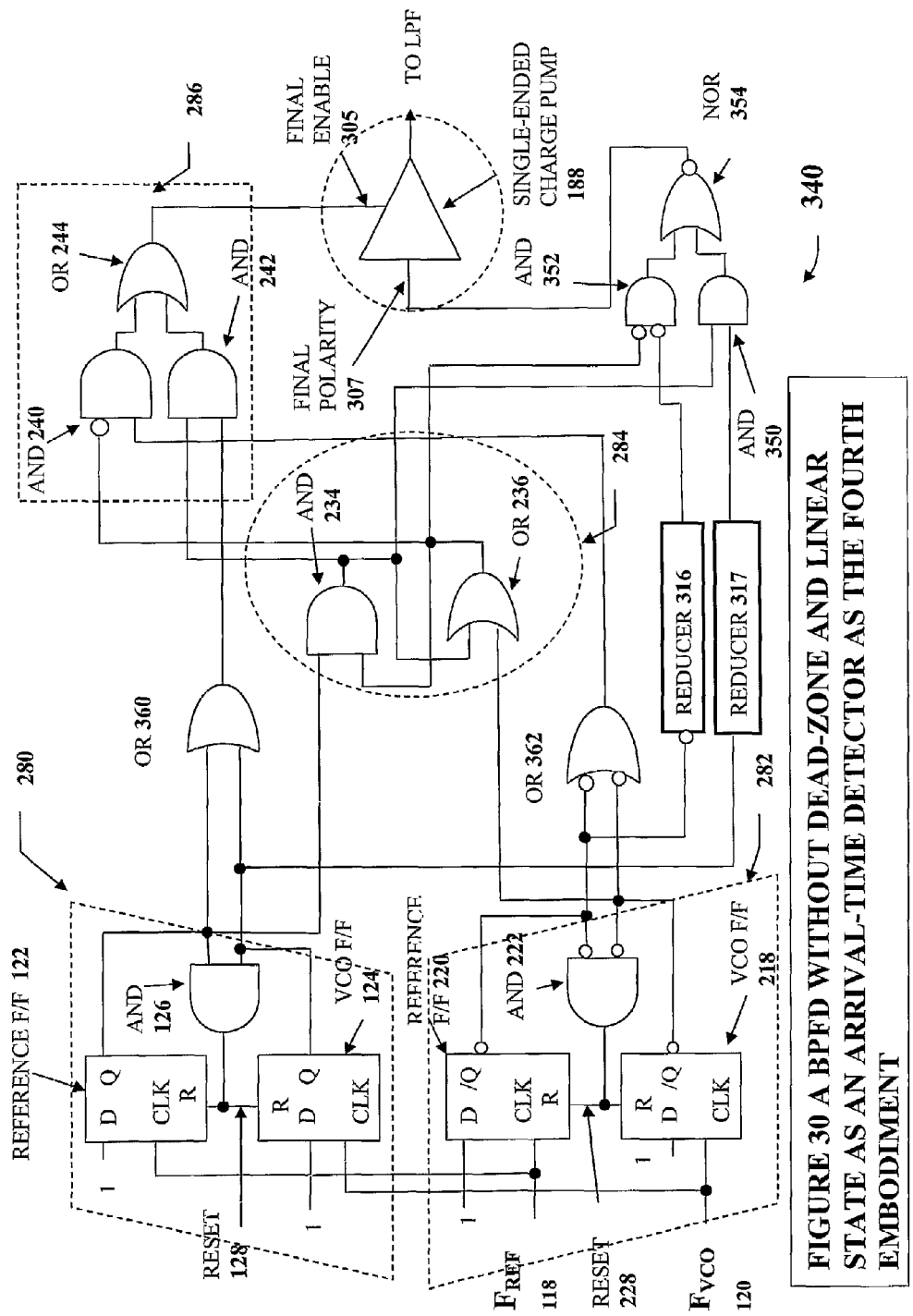
FIGURE 30 A BPFD WITHOUT DEAD-ZONE AND LINEAR STATE AS AN ARRIVAL-TIME DETECTOR AS THE FOURTH EMBODIMENT

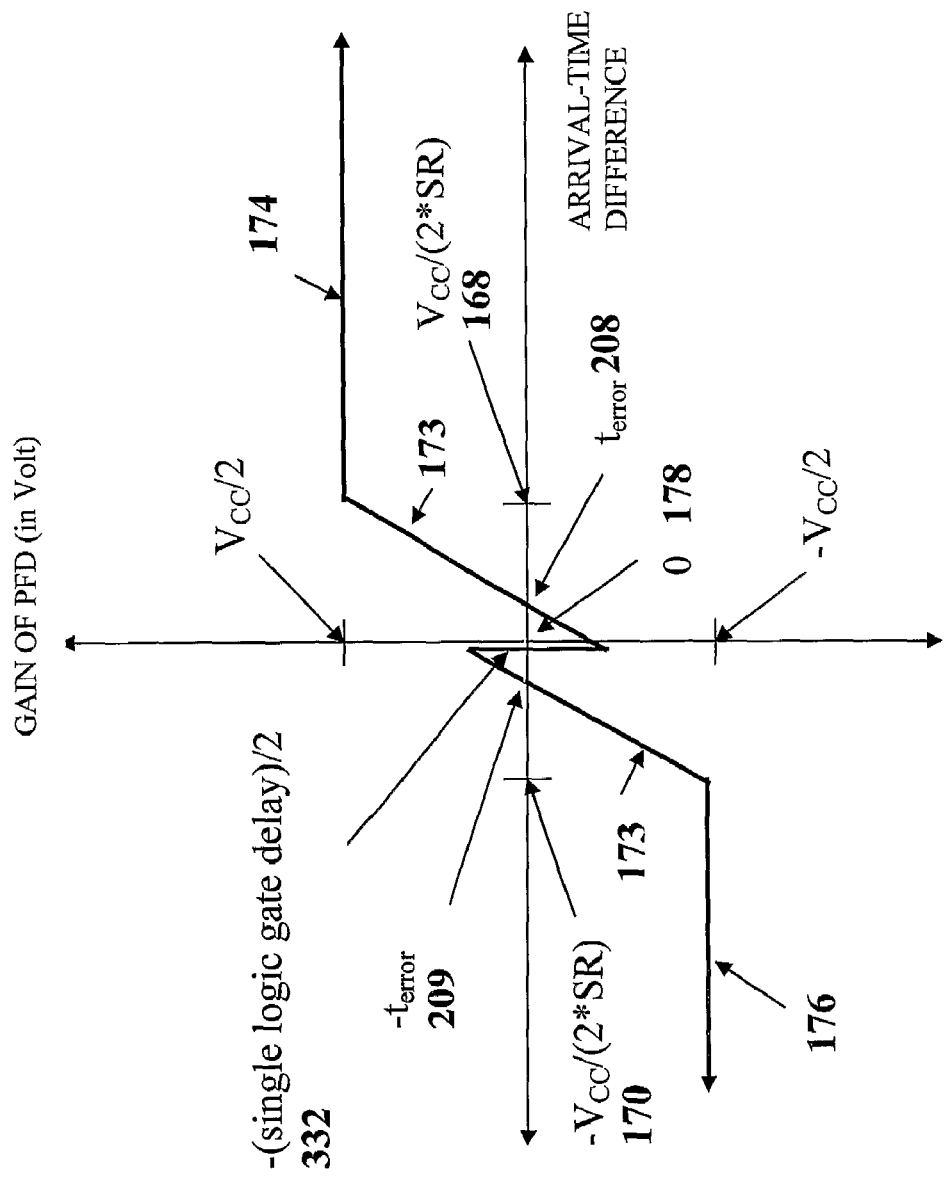
FIGURE 31 THE TRANSFER CHARACTERISTIC OF A BPFD USING THE POLARITY SIGNAL FROM ERRONEOUS NON-POLARITY DETERMINING FLIP-FLOP OUTPUTS FROM EACH PFD

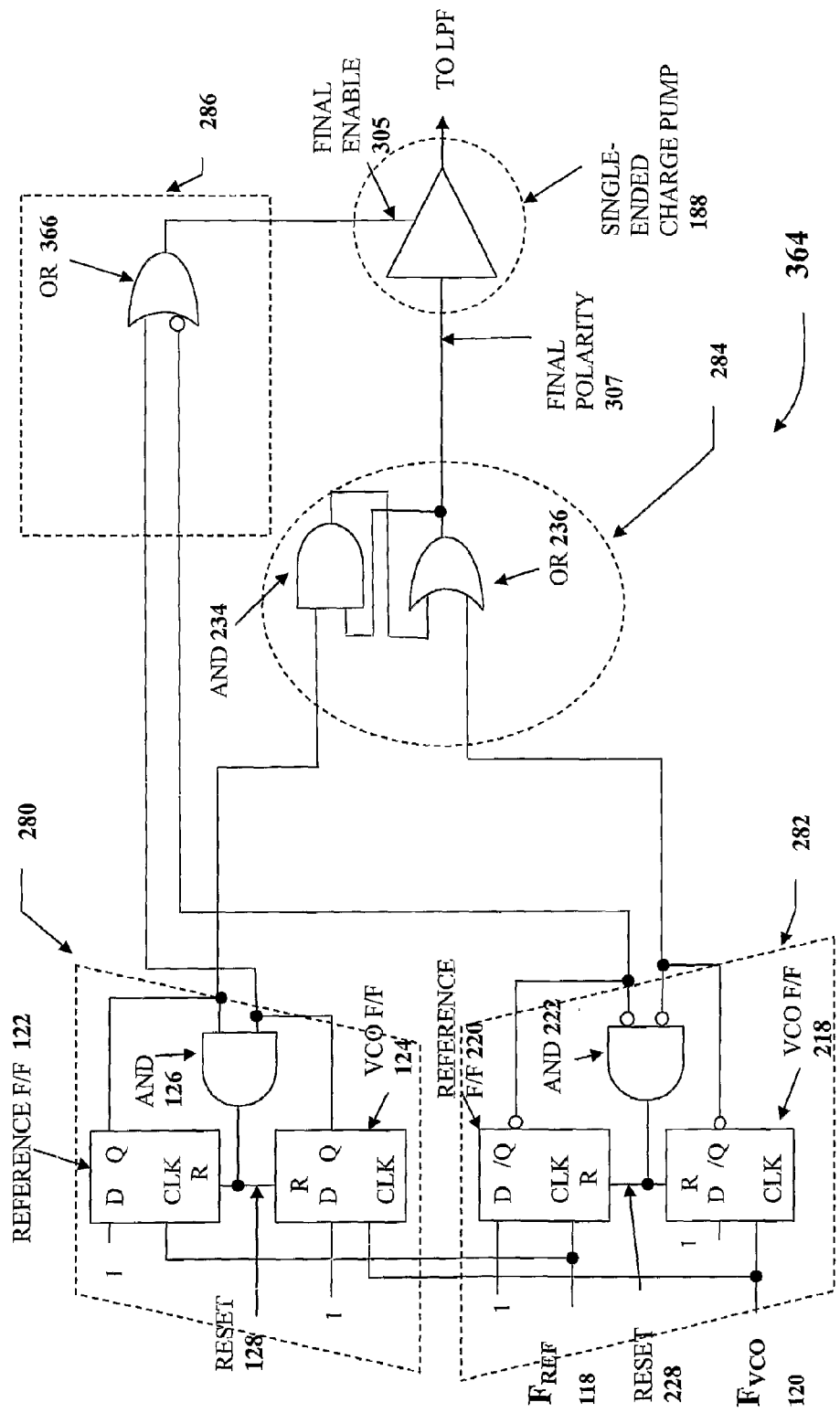
FIGURE 32 A TYPICAL BPFD WITHOUT A DEAD-ZONE AND LINEAR STATE AS THE FIFTH EMBODIMENT

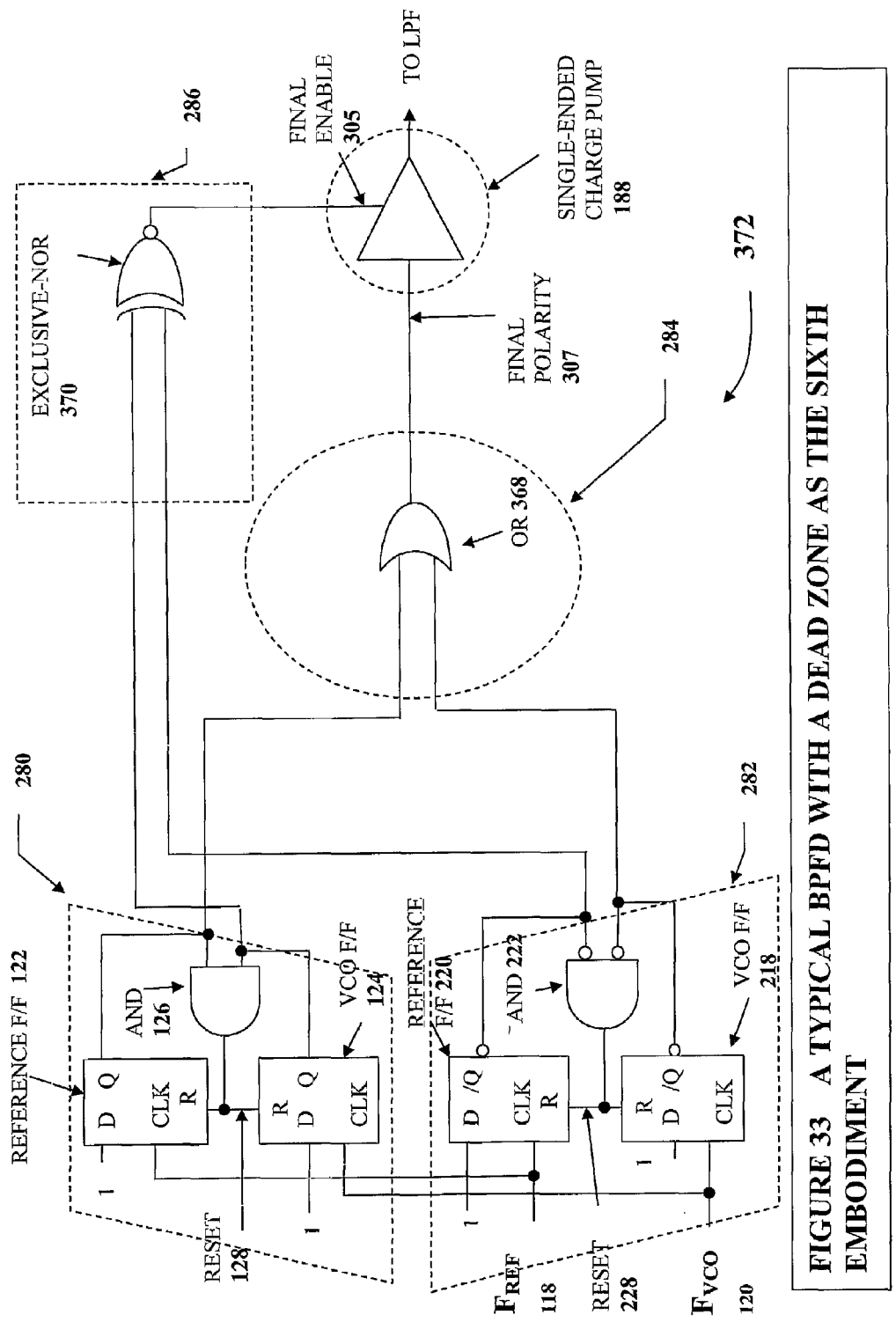
FIGURE 33 A TYPICAL BPFD WITH A DEAD ZONE AS THE SIXTH EMBODIMENT

SYSTEM AND METHOD OF DETECTING A PHASE, A FREQUENCY AND AN ARRIVAL-TIME DIFFERENCE BETWEEN SIGNALS

Cross Reference to Applications

This application is related to, and claims priority from PCT/US2005/026842 filed Jul. 28, 2005 by Wen T. Lin entitled "A System And Method Of Detecting A Phase, A Frequency And An Arrival-Time Difference Between Signals"; U.S. Provisional Patent Application No. US60/649,233 entitled "Balanced Digital Phase Frequency Detector" filed on Feb. 2, 2005 by W. T. Lin, and also US Provisional Patent application No. US60/654,835 and entitled "Phase Locked Loop Having Optimal Dead Zone Operating Characteristics" filed on Feb. 22, 2005 by W. T. Lin, and also another U.S. Provisional Patent application No. US60/678,841 under the same title "Phase Locked Loop Having Optimal Dead Zone Operating Characteristics" filed on May 6, 2005 by W. T. Lin, the entire contents of all of which are hereby incorporated by reference.

TECHNICAL FIELD

The present invention relates to the field of digital signal processing, and more specifically, the present invention relates to a method, apparatus, and system for improved digital phase-frequency detection for use in phase locked loops.

BACKGROUND ART

Phase locked loop (PLL) is a well known method of synchronizing a local voltage controlled oscillator to a reference frequency or some fraction or multiple of the reference frequency. PLL technology has been used widely since the very early days of the electronics age, and continues to be an important component of electronic products such as personal computers (PC)s, where the PLL's are used to synchronize components to a reference clock for the orderly and synchronized processing of data.

The basic building blocks of a PLL 100, shown in FIG. 1, include a phase detector 112, a loop filter 114 and the voltage controlled oscillator (VCO) 116. The phase detector 112 compares the phase difference between the incoming reference signal ($F_{REF}$) 118 and the local signal (Fvco) 120 generated from the VCO 116. The phase error output signal 121 from the phase detector 112 is then fed through the loop filter 114 and back to adjust the VCO 116 until the phase error signal 121 is zero. For example, if the local signal from the VCO 120 is ahead of the reference input signal 118, the phase detector 112 will send out a negative phase error signal 121 to slow down the VCO 116 until the VCO output signal 120 is finally synchronized with the reference signal 118. If the VCO output signal 120 is behind the reference signal 118, the phase detector 112 will send out a positive phase error signal 121 to speed up the VCO 116 until it catches up with the reference signal 118. Eventually, the VCO 116 will be synchronized with the reference signal 118 all the time and it is said to be in the locked condition when the synchronization occurs.

It is common to use a phase detector 112 that can detect both the frequency error and the phase error and has only one stable operating point, usually called a digital phase frequency detector (PFD). Use of a PFD allows a VCO output signals that is initially far apart in frequency for the reference frequency, to be locked with the reference signal. A basic PFD 280 with charge pump output is shown in FIG. 2 and is comprising of a reference flip-flop 122, a VCO flip-flop 124 and an AND logic gate 126. The basic PFD 280 generates two outputs, one can be used to enable a sourcing charge pump to pump UP the frequency of VCO and the other one can be used to enable a sinking charge pump to suck DOWN the frequency of VCO.

Ideally the PLL 100 should operate so that when the two frequencies are synchronized, the PFD 280 with charge pump output will essentially do nothing. There is, however, a well-known problem with the PFD 280 with charge pump output called the "dead-zone" problem. The causes of this problem are discussed in detail later. The dead-zone problem manifests itself as the VCO exhibiting significant jitter if the signals to the PFD 280 with charge pump output are exactly synchronized. The workaround used in practice is to avoid the dead-zone by introducing delays into the reset path of the PFD 280 with charge pump output that slow down or stretch the time period of the flip-flop reset time. The problem with this approach is that the clock rates that can be synchronized are only a fraction of the maximum switching speed of the flip-flop.

For example, a typical self-toggling flip-flop constructed using 0.35 micron line-width silicon fabrication technology can toggle at around 800 MHz. The maximum operation speed of a PFD using this flip-flop is, however, limited to less than 400 MHz because of the delays introduced to avoid the dead-zone. PC clock speeds are approaching the speeds when these dead-zone workarounds cause problems or require switching to more expensive fabrication techniques.

And worst of all, the dead-zone problem is only avoided but not solved so that there is always a chance that the PFD may step into the dead-zone and cause a jittering problem. The dead-zone jittering problem is especially critical for PC clock application where the PC system is orderly operated according to each edge of the clock. A single clock jitter can cause a command or data to be executed wrongly and the PC will never be able to recover from the mistake and crash.

What is needed is a method of detecting phase and frequency differences that does not require introducing artificial delays so that higher clock rates can be synchronized using PFD made using existing, inexpensive fabrication protocols and also solves the dead-zone jittering problem once and for all so that the dead-zone jittering problem is completely eliminated and is not allowed to occur.

DISCLOSURE OF INVENTION

The present invention provides a system and method for detecting a phase and a frequency and an arrival-time difference between two signals that minimizes delay and jitter and has stable operation even when the two signals are essentially identical, i.e., the method overcomes the so-called "dead-zone" problem of prior art phase-frequency detectors (PFD).

In a preferred embodiment 330, the present invention includes two phase-frequency detection (PFD) circuits with a single-ended charge pump output. The first PFD 280 provides stable operation as long as the signal supplied to the polarity determining flip-flop of the PFD 280 leads the signal supplied to the non-polarity determining flip-flop. The second, complementary, PFD 282 circuit provides stable operation as long as the signal supplied to the polarity determining flip-flop leads the signal supplied to the non-polarity determining flip-flop, but the output polarity is inverted with respect to the first PFD 280. A reference signal is supplied as the polarity determining signal to the first PFD 280, and a signal to be synchronized as the polarity determining signal to the second, complementary PFD 282. A polarity selection logic circuit 284 then ensures that the polarity output from the first activated PFD is supplied as the polarity signal to control the final polarity input signal 307 for the single-ended charge-pump 188. An enabling circuit activates the single-ended charge pump for a time-period determined by the delay between the activation of the polarity determining and non-polarity determining flip-flops of whichever PFD that is chosen to control the final polarity signal 307. The result is a phase-frequency-arrival-time detector having stable operation even when the two signals are essentially identical.

The phase-frequency-arrival-time detector of the present invention is well suited to controlling a voltage controlled oscillator of a phase locked loop.

These and other features of the present invention will now be described in detail by reference to the following drawings.

BRIEF DESCRIPTION OF DRAWINGS

FIG. 1 is schematic drawing of a basic, prior art, Phase Locked Loop (PLL).

FIG. 2 is a schematic drawing of a basic, prior art, Phase Frequency Detector (PFD).

FIG. 3 is a graph showing the ideal transfer characteristics of a Phase Frequency Detector (PFD).

FIG. 4 is a drawing illustrating the operation of an ideal PFD.

FIG. 5 is graph showing the output characteristics of a typical PFD.

FIG. 6 is a graph showing the transfer characteristics on an ideal PFD.

FIG. 7 is a graph showing the transfer characteristics of a PFD with a dead-zone.

FIG. 8 is a graph showing the transfer characteristic of a PFD with a delay error.

FIG. 9 is a schematic drawing showing a tri-state output driver configured as a voltage charge pump.

FIG. 10 is a schematic drawing showing a basic, prior art, PFD with a double-ended charge pump output.

FIG. 11 is a timing diagram of the basic, prior art, PFD illustrated in FIG. 10.

FIG. 12 is a drawing showing the transfer characteristics of the basic, prior art, PFD illustrated in FIG. 10, showing a negative glitch.

FIG. 13 is a schematic drawing of a, prior art, basic PFD circuit with a single-ended charge pump output.

FIG. 14 is timing diagram for a, prior art, basic PFD illustrated in FIG. 13.

FIG. 15 is a graph showing the transfer characteristic of a, prior art, basic PFD with a single-ended charge pump output, illustrated in FIG. 13.

FIG. 16 is a schematic drawing showing a complementary PFD circuit with a single-ended charge pump output.

FIG. 17 is a timing diagram for the complementary PFD illustrated in FIG. 16.

FIG. 18 is a graph showing the transfer characteristics of the complementary PFD with a single-ended charge pump output illustrated in FIG. 16.

FIG. 19 is a schematic drawing of an exemplary embodiment of a balanced phase frequency detector (BPFD) circuit with a dead-zone of the present invention.

FIG. 20 is a timing diagram showing the effects of delay time mismatch in a BPFD illustrated in FIG. 19.

FIG. 21 is a schematic drawing showing an OPAMP configured as a DC amplifier to provide the bias voltage for the voltage charge pump.

FIG. 22 is a schematic drawing showing an OPAMP configured as an integrator to fix the bias voltage for the voltage charge pump.

FIG. 23 is a drawing showing a PLL having an arrival-time detector.

FIG. 24 is a schematic drawing showing a mixer as a phase detector FIG. 25 is the schematic drawing for a typical BPFD without dead-zone and linear state as an arrival-time detector as the second embodiment.

FIG. 26 shows the output transfer characteristic of the BPFD without dead-zone and linear state as an arrival-time detector as the second embodiment.

FIG. 27 shows the transfer characteristic of the BPFD without dead-zone.

FIG. 28 shows the schematics drawing for the BPFD without dead-zone as the third embodiment.

FIG. 29 is the schematic drawing for the enable signal width reducing circuit used in the BPFD without dead-zone in FIG. 28.

FIG. 30 shows the schematic drawing for a BPFD with no dead-zone and no linear state as the fourth embodiment.

FIG. 31 shows the transfer characteristics of the BPFD using polarity output signal from erroneous non-polarity determining flip-flops of each PFD.

FIG. 32 shows the schematic drawing for a BPFD with no dead-zone and linear state as the fifth embodiment.

FIG. 33 shows the schematic drawing for a BPFD with dead-zone as the sixth embodiment.

BEST MODE FOR CARRYING OUT THE INVENTION

The present invention relates to a system and method for detecting a phase and a frequency and an arrival-time difference between two signals that minimizes delay and jitter and has stable operation even when the two signals are essentially identical, i.e., the method overcomes the so-called "dead-zone" problem of prior art phase-frequency detectors (PFD).

To understand the inventive concepts of the present invention it is useful to understand the dead-zone problem associated with Phase Locked Loops (PLL).

Suppose we are in an ideal world without noise and the basic PLL 100 in FIG. 1 is in a locked condition; since the Voltage Controlled Oscillator (VCO) 116 is synchronized to the input reference signal 118 all the time, the two input signals to the phase-frequency detector 112 will always arrive at the same time. As a result, the PFD 112 will do nothing, since no corrective action is required when the noise-free PLL 100 is in a locked condition. So, ideally, the PFD 112 should be literally dead all the time when the noise-free PLL 100 system is in a locked condition. This situation is usually referred to as "the PFD 112 staying in the dead-zone". The dead-zone theoretically occurs at only one point in time, when both input signals arrive simultaneously. Theoretically, it occurs only when there is zero arrival-time difference between signals. In practice, the dead-zone actually appears to spread over a small range of arrival-time difference instead of a single point due to the slew rate limitation and the input threshold requirement of the logic gates. Ideally, a logic device can have only two output states, either the High state or the Low state; however, it takes time for a logic device to switch between the two states due to the slew rate limitation so that there is always an undesired transient state between the two desired H or L states. The transient state is very undesirable but it is inevitable. When the input to a logic device is changing the state from L to H or H to L, the logic device will not respond immediately as the input starts to rise above the ground voltage or fall below Vcc. The logic device will need to wait until the input voltage crossing a certain threshold before it can recognize the changing status of the input signal and take action. During this transient period before the input crossing the threshold, the output of the logic device remains at the existing state. It is this inactive time or dead time of the logic devices that magnifies the zero arrival-time difference point into a dead-zone.

Even with the addition of noise, the performance of the PLL 100 system should not depart too far from this ideal picture. The PFD 112 should still stay at the point of zero arrival-time difference most of the time and occasionally sends out small corrective output pulses to compensate for noise perturbations. In theory, the point of zero arrival-time difference should be the most stable operating point for the PFD 112, generating the least number of corrective pulses to the VCO 116. As a result, the phase noise of the VCO 116 should be a minimum.

However, this is not what happens in practice. Once a real PLL is at the zero arrival-time difference point, the VCO exhibits significant jitter. This problem is commonly referred to as the "dead-zone problem". As a consequence, design engineers are generally taught to stay away from the dead-zone, which is supposed to be the ideal operating point of the PLL 100. Although there have a significant number of attempts to solve or avoid the dead-zone problem, none appear to have fully dealt with the problem. For example, U.S. Pat. No. 6,822,484 entitled "High Frequency Phase/Frequency Detector with Improved Reset Mechanism", illustrates a common approach to dealing with the dead-zone problem, which is to simply stretch the reset pulse so as to push the operating point of the phase frequency detector away from the dead-zone. Although this minimizes the dead-zone jittering problem, such a solution has the significant disadvantage of slowing down the PFD and also greatly increasing the phase noise fed to the VCO.

Or as the datasheet for BU2374FV, a VCO+ phase comparator IC for PLL system made by ROHM, utilizing the Schmidt triggering circuit inputs to build a +/−2.5 nsec window around the zero arrival-time difference point to stop the PFD from working when the arrival-time difference is small and near zero. The window is also equal to twice the slew time of the PFD output driver. As a result, this PFD has only three stable output states, the H (Vcc) state, the L (ground) state and the OFF state. As we will see soon that an ideal PFD requires the PFD to be operated in three states, the H(Vcc) state, the L(ground) state and the linear state. Lacking the linear state and replacing the linear state with a large OFF state, this PFD developed by ROHM generates a lot more noises for the VCO because the output of this PFD will swing to +Vcc or to ground all the time so that the correction voltage is always high and it can't detect and correct small phase errors which happen most often when the PLL is in locked condition. As a result, the VCO is never locked precisely and the phase of the VCO signal can still fluctuate a lot over a large window so that both the phase noise and phase jitter are always high.

Another solution to the dead-zone problem is detailed in U.S. Pat. No. 6,157,218 entitled "Phase Frequency Detection with No Dead-zone". This patent teaches avoiding the dead-zone by preventing both charge pumps from being turned on at the same time. Although it is an effective way to avoid the dead-zone, it introduces a significant propagation delay, making it ineffective for detecting and correcting small phase errors just like Rohm's design.

Forty years of avoiding the dead-zone in a PFD may stem from a lack of understanding of the true nature of dead-zone problem, caused by discrepancies in the theory. Only when the real nature of dead-zone problem is understood can the problem finally be solved.

To understand the dead-zone problem, we first need to understand the characteristic of the PFD. The ideal conceptual output characteristic of the PFD 280 with charge pump output can be shown as in the FIG. 3. In this figure, the output voltage of PFD 280 with charge pump output can be characterized by three line segments 130, 132 and 134. When the phase difference is greater than +2π, the output of the charge pump stays at the constant power supply voltage of Vcc 130 and when the phase difference is less than −2π, the output of charge pump stays at the constant zero ground voltage 132 and when the phase difference is between +2π to −2π, the output voltage of the charge pump is a straight line 134 with a constant slope of Vcc/(4π) 136. This constant slope is also referred to as the gain of the PFD which is a very important factor for determining the loop gain and the behavior of the PLL in classical PLL analysis. The gain of the PFD 280 with charge pump output has units of Volt/rad. FIG. 3 is a graph showing the ideal output characteristics that appears in textbooks and that everyone expects from their PFD. When the PLL is in locked condition, ideally, the phase difference of the two input signals should be zero so that the output of the PFD 280 with charge pump output should stay at the center of the transfer characteristic and which should also be the only stable operating point for the PFD 280 with charge pump output. The output of the PFD 280 with charge pump output should ideally be Vcc/2 138 when the phase difference is zero and the gain of the PFD 280 with charge pump output is still Vcc/(4π) at this point.

FIG. 4 is a drawing illustrating the operation of an ideal basic PFD 280 with a double-ended charge pump output as shown in FIG. 2. In this figure, the reference signals $F_{REF}$ 118 is assumed to arrive at equally spaced time of R1 140, R2 142, R3 144, R4 146, R5 148 and R6 150. When the first VCO signal V1 152 arrives, assuming that it is slightly behind the R1 140, then the UP output will send out a net correction pulse which starts at R1 140 and ends at V1 152 to speed up the VCO 116. The correction pulse will be filtered out by the low pass filter 114 which will slow down the correction pulse to smoothly speed up the VCO 116. When the second VCO signal V2 154 arrives, its arrival-time should be closing up to R2 142 so that the UP output will send out a smaller net correction pulse again which starts at R2 142 and ends at V2 154. And when the third VCO signal V3 156 arrives, assuming it finally synchronizes to the reference signal so that there is no net correction output for the third VCO arrival.

Now suppose that there is a noise perturbation on the VCO, so that V4 158 arrives slightly ahead of R4 146. The DOWN output will then send out a small correction pulse, which starts at V4 158 and ends at R4 146, to slow down the VCO and hopefully at and after the fifth VCO arrival V5 160, both signals will be back in sync.

Now suppose the reference signal suddenly disappears after the sixth arrival R6 150. When V7 164 arrives, the basic PFD 280 will simply push the frequency of VCO lower by enabling the DOWN output, and it will continue to keep pushing the frequency of VCO lower regardless how many VCO signals subsequently arrive.

It is, therefore, clear that the PFD 280 does not care about the arrival-time of each signal by itself, so that the timing relationship between the arrivals of V1 152, V2 154, V3 156, V4 158 . . . or between the arrivals of R1 140, R2 142, R3 144, R4 146 has nothing to do with the output of the PFD 280 at all. In other words, the phase and frequency of each signal along has nothing to do with the output of PFD 280. The only thing that the PFD 280 cares is the arrival-time difference between the two input signals R1-V1, R2-V2, R3-V3, R4-V4, and the sequence of how the signals arrive. The arrival-time difference is the only factor to decide the output from the PFD 280 with charge pump output.

So in the reality, although the PFD 280 with charge pump output behaves very closely to the ideal output characteristics as shown in FIG. 3, its principle of operation is very different from what we thought. In reality, the slope of the output characteristic of PFD 280 with charge pump output is simply determined by the slew rate of the charge pump and has nothing to do with the phase difference at the inputs and the horizontal axis should be the arrival-time difference instead of the phase difference between the two input signals. The output characteristic of the basic PFD 280 with the charge pump should be represented as the FIG. 5.

When the UP output of PFD 280 is true, it only means that the PFD 280 has determined that the reference signal 118 has arrived first. The PFD 280 really does not know or care whether if the frequency of the reference signal 118 is higher or the phase of the reference signal 118 is earlier than the signal from VCO 120. The frequency of the reference signal 118, as a matter of fact, can be lower than the frequency of the signal from VCO 120 but the basic PFD 280 still puts out UP to speed up the VCO 116.

The arrival-time of a signal is a function of amplitude, frequency and phase of the signal. It is a very complicated phenomenon which is not easily analyzed. The only way to analyze the arrival-time is by using the tools of statistics. The arrival-time can be characterized as a stochastic process that is governed by the Poisson distribution if the noise source is Gaussian. Before the PLL is locked, the two input signals to the PFD are un-related. When the PLL is eventually locked, the two input signals to the PFD will be correlated to some extent. The analysis of this process is beyond the ability of most engineers.

Since the charge pump is a digital logic device, when the UP output of the PFD 280 is true, it will turn on the sourcing charge pump to pump up the voltage on the low pass filter 114 and the sourcing charge pump output will ideally stay at the power supply voltage Vcc 130 all the way, and when the DOWN output of the PFD 280 is true, it will turn on the sinking charge pump to suck down the voltage on the low pass filter 114 and the sinking charge pump output will ideally stay at the zero ground voltage 132 all the way except when the arrival-time difference between the reference signal 118 and the signal from VCO 120 is so small that the charge pump output does not have enough time to reach the power supply voltage Vcc 130 or zero ground voltage 132 due to the slew rate limit. As a result, the slope 172 of the output characteristics of PFD 280 with the charge pump output is simply determined by the slew rate of the charge pump.

As a result, the output of a PFD 280 with charge pump output should be characterized as in FIG. 5 instead of as the conceptual ideal characteristic of PFD in FIG. 3 because the PFD 280 with charge pump output has no idea about what a $2\pi$ is. The PFD 280 only knows the difference of arrival-time. The output of the PFD 280 with charge pump output is either Vcc 130 when the arrival-time difference is greater than +Vcc/(2× slew rate) 168 or ground zero volt 132 when the difference of arrival-time is less than −Vcc/(2× slew rate) 170. The output voltage of the PFD 280 with charge pump output is between Vcc and 0 when the difference of arrival-time is within +/−Vcc/(2× slew rate) and the charge pump output is biased at a constant DC bias voltage ideally equal to Vcc/2 138 when the PLL 100 is in a locked condition and both input signals to the PFD 280 arrive at the same time. This ideal Vcc/2 DC voltage 138 is also called the ideal operating point of the PFD 280 with charge pump output. The ideal PFD 280 with charge pump output thus has only three stable output states, the Vcc (High) state 130, the ground (Low) state 132 and the linear state 134. The time Vcc/(2× slew rate) 168 is also called the slew time 168 of the charge pump since it is the time that the charge pump takes to go from the ideal operating point to either end of the power supply.

When the PLL 100 is in the locked condition, the arrival-time difference between the two input signals is mostly zero and can fluctuate around zero arrival-time difference point 178 slightly due to the phase noise and the output of the PFD 280 with charge pump output should be fluctuating slightly around a constant DC bias voltage. Assuming the charge pump is biased at the ideal operating point of Vcc/2 138 then the output of the PFD 280 with charge pump output can go no more than +Vcc/2 or −Vcc/2 from the Vcc/2 138 operating point when the arrival-time difference is large. The gain of the PFD 280 with charge pump output should then simply be defined as the voltage difference between the charge pump output voltage and the constant bias voltage 138 and has the unit of volt so that the gain of the phase detector should be zero when the two signals arrive at the same time and the gain is +/−Vcc/2 when the arrival-time difference is large for this PFD 280 with charge pump output biased at the ideal operating point. The Vcc/2 138 operating point is the only stable operating point for the this PFD 280 with charge pump output biased at the ideal operating point and, if there is no noise in the PLL 100 system, the PFD 280 with charge pump output should stay at the ideal operating point 138 and is dead forever when the PLL 100 is locked because the gain of the PFD 280 with charge pump output is zero at this point.

The ideal transfer characteristic of the PFD 280 with charge pump output should then be as shown in FIG. 6. The gain of the PFD 280 with charge pump output should be +Vcc/2 174 (Positive High state) when the arrival-time difference is greater than Vcc/(2× slew rate) 168 and should be −Vcc/2 176 (Negative High state) when the arrival-time difference is less than −Vcc/(2× slew rate) 170 and the gain of PFD 280 with charge pump output can vary from −Vcc/2 to +Vcc/2 173 (Linear state) when the arrival-time difference varies between −Vcc/(2× slew rate) 170 to +Vcc/(2× slew rate) 168 and the gain of PFD 280 with charge pump output should be simply zero when both signals arrive at the same time so that no AC output from the PFD 280 with charge pump output is needed to correct the VCO 116. The zero arrival-time difference point 178 should be the only point that produces no AC output. However, in the reality, due to the inactive time (dead time) caused by the slew rate limitation and input threshold requirement of the logic gates as explained earlier, a dead-zone 175 can appear around the zero arrival-time difference point 178 and creates an extra off state for the PFD 280 with charge pump output. As a result, the dead-zone will modify the transfer characteristic of PFD with charge pump output as shown in FIG. 7. The gain of the PFD 280 with charge pump output now has four distinct output states, the Positive High state 174, the Negative High state 176, the Linear state 173 and the dead-zone OFF state 175.

The slew rate 172 of a logic device determines how fast the output of the logic device can change state when the input is switched from H to L or L to H. The slew rate 172 is usually determined by the amount of current switched during the transient. The more current switched during the transient, the more time it will need and the slower the slew rate 172 becomes. For logic devices inside an IC, the output driver stage along is usually the determining factor for the slew rate 172 because it needs to drive a larger load. The switching current of a normal CMOS gate inside an IC is normally in the order of uA while the switching current of the output driver is normally in the order of mA. As a result, the slew time of Vcc/(2*SR) 168 is determined mainly by the slew rate limitation of the output driver stage but the dead time $T_{dead}$ 179 is determined by all the stages and the slew time Vcc/(2*SR) 168 is usually a few times larger than the dead time $T_{dead}$ 179. For a typical CMOS gate, the slew time of Vcc/(2*SR) 168 is about three times the dead time $T_{dead}$ 179 and both the slew time 168 and dead time $T_{dead}$ 179 can vary greatly according to the design of the logic gate.

The OFF state created by the dead-zone 175 is not necessary bad for the PLL 100 system. In applications where the phase noise of the VCO 116 is important, such as the cell phone that requires a VCO 116 with a low phase noise to reduce the interference from the adjacent channels, the dead-zone 175 can reduce the phase noise of VCO 116 substantially since the PFD 280 with charge pump output is generating fewer and smaller correction pulses for the VCO 116. But for the application like a clock generator, the dead-zone 175 is bad because it allows the VCO 116 to wandering within the dead-zone 175 and the VCO 116 can jitter more. The biggest problem caused by the dead-zone 175 is that it requires a very large capacitor 184 for the loop filter 114. For a PFD 280 with charge pump output having a dead-zone 175, since the PFD 280 with charge pump output can be idle for a long period of time without sending out any correction output to the loop filter, a loop filter with a large time constant and with a large size of capacitor 184 is inevitable in order to maintain a stable VCO frequency for a long period of time without needing any correction voltage from the charge pump while for a PFD 280 with charge pump output without the dead-zone 175, since the charge pump will be constantly charging or discharging the loop filter for almost every comparison cycle, the time constant of the loop filter can be small and the size of the capacitor 184 can be small, too. The larger the dead-zone 175 is, the larger size of the capacitor 184 is needed. This is definitely a problem for the PC clock IC when the capacitor is usually fabricated inside the IC that a large capacitor is difficult to fit in and can also significantly increase the cost of the IC.

In theory, the dead-zone 175 is an undesired operating state although it generally does no harm and in some cases might be even beneficial. Nevertheless, the design engineer should do whatever needed to reduced the size of dead-zone 175 to the minimum. Ideally, the perfect PFD with charge pump output should have only three output states, the Vcc(H) 130 state, ground(L) state 132 and the linear state 134 as shown in FIG. 5. Unfortunately, as we will see soon that it is very difficult to eliminate the dead-zone 175 in the real circuit completely without losing the linear state 134.

It is thus clear that the traditional definition for the gain of the phase detector is no longer capable of being used to analyze the PFD 280 with charge pump output. First of all, the gain of the PFD 280 with charge pump output has the unit of Volt, instead of Volt/rad as traditionally defined since the phase information of the input signals along is no longer relevant. Secondly, the gain of the PFD 280 with charge pump output should be defined as the voltage difference between the output voltage of the PFD 280 with charge pump output and the DC bias voltage of the charge pump output, which is ideally biased at Vcc/2 138 and which is also the output voltage when the arrival-time difference of the input signals is zero. As a result, the gain of PFD 280 with charge pump output is not a constant, as we will see soon that the gain of the PFD 280 with charge pump output can even vary quickly from 0 to infinity within a very small range of arrival-time difference. When the PLL 100 is in the acquisition mode, the gain of the PFD 280 with charge pump output is simply +/−Vcc/2 if the charge pump output is biased at the ideal operating voltage of Vcc/2 138 because there will be a large difference of arrival-time between the two signals during this period. When the PLL 100 is in the locked condition, the gain of the PFD 280 with charge pump output is determined by the phase noise of the input signals and the slew rate 172 of the charge pump. The higher the phase noise, whether the noise is coming from the reference signal or the VCO 116, the higher the gain. It is thus clear that in order for a low noise system to work well, the slew rate 172 of the charge pump output must be as high as possible. So the gain of the PFD 280 with charge pump output is not a constant and should vary between −Vcc/2 and +Vcc/2 for a well designed PLL 100. Thirdly, the arrival-time of each signal is a stochastic process governed by the Poisson distribution. As a result, the gain of the PFD 280 with charge pump output can only be calculated with the tools of statistics when the loop is locked.

Before examining how to calculate the gain for the PFD 280 with charge pump output, the gain of the PFD 280 with charge pump output may be found by simply measuring it with an oscilloscope. Since the output from charge pump should remain at a constant DC bias voltage when the PLL 100 is in the locked condition and occasionally the output voltage can spike up or down from the DC bias voltage due to the noises, the gain of PFD 280 with charge pump output can be measured as the maximum stable triggering voltage of the output signal from charge pump output to the oscilloscope using the rising edge triggering minus the DC bias voltage and also as the minimum stable triggering voltage of the output signal from charge pump output to the oscilloscope using the falling edge triggering minus the DC bias voltage. This measuring method might produce two different values for the gain of PFD 280 with charge pump output if the absolute values of the results of the two measurements are not equal. As we will see soon that it is quite normal for a PFD 280 with charge pump output to have two different gains. This method to measure the gain for the PFD 280 with charge pump output has been proved to accurately match the theoretical calculation with the experimental result.

As shown in the FIG. 6 for the transfer characteristic of an ideal PFD 280 with charge pump output, the decision circuit for the arrival-time difference detection is assumed to be ideal so that the two signals always arrive at the decision circuit with equal delay and the decision circuit never makes a mistake. Suppose there is a slight delay difference between the two signals to the decision circuit so that it takes the reference signal more time to get to the decision circuit. In this case, as long as the decision circuit does not make an error in the judgment, this delay error should simply be compensated at the input so that the reference signal will arrive at the input earlier when the loop is locked. The transfer characteristic of a PFD 280 with charge pump output with a delay error will then be shown as in FIG. 8. In this figure, the transfer characteristic of a PFD 280 with charge pump output with the delay inequality is simply a shifted version of the transfer characteristic of ideal PFD with charge pump output Gain(t−$t_{delay}$) 181 and the zero arrival-time difference point 178 is no longer the stable operating point any more and the new stable operating point $t_{delay}$ 180 is a point with a slight positive time to cancel out the delay. The PFD 280 with charge pump output with delay inequality will still work very much the same like an ideal PFD 280 with charge pump output. The shift in arrival-time difference axis does not affect the performance of the PFD 280 with charge pump output.

After clarifying the characteristics of the PFD 280 with charge pump output, we also need to clarify the operation of charge pump before we can tackle the dead-zone problem. The charge pump has been used as the output driver for the PFD 280 since the circuit was invented. There are two ways to build a charge pump. One way is to use a tri-state output driver commonly used in the digital logic circuit as the charge pump as shown in FIG. 9. This kind of charge pump is normally referred to as the voltage charge pump since the source of the charge is from a voltage source. The amount of charges pumped out from or sucked in to the voltage charge pump is determined by a resistor and the bias voltage at the tri-state output driver. The resistor 182 determines the amount of current for charging and discharging while the capacitor 184 provides the tuning voltage $V_{LPF}$ 186 for the VCO and the bias voltage for the single-ended charge pump 188 at the same time.

A tri-state output driver requires two input signals, an enable input 190 and a polarity input 192. The output of a tri-state output driver is normally in a Hi-Z state (or open circuit OFF state) until it is enabled. When it is enabled, the output can be either H (Vcc) 130 or L (Ground) 132, depending upon the polarity input signal to tri-state output driver. The output of the tri-state output driver is normally connected to an external DC voltage source between the Vcc and the ground when it is in the Hi-Z state so that when the tri-state output driver is enabled and the polarity input signal is H, a positive current will flow out of the tri-state output driver but when the tri-state output driver is enabled and the polarity input signal is L, then a negative current will flow into the tri-state output driver. As a result, a tri-state output driver connecting to an external DC voltage source will work as a voltage charge pump. In our application here, the capacitor 184 of the low pass filter provides the external DC voltage bias source for the charge pump 188. The charge pump 188 will either pump out current to or sink in current from the capacitor 184 of the low pass filter until a stable control voltage is established at the capacitor 184 to control the VCO.

The other way to build a charge pump is to use a current source. The output current from the current source won't be affected by the components of the low pass filter. Both kinds of charge pumps have been widely used and their performances are the same so that we will only use the voltage charge pump here since the voltage charge pump is easier to use as a single-ended charge pump and the amount of charging and discharging current can be adjusted easily.

The charge pump can either be built by using a single tri-state output driver or a single current source that can either pump out or sink in current or by using two separate independent tri-state output drivers or two separate independent current sources that one of them can only pump out current while the other one can only sink in current. The use of a single tri-state output driver for the voltage charge pump or a single current source for the current charge pump will be referred to as the single-ended charge pump while the use of two separate independent tri-state output drivers for the voltage charge pump or two separate independent current sources for the current charge pump will be referred to as the double-ended charge pump in the rest of this document. A single-ended charge pump requires two independent input signals, the polarity input signal and the enable signal while a double-ended charge pump requires two independent enable signals. The basic PFD 280 operated with a double-ended charge pump is shown in FIG. 10 and we will call this design simply as the "current PFD 336" for the rest of this document since this is the most widely used design for the PFD nowadays.

Now, after clarifying the characteristics of the PFD 280 and the charge pump 188, we are ready to figure out why the dead-zone problem occurs with current PFD 336. To do that, we need to look into the timing diagram as shown in FIG. 11 for the current PFD 336 as shown in FIG. 10.

1. When the reference signal 118 arrives first, it will trigger the output of Reference F/F 122 to switch to the H state.
2. The H output of the reference F/F 122 will enable the sourcing charge pump 194 to pump out current to the LPF made of resistor 182 and capacitor 184.
3. When the VCO signal 120 finally arrives, it will trigger the output of VCO F/F 124 to switch to the H state, too.
4. The H output of the VCO F/F 124 will enable the sinking charge pump 196 to sink in current from the LPF made of resistor 182 and capacitor 184.
5. When the output of both F/Fs 122 and 124 are in the H state, a reset signal 128 is generated by the AND logic gate 126 to clear both F/Fs.
6. After some propagation delay, both F/Fs, 122 and 124, are reset and both charge pumps, 194 and 196, are disabled and returned to the Hi-Z state.
7. As a result, a net positive current has been pumped out and the current PFD 336 is now ready for the next arrival sequence.
8. When the VCO signal 120 arrives first, the current PFD 336 will repeat the same process as above except that the order of the flip-flop operation is reversed and the charge pump will sink in current at the beginning and, in the end, a negative current will be pumped out.

This current PFD 336 has been used for many years; however, it is not without any discrepancy. The biggest problem of the current PFD 336 is that there is a period when both the sourcing 194 and sinking 196 charge pumps are enabled before both flip-flops 122 and 124 are reset. This period is inevitable because it takes time to generate a reset pulse 128 and to clear the flip-flops. During this period, if both flip-flops and both charge pumps are not matched perfectly, an erroneous leakage current will occur. This erroneous leakage current will be there regardless of which signal is leading and its period is a constant regardless of the amount of arrival-time difference between the two input signals.

This erroneous leakage current or glitch of the current PFD 336 output is an impossible problem to be solved. In theory, it is possible to be glitch-free but it requires a perfect matching of two flip-flops and two charge pumps which is impossible to do in the real world repeatedly in all conditions. A slight mismatching, no matter how small, will result in a glitch. Since the glitch is constantly sinking in or sourcing out current, it will certainly affect the transfer characteristic of the current PFD 336. If the glitch is sinking in current, then the net output current will be less all the time. As a result, the glitch will push the transfer characteristic of the current PFD 336 downward as shown in FIG. 12. This new transfer characteristic is very similar to FIG. 8 when there is a delay inequality in the decision circuit but with a big difference. The glitch actually modifies the gain of current PFD 336 in order to push the transfer characteristic downward. Unlike the delay inequality error which only shifts the whole curve of transfer characteristic Gain(t) 171 in the horizontal arrival-time difference axis without modifying the gain of PFD in the vertical axis, the glitch does the opposite. It does not affect the horizontal arrival-time difference axis but only works as a gain modifier on the vertical axis. For all the points except the zero arrival-time difference point 178, the net results of the two errors are almost identical. For example, at the point with an arrival-time difference of A 198, the output voltage should be Gain(A) for an ideal current PFD 336 without a glitch so that the gain at the arrival-time difference of A is Gain(A)−Vcc/2 200 when the glitch is absent. With the presence of a negative glitch, assuming that the negative glitch pushes the transfer characteristics downward by Voffset 202, the output voltage of the current PFD 336 becomes Gain(A)−Voffset and gain of the current PFD 336 becomes [Gain(A)−Voffset]−Vcc/2 204 so that the negative glitch has affected the gain by a factor of {[Gain(A)−Voffset]−Vcc/2}/[Gain(A)−Vcc/2]. But at the zero arrival-time difference point 178, since Gain(A)−Vcc/2 is zero, the glitch has effectively an infinity gain at this point. In other words, since the gain of current PFD 336 without the glitch is zero when the arrival-time difference is zero but the gain at this point now is a finite output other than zero due to the glitch so that the effective gain of the glitch must be infinite 206 at the zero arrival-time difference point 178. This zero arrival-time difference point 178 has become a singularity due to the glitch! The gain of the current PFD 336 has now changed from −Vcc/2 to +Vcc/2 to −Infinity to +Vcc/2. As a result, the current PFD 336 can only be operated at the right side of the transfer characteristic.

Suppose the reference signal 118 is leading and the current PFD 336 is pumping up the VCO 116. When the VCO 116 is slowly speeding up to catch up with the reference signal 118, the arrival-time difference will be eventually reduced to zero but the current PFD 336 is still producing a net sinking current due to the negative glitch even when the two signals arrives at the same time. The sinking current will slow down the VCO 116 so that the reference signal 118 is leading again and the same process just keeps repeating itself over and over again. As soon as the VCO signal 120 reaches the zero arrival-time difference point 178, the erroneous negative glitch slows it down again so that the VCO 116 will never be stable at the point of zero arrival-time difference 178. Eventually, the VCO 116 will find a stable operating point at $t_{error}$ 208 as shown is FIG. 12 to produce a small positive current to cancel out the negative erroneous glitch so that the net correction current will be zero at this new stable operating point at $t_{error}$ 208.

The stable operating point of the current PFD 336 is now shifted to the positive side so that the reference signal 118 will always lead the VCO signal 120. If the glitch is small, the new operating point $t_{error}$ will not be too far from the zero arrival-time difference point 178 so that the current PFD 336 will still run into the zero arrival-time difference point 178 very often due to the noises and every time the current PFD 336 runs into the zero arrival-time difference point 178, a sudden increase of gain from −Voffset 202 to −infinity 206 will trigger a sudden jolt on the charge pump output and it is the well-known dead-zone problem, although in fact, this problem should be called as the "zero arrival-time difference problem" to better describe the cause of the problem. This sudden jolt on the current PFD 336 output can't be filtered out completely because it is a discontinuity that contains energy in the whole frequency spectrum. The only known way to deal with this problem is to operate the current PFD 336 away from the zero arrival-time difference point 178 as far as possible. Although this approach to avoid the zero arrival-time difference point 178 does not fix the cause of the dead-zone problem at all, it has served the industry well until now to avoid the dead-zone problem, but with a price.

The only way to push the current PFD 336 away from the zero arrival-time difference point 178 is to increase the impact of glitch. This can be done in two ways, either to purposely increase the mismatch between the sinking 196 and sourcing 194 charge pumps or to stretch the width of reset pulse 128 and/or to delay the reset pulse 128. One way is to increase the magnitude of the glitch while maintaining the same width for the glitch. The other way is to keep the same magnitude for the glitch but making it to last longer. Both ways will increase the phase noise for the VCO 116 because the current PFD 336 will be actively pumping more current to the low pass filter 114 for every comparison cycle. Increasing the magnitude of glitch will only introduce more phase noises to the VCO 116 while stretching the reset pulse 128 and/or delaying the reset pulse 128 will not only generate more phase noise but also slow down the current PFD 336. Stretching the reset pulse 128 and/or delaying the reset pulse 128 is the worst solution but it is more popular because it is easier to implement.

The solution to stay away from the zero arrival-time difference point 178 by increasing the impact of glitch can also cause two more problems for the design engineers, the first problem is that the more phase noises present in the system, the farther away you have to push the operating point from the zero arrival-time difference point 178 and the further away you push the operating point, the more phase noise will be generated. It can become a non-converging solution if the phase noise of the system is high. The second problem now is that the engineer has to make sure that the PLL 100 is stable over a large range of loop gain and the stability of the PLL 100 can become a problem. A root locus analysis for loop gain varying from zero to infinity is absolutely required to exam the stability of the PLL 100. If not for the glitch, the engineer only has to exam the stability of the PLL 100 over a very small range of loop gain and the stability issue is much easier to deal with.

"How fast can the PFD 280 be operated?" is always a difficult question for any engineer to answer? In theory, the operating speed of the PFD 280 will be slightly slower than the self-toggling rate of the flip-flop because the AND gate 126 in reset circuit path adds a propagation delay to the signal path. Assuming that the flip-flops, 122 and 124, are master-slave kind of flip-flops, then the propagation delay of the flip-flop will be approximately equal to two times the propagation delay of a single logic gate. The input signal to the flip-flop is also required to meet the setup time and hold time requirements which are normally also equal to two times the propagation delay of a single logic gate each. Since the routing and the inverted output each will add an extra single gate delay for the flip-flop when its inverted output is connected back to the input so that it can toggle by itself, this self-toggling circuit will have a total propagation delay of eight single logic gate delays. So the self-toggling rate of the flip flop is basically 1/(8× single logic gate delay). When the AND gate 126 is used for the reset circuit in the PFD 280, the signal path of the PFD 280 will have two extra gate delays, one from the AND gate 126 and the other one from the routing, more than the self-toggling flip-flop so that the maximum operating frequency of the PFD 280 should be 1/(10× single logic gate delay). As a result, the PFD 280 can only be operated at less than 80% self-toggling rate of the flip-flop. If the reset signal 128 is stretched for two more extra single logic gate delays by adding an extra gate to the reset signal path, then the maximum operating speed of the PFD 280 will not be faster than 67.5% of the self-toggling rate of the flip-flop. If the reset signal is stretched for four more extra single logic gate delay by adding two extra gates to the reset signal path, the maximum operating speed of the PFD 280 will be further reduced to only 57% and it becomes only 50% when three logic gates are added to the reset signal path.

The above calculation for the maximum operating speed is only an approximation and is valid when the PLL 100 is in an ideal operating condition and all the logic gates are assumed to have an equal propagation delay.

The solution to push the operating point of the current PFD 336 away from the zero arrival-time difference point 178 by increasing the impact of glitch made perfect sense except that it slowed down the current PFD 336 and caused more phase noise. When the design engineers designed the circuits for the current PFD 336, the engineers always tried to match the charge pumps and signal propagation paths as close as they could. But the better the matching was, the smaller the glitch became and the closer the current PFD 336 would be operated near the zero arrival-time difference point 178 and the more the current PFD 336 would jitter. In order to solve this problem, the current PFD 336 would need a much longer delay for the reset circuit. As a result, the current PFD 336 would become very slow. This problem has happened to almost all the PLL IC today.

Since the design of current PFD 336 inherently has the zero arrival-time difference jittering problem, there is always a chance that the current PFD 336 will step into the zero arrival-time difference point at some time regardless of how small the probability is. The Murphy's Law tells us as long as there is a chance it can go wrong, it will. This zero arrival-time difference jittering problem is especially difficult for the PC clock generator since a single clock jitter caused by stepping into the zero arrival-time difference point can certainly cause the whole system to crash. The PC clock manufacturer relies on the specification of the clock-to-clock jitter to prevent this problem from happening but it is just not enough. This specification does not guarantee the problem won't happen, unfortunately. The only way to guarantee that the zero arrival-time difference jittering problem will not happen is to make sure that the zero arrival-time different point does not cause jittering problem in the first place.

If we look into the timing diagram of the current PFD 336 in FIG. 11 carefully, we will see that when the reference signal 118 arrives earlier than the signal from VCO 120, then the output of the Reference flip-flop 122 contains the information of the arrival-time difference between two signals plus the propagation delay from the output of the reference flip-flop 122 through the AND gate 126 until the output of the reference flip-flop 122 is reset while the output of the VCO flip-flop 124 contains only the information of the delay from the output of VCO flip-flop 124 through the AND gate 126 until the output of the VCO flip-flop 124 is reset. And we totally depend on the matching between the charge pumps, 194 and 196, to remove the undesired flip-flop delay signal information from the output. Only when both of the charge pumps, 194 and 196, are perfectly matched and the delay time of the reset paths of the two flip-flops are equal, then we can obtain a charge pump output with accurate arrival-time difference information. If the matching is not perfect or delays are not equal, then the charge pump output will be incorrect. As a result, it is very difficult for the current PFD 336 to deliver an accurate arrival-time difference output signal to correct the VCO 116.

If the reference signal 118 arrives later than the signal from the VCO 120, then only the output of the VCO flip-flop 124 will carry the information of the arrival-time difference between two input signals. It is thus clear that even though the basic PFD 280 generates two output signals, it can only produce an output signal with the desired arrival-time difference signal at any given time. When the reference signal 118 is leading, only the output from reference flip-flop 122 carries the desired arrival-time difference information and when the VCO signal 120 is leading, only the output from VCO flip-flip 124 carries the desired arrival-time difference information. As we will see soon that this is the key to solve the dead-zone problem.

In a conclusion, the PLL 100 using the current PFD 336 is unable to stay in the zero arrival-time difference point 178 simply because the glitch in the current PFD 336 becomes a singularity and constantly pushes the current PFD 336 out of the zero arrival-time difference point 178. The zero arrival-time difference point 178 which is supposed to be the ideal operating point for a PFD has become unstable for the current PFD 336 and is the source of jittering problem. In order to prevent the dead-zone jittering problem, the two input signals to the current PFD 336 must now be operated with a timing offset so that the current PFD 336 will be operated away from the zero arrival-time difference point 178. The timing offset, unfortunately, will slow down the current PFD 336 and add more phase noises to the VCO 116. Although the dead-zone jittering problem is minimized, the cause of the dead-zone jittering problem is still there.

In order for a PFD to stay in the zero arrival-time difference point 178 peacefully, the glitch problem must be solved first. Only when a PFD is glitch-free and operated in the zero arrival-time difference point 178, it will generate the least amount of correction pulses to the VCO 116 so that the VCO 116 will have the least amount of phase noise. And only so, the PLL 100 will perform the best without any compromise to the phase noise and speed performance.

The current PFD 336 as shown in FIG. 10 has an inherent glitch problem that is impossible to be solved. The double-ended charge pump structure should simply be abandoned because it is impossible to balance the two charge pumps and the flip-flops perfectly so that we can't solely count on the balancing of the charge pumps and delay paths to produce an error-free output signal. Almost all of the PLL ICs today use the design of current PFD 336 simply because it is very difficult to balance the charge pumps and flip-flops perfectly so that the glitch is always large and it is actually easier to push a PFD with a larger glitch away from the zero arrival-time difference point 178.

An ideal PFD can only use a single-ended charge pump as the output. A basic PFD with a single-ended voltage charge pump output 337, comprising of a reference flip-flop 122, a VCO flip-flop 124, an AND logic gate 126, an Exclusive-OR gate 210 and a tri-state output driver 188 as the single-ended charge pump, is shown in FIG. 13 and its timing diagram is shown in FIG. 14. The flip-flop 122 generates the polarity signal for the single-ended charge pump while the output of Exclusive-OR gate 210 contains the arrival-time difference between two input signals and becomes the enable signal for the single-ended charge pump. In this design, the Exclusive-OR gate 210 is used to remove the undesired flip-flop delay from the flip-flop outputs to obtain the desired arrival-time difference signal and the operation of the basic PFD with a single-ended charge pump output 337 can be described as follows, 1. When the reference signal 118 arrives first, it will trigger the Reference F/F 122 to switch to the H state. The output from the Reference F/F 122 will be used as the polarity signal 192 for the single-ended charge pump 188.
2. When the signal from the VCO 120 finally arrives, it will trigger the VCO F/F 124 to switch to the H state, too.
3. When both F/Fs are in the H state, a reset signal 128 is generated by the AND logic gate 126 to clear both F/Fs. In the meantime, the Exclusive-Or logic gate 210 would have generated an enable signal 190 to turn on the single-ended charge pump 188 when the two F/Fs were not in the same state and the duration of the time when the single-ended charge pump 188 was enabled is exactly the difference of the arrival-time between the two input signals. In this case, when the Reference signal 118 arrives first, the single-ended charge pump will pump out current to the low pass filter and it will go into the high-impedance state shortly after the VCO signal 120 finally arrives. The duration of the output signal thus represents the accurate arrival-time difference between the two input signals and the polarity of the charge pump output current is accurate and is positive during the entire time when the charge pump is enabled.

The basic PFD with a single-ended charge pump output 337 has been also used for many years; however, it is not without any discrepancy, either. First of all, it is very difficult to balance the flip-flops of the basic PFD with a single-ended charge pump output 337 since the loading of each flip-flop is not the same, secondly, it can only produce an accurate charge pump output signal to correct the VCO 116 for half of the time and it generates an erroneous glitch for the other half of the time. The problem can be shown as in the timing diagram of FIG. 14.

When the VCO signal 120 arrives first, the problem will occur as follows,

1. When the VCO signal 120 arrives first, the VCO F/F 124 will be in the H state first while the Reference F/F 122 is still in the L state.
2. When the Reference signal 118 finally arrives and triggers the Reference F/F 122 to switch to the H state, a reset signal 128 is then generated by an AND logic circuit. 126 to clear both F/Fs.
3. Since there is some inherent propagation delay from the generation of the reset signal 128 until it forces both F/Fs to go into the L state, the output at the Reference F/F 122 will remain in the H state for a brief moment before it is finally reset. Theoretically, when the VCO signal 120 arrives first, the output of the Reference F/F 122 should remain in the L state all the time and the polarity of the charge pump output current should be negative and the charge pump should only sink in current from the low pass filter. However, since the rising edge of the Ref F/F 122 output triggers the falling edge of the enable signal 190, the charge pump output current will always switch the polarity from sinking in current to pumping out current at the end when the VCO signal arrives first. The output of the PFD with a single-ended charge pump output 337 is thus inaccurate and is corrupted with an erroneous glitch current when the VCO signal 120 arrives first.
4. In theory, since the output of the Ref F/F 122 (polarity signal 192) always occurs earlier than the enable signal 190 by the propagation delay time of the Exclusive-Or gate 210 when the reference signal 118 arrives first, it is thus possible to avoid the glitch by delaying the polarity signal 192 from the output of Ref F/F 122 with an extra delay time that is equal to the delay time of the Exclusive-Or gate 210 before the polarity signal reaches the charge pump 188. But if the extra delay time is more than needed, then an erroneous glitch will appear when the reference signal 118 is ahead of the VCO signal 120. If the extra delay time is not enough, then an erroneous glitch will still appear when the VCO signal 120 is ahead of the reference signal 118. Only a perfect match of delays between two signal paths can prevent the glitch from happening for this basic PFD with a single-ended charge pump output 337 but it is impossible to achieve that all the time, every time in all conditions. Adding an extra delay usually can significantly reduce the size of glitch for this basic PFD with a single-ended charge pump output 337, however, the smaller the glitch, the closer the PFD will be operated near the zero arrival-time difference point 178 and the PFD will jitter more.

The transfer characteristic of the basic PFD with a single-ended charge pump output 337 is shown as in FIG. 15. The glitch at the output of the basic PFD with a single-ended charge pump output 337 generates a discontinuity for the gain of PFD, just like the current PFD 336. The gain of the basic PFD with a single-ended charge pump output jumps suddenly from 0 to $V_{offset}$ 202 when the arrival-time difference is crossing over the zero arrival-time difference point 178 and causes exactly the same problem as the glitch in the current PFD 336. As a result, the two input signals of the basic PFD 280 will never arrive at exactly the same time. Some constant timing offset is inevitable in order to compensate for the glitch. The glitch only pushes up the left side of the transfer characteristic and the stable operating point $-t_{error}$ 209 has been shifted to the left. It is quite sad to see that the basic PFD with a single-ended charge pump 337 is now operated only in the left half of the transfer characteristic which is actually the bad half of the basic PFD with a single-ended charge pump output 337. The good half of the basic PFD with a single-ended charge pump output 337 which is the right half of the transfer characteristic is simply not in use.

The basic PFD with a single-ended charge pump output 337, fortunately, is salvageable since it can still produce an accurate, error-free output signal for half of the time. We just need to figure out a way to generate the other half of the signal from another circuit, such as from the complementary PFD 282.

A complementary PFD 282 with a single-ended charge pump output 339, comprising of a VCO flip-flop with inverted output 218, a reference flip-flop with inverted output 220, an AND logic gate with inverting inputs 222, an Exclusive-OR gate 224 and a single-ended charge pump 188, is as shown in FIG. 16. The complementary PFD 282 works very much the same as the basic PFD 280 as described before except that the F/F generates an inverted output and the polarity signal output is taken from a different flip-flop. The output of the Exclusive-OR gate 224 carries the exact information of the arrival-time difference between the two input signals and it will be used as the enable signal for the single-ended charge pump 188. The timing diagram for the complementary PFD with a single-ended charge pump output 339 is shown in FIG. 17 and the complementary PFD with a single-ended charge pump output 339 is operated as following, 1. If the VCO signal 120 arrives first, it will trigger the output of the VCO F/F 218 to switch to the L state. The output of VCO F/F 218 will be also used as the polarity signal 192 for the single-ended charge pump 188.
2. When the Reference signal 118 finally arrives, it will also trigger the output of Reference F/F 220 to switch to the L state.
3. When both flip-flops are in the L state, a reset signal 228 is then generated by an AND logic gate 222 to clear both F/Fs and both F/Fs will return to the H state after the reset occurs. In the meantime, the Exclusive-Or logic circuit 224 would have generated an enable signal 190 to enable the single-ended charge pump 188 when the two F/Fs were not in the same state and the duration of the time when the single-ended charge pump was enabled is exactly the difference of the arrival-time between the two input signals. In this case, when the VCO signal 120 arrives first, the single-ended charge pump 188 will sink in current from the low pass filter and it will go into the high-impedance state shortly after the reference signal 118 finally arrives. The duration of the charge pump output signal thus represents the accurate arrival-time difference between the two input signals and the polarity of the charge pump output current is accurate and is negative during the entire time when the charge pump is enabled.

But just like the basic PFD 280, the complementary PFD 282 can only generate an accurate output signal for half of the operation time when the VCO signal 120 is ahead. When the Reference signal 118 is ahead, the complementary PFD 282 generates a glitch just like the basic PFD 280. The glitch is generated as follows, 1. When the Reference signal 118 arrives first, the Reference F/F 220 will be in the L state first.
2. When the VCO signal 120 finally arrives, it will cause VCO F/F 218 to switch to the L state which will then generate the reset signal 228 to clear both F/Fs. Unfortunately, just like the basic PFD 280, the falling edge of the VCO F/F 218 output will trigger the falling edge of the enable signal 190 and it will cause the single-ended charge pump 188 output to remain in the erroneous L state for a brief moment. As a result, an erroneous leakage current as seen before in the basic PFD 280 is generated.

The transfer characteristic of the complementary PFD 282 with a single-ended charge pump output is shown in FIG. 18. The stable operating point of the complementary PFD 282 with a single-ended charge pump output is now shifted to the right at $t_{error}$ 208.

Since the PFD 280 with a single-ended charge pump output can only deliver an accurate, error-free output signal when the reference signal 118 is ahead of the VCO signal 120 and the complementary PFD 282 with a single-ended charge pump output can only deliver an accurate, error-free output signal when the VCO signal 120 is ahead of the reference signal 118, it is thus clear that we can build an accurate, error-free balanced PFD (BPFD) with a single-ended charge pump output by combining both the PFD 280 and complementary PFD 282 together so that the BPFD will work like a PFD 280 when the reference signal 118 is ahead and the BPFD will work like a complementary PFD 282 when the VCO signal 120 is ahead. As a result, the output of BPFD will be accurate and error-free all the time. A typical design for the BPFD with a dead-zone is shown in FIG. 19 as the preferred embodiment 330.

In this design, the polarity output signal 192 produced from the basic PFD 280 is selected as the final polarity signal 307 for the charge pump 188 when the reference signal 118 is ahead of the VCO signal 120 and the polarity output signal 192 produced from the complementary PFD 282 is selected as the final polarity signal 307 for the charge pump 188 when the VCO signal 120 is ahead of the reference signal 118. By doing this way, the final polarity signal 307 will be accurate and without erroneous glitch all the time and output of the new BPFD is thus precise and accurate and without error all the time.

As we have known that even though the PFD 280 generates two output signals but only one of the output signal carries the arrival-time difference information at any given time. So that the polarity output from the reference flip-flop 122 of PFD 280 with a single-ended charge pump output 337 as shown in FIG. 13 can only provide a polarity signal with the desired arrival-time difference information when the reference signal arrives first. The reference flip-flop 122 is simply incapable of providing the desired arrival-time difference information when the signal from VCO arrives first. As a result, for the PFD 280 with a single-ended charge pump output to work properly when the VCO signal arrives first, we have to rely on the balancing of the flip-flops, Exclusive-OR and propagation paths to generate the desired arrival-time difference information when the VCO arrives first. As we have known, it is very difficult to achieve an error-free polarity output signal by relying on the balancing of devices. This is the reason why the PFD 280 can only deliver an accurate, error-free output half of the time because that is how it was designed. The only way to provide the accurate arrival-time difference information when the VCO signal arrives first is simply to use another PFD so that we will have two separate PFDs to provide the arrival-time information for each of two input signals. We can then use a switch to select either one, depending on which one has arrived first, as the final error-free polarity signal.

The most critical part to build the BPFD 330 is to employ an error-free polarity selection 284 circuit to choose the error-free polarity signal 192 from each of the output of basic PFD 280 and complementary PFD 282. The polarity selection circuit includes two parts, a polarity determination circuit and an enable signal selection circuit for the charge pump. The polarity determination circuit decides which polarity signal arrives first, either the polarity signal output from the basic PFD 280 or the polarity signal output from the complementary PFD 282, and chooses the first arrived polarity signal as the final polarity signal 307 for the charge pump 188. If the reference signal 118 is ahead of the VCO signal 120, the polarity signal from the output of reference flip-flop 122 of basic PFD 280 will arrive first and will be chosen as the final polarity signal 307 for the charge pump 188. Since the polarity signal from the output of reference flip-flop 122 of the basic PFD 280 is accurate and without erroneous glitch when the reference signal 118 is ahead of the signal from VCO 120, the final polarity signal 307 will be always accurate and without erroneous glitch and so will the final output from the charge pump 188. Likewise, when the signal from VCO 120 is ahead of the reference signal 118, the polarity signal output from the output of VCO flip-flop 218 of complementary PFD 282 will arrive first and will be chosen as the final polarity signal 307 for the charge pump 188. Since the polarity signal from the output of VCO flip-flop 218 of complementary PFD is accurate and without erroneous glitch when the signal from VCO 120 is ahead of the reference signal 118, the final polarity signal 307 will be always accurate and without erroneous glitch and so will the final output from the charge pump 188.

Once the final polarity signal 307 is chosen, then the enable signal selection circuit 286 will select a final enable selection signal 305 to determine how much correction time is needed for the VCO 116. As we will see soon, there is a lot of freedom to choose the right amount of correction time for the VCO. The simplest design is to simply let the correction time of the final enable signal 305 be equal to the time period of the arrival-time difference signal. The concept of this choice is straightforward that the charge pump 188 simply corrects the VCO 116 with a time period equal to the arrival-time difference between the two input signals. The longer time period of the difference of arrival-time is, the longer period of time the VCO 116 will be corrected. Since the arrival-time difference signals from the basic PFD 280 and the complementary PFD 282 are generated from different flip-flops and gates, the arrival-time difference signal of basic PFD 280 might not occur at the same time as the arrival-time difference signal of the complementary PFD 282. So that, in theory, in additional to select the final polarity signal 307 from either polarity output of the basic PFD 280 or the complementary PFD 282, we also need to select the associated arrival-time difference generated from whichever PFD that is selected to supply the final polarity signal 307.

The only way to guarantee an error-free charge pump output is to make sure that the final error-free polarity signal 307 having a much wider time period than the final enable signal 305 so that the final enable signal 305 will always fall inside the time period window of the final polarity signal 307 easily with plenty of safe margin. As we will see soon that in practice, there is a lot of freedom in choosing the final enable signal 305 for the single-ended charge pump 188. The bottom line is that first of all, the decision to choose the first arrived polarity signals from each of the PFDs must be accurate, precise and absolutely error-free; secondly, as long as the final enable signal 305 going to the single-ended charge pump 188 carries the arrival-time difference information between the two input signals, 118 and 120, and the time period of the final enable signal 305 going to the single-ended charge pump 188 does not fall out of the time period window of the final polarity signal 307 going to the single-ended charge pump 188, then the operation of the BPFD will be accurate and free from the jittering problem.

It is clear from the FIGS. 14 and 17 that the time period of the arrival-time difference signal (enable signal 190) at the output of the Exclusive-OR logic gates, 210 and 224, is always narrower than the time period of the polarity signal 192 from the output of flip-flops, 122 and 218. The time period of the flip-flop output polarity signal 192 is always wider due to the propagation delay of the flip-flop and Exclusive-OR gate. The output at the flip-flop occurs earlier than the enable signal 190 by the amount of the propagation delay of the Exclusive-OR gate; the output of the flip-flop also lasts longer than the enable signal 190 by the amount of propagation delay of the flip-flop from the reset input. As a result, it is very easy for the enable signal 190 to fall within the time period window of the polarity signal 192. Since the polarity signal 192 from the output of the flip-flop, 122 and 218, of each PFD carries the information of the arrival-time difference between the two input signals plus the propagation delay of the reset path of the flip-flop while the enable signal 190 only carries the information of arrival-time difference so that the time period of the polarity signal 192 will always be much longer than the enable signal 190. Since the polarity signal 192 always has a much wider time period than the enable signal 190, the final polarity signal 307 will also always have a much wider time period than the final enable signal 305 and the charge pump 188 will be very forgiving to the mismatch of the propagation paths between the signal paths of the final polarity signal 307 and final enable signal 305. As long as the mismatch does not cause the final enable signal 305 to fall out of the time period window of the final polarity signal 307 at the input of the single-ended charge pump, there will be no erroneous output and the BPFD will be jitter free.

In the FIG. 19, as described before, the BPFD 330 is made of a basic PFD 280 which includes the flip-flops 122 and 124 and an AND logic gate 126 and a complementary PFD 282 which includes the flip-flops with inverted output 220 and 218 and an AND logic gate with inverting inputs 222. A tri-state output driver is used as the single-ended charge pump 188.

In this design, the final polarity signal 307 to the single-ended charge pump 188 is determined by the polarity selection circuit 284 made of an AND logic gate 234 and an OR logic gate 236. The outputs from these two logic gates are then combined by an OR logic gate 238 to become the final polarity selection signal 307.

When the reference signal 118 is leading, the polarity signal from the output of the reference F/F 122 will turn both the AND 234 and OR 238 logic gates of the polarity selection circuit 284 into the H state. When the VCO signal 120 is leading, the polarity signal from the output of VCO F/F 218 will turn both the OR logic gates 236 and 238 of the polarity selection circuit 284 into L state.

The feedback arrangement from the output of the AND logic gate 234 to the input of the OR logic gate 236 can lock in the polarity selection output to the H state when the reference signal 118 arrives first. The feedback signal blocks the late arrival VCO signal 120 to prevent it from switching the outputs of the OR logic gate 236, AND logic gate 234 and OR logic gate 238 after they are already turned to the H state by the leading reference signal 118.

The feedback arrangement from the output of OR logic gate 236 to the input of AND logic gate 234 can lock in the polarity selection to the L state when the VCO signal 120 arrives first. The feedback signal blocks the late arrival reference signal 118 to prevent it from switching the outputs of the OR logic gates 236 and 238 and AND logic gate 234 after they are already turned to the L state by the leading VCO signal 120.

Since it takes time, which is equal to precisely a propagation delay time of a single logic gate, for the feedback signal to travel from the input of the OR logic gate 236 to the input of the AND logic gate 234, the feedback signal may not be ready to block the late arrival reference signal 118 to prevent it from switching the output of the AND logic gate 234 into the H state when the arrival-time difference between the two input signals is smaller than the propagation delay time of a single logic gate. This can be a problem when the VCO signal 120 arrives first and the final polarity selection output 307 at the output of OR logic gate 238 is already in the L state and the late arrival reference signal is still able to turn the final polarity selection output 307 into the H state. This won't be a problem when the reference signal 118 arrives first and the final polarity selection output 307 is already in the H state because even if the late arrival VCO signal 120 turns the output of OR logic gate 236 into the L state, it won't be able to turn the final polarity output 307 at the output of OR logic gate 238 into the L state due to the nature of the OR gate.

As a result, the late arrival reference signal 118 can still turn the final polarity selection output 307 to the H state after the signal from VCO 120 has turned the polarity selection output 307 to the L state when the arrival-time difference is less than the propagation time of a single logic gate delay, however, the erroneous H state is very short-lived due to the feedback arrangement. As soon as the output of AND logic gate 234 finally becomes the L state after a propagation delay time, the output of the OR logic gate 238 will also return to the correct L state shortly after. Since the erroneous H state can pass through the feedback arrangement from the output of AND logic gate 234 back to turn the OR logic gate 236 into the erroneous H state again, the final polarity selection output 307 will then bounce back and forth between the H state and L state during the entire period of the polarity signal.

The final polarity selection output 307 will be H when the reference signal 118 is ahead but when the VCO signal 120 is ahead, the final polarity selection output 307 will be L for sure only when the VCO signal 120 is ahead of the reference signal 118 by at least a propagation delay time of a single logic gate. The decision of the polarity selection circuit 284 with an OR gate 238 favors the reference signal 118 due to the nature of the OR gate. As a result, the center of the decision threshold is not at the zero arrival-time difference point 178 any more and is shifted slightly toward the negative side by the amount of half of the propagation delay time of a single logic gate assuming all the propagation paths are well matched from the signal inputs at the flip-flops to the inputs of OR logic gate 238. When the signal from VCO 120 is leading and the arrival-time difference is within the propagation delay time of a single logic gate, as was explained in the above, the decision output at the output of OR logic gate 238 can bounce between H and L for the whole polarity signal. Since the rate of bouncing is faster than the maximum operating frequency of the logic gate, the bouncing will not be able to sustain or even get started if the duty cycle of the bouncing signal is high or low. In other words, the bouncing won't happen when the signal from VCO 120 is leading and arrival-time difference is close to zero or close to the propagation delay time of a single logic gate. When the signal from VCO 120 is leading and arrival-time difference is close to zero, the final polarity selection 307 will stay at H state for a much longer period than the L state and the L state will last for a period much shorter than the propagation delay of a single logic gate so that it will not have a chance to go through the gates and the final polarity selection output 307 will simply remain at the H state and the bouncing won't happen. When the signal from VCO is leading and the arrival-time difference is close to the propagation delay of a single logic gate, the final polarity signal output 307 will stay at L state for a much longer period than the H state and the H state will last for a period much shorter than the propagation delay of a single logic gate so that it will not have a chance to go through the gates and the final polarity selection output 307 will stay at the L state and the bouncing won't happen, neither. The bouncing could probably be sustained only when the duty cycle is close to 50%. This makes perfect sense since the 50% point is also the crossing point of decision so that the decision circuit at the output of OR logic gate 238 does not know what to do so that the decision output bounces back and forth. As a result, the decision of the polarity selection is always accurate, precise with very little ambiguity.

Once the polarity is determined by the polarity selection circuit 284, the output from the polarity selection circuit is sent to the enable signal selection circuit 286 which includes the AND logic gate with an inverting input 240 and an AND logic gate 242 and the OR logic gate 244 to select the desired final enable signal 305 from the outputs of Exclusive-OR gates, 210 and 224, for the single-ended charge pump 188. As a result, the output from the charge pump 188 is always accurate without glitch and the BPFD 330 is jitter free and can stay in the zero arrival-time difference point indefinitely. Since the time period of the final enable signal 305 to the charge pump 188 is exactly the same as the arrival-time difference between the two input signals which can vary between 0 to infinity, the dead zone is inevitable as explained earlier, so that the transfer characteristic of the BPFD 330 will be as exactly shown in FIG. 7 that contains four distinct stable output states, the Positive High state 174, the Negative High state 176, the linear state 173 and the dead-zone OFF state 175.

As explained earlier, the center of decision threshold of the BPFD 330 is shifted to the left by the amount of half of the propagation delay of a single logic gate and the shift is caused by the nature of the OR gate 238 since it favors the H input so that it favors the signal from the reference input. If we replace the OR logic gate 238 with an AND logic gate, which favors the L input, then the center of the decision will be shifted to the right by the same amount instead. In both cases, the decision is accurate and precise within a propagation delay of a single logic gate. And the decision can bounce only when the difference of arrival-time is within a propagation delay of a single logic gate. We can even simply not to use either the OR gate 238 or the AND gate and use either the output from AND logic gate 234 or OR logic gate 236 as the final polarity output 307; however, using either of the polarity output from the AND logic gate 234 or OR logic gate 236 directly as the final polarity output 307 will double the range of uncertainty for the decision circuit and the decision output can bounce when the difference of arrival-time is with in +/−(propagation delay of a single logic gate) and the center of the decision is now at the zero arrival-time difference point 178.

It is very critical to make sure that both the basic PFD 280 and the complementary PFD 282 of the BPFD are balanced so that the propagation delay of each PFD is equal. A mismatch in delay time can have a large impact on the performance of BPFD 330. But, unfortunately, it is very difficult to maintain equal propagation delay time for all the paths. Since the loading of the flip-flops of each PFD is different, the speed of each flip-flop might not be the same. It is a very likely scenario that all four flip-flops in the BPFD have different propagation delay in the end. As a result, the time period of the arrival-time difference signal at the output of Exclusive-OR gate 210 of the basic PFD 280 can be very different from the time period of the arrival-time difference signal at the output of Exclusive-OR gate 224 of complementary PFD 282. Since the arrival-time difference signal from the Exclusive-OR gates, 210 and 224, becomes the final enable signal 305 for the single-ended charge pump 188 in this design, and the time period of final enable signal 305 determines how much time to enable the charging or discharging to the capacitor 184 of the low pass filter circuit, the time period of the enable signal 305 will affect the output voltage and the gain of BPFD directly. Since it is impossible to guarantee the arrival-time difference will be always identical for the basic PDF 280 and the complementary PFD 282, the gain of the BPFD 330 will thus be different between when the VCO signal 120 is leading and when the reference signal 118 is leading. As a result, there could be two natural frequencies for the BPFD 330, one is contributed by the basic PFD 280 and the other one is contributed by complementary PFD 282. The result of two natural frequencies is not unique to the BPFD 330, it happens to the current PFD 336, too, if the flip-flops, 122 and 124, are not well-balanced; however, in the current PFD 336, it is not difficult to balance the two flip-flops, 122 and 124; as a result, the two natural frequencies are usually very close to each other and are difficult to be identified separately. In the BPFD 330, there are four flip-flops with different loadings need to be balanced so that the balancing is much more difficult. We can check the balancing of flip-flops in a BPFD 330 by simply measuring the natural frequencies of the PLL. If the flip-flops and signal paths of BPFD 330 are well balanced, then the two natural frequencies will be very close to each other and are difficult to be identified separately.

The natural frequency for a BPFD 330 can be measured as follows. Assuming the phase noise of the reference signal 118 is way below the phase noise from the VCO 116 so that the VCO 116 will dominate the phase noise for the PLL 100; since the PLL 100 is actually working like a low-pass filter for the reference signal, the VCO 116 will track the frequency movement of the reference signal 118 when the reference signal 118 is frequency modulated by a low frequency audio signal that is within the bandwidth of the PLL 100. When the frequency of the modulating audio signal is above the bandwidth of the PLL 100, the VCO 116 then will not be able to track the frequency movement of the reference signal 118 any more. So we can measure the natural frequency and the frequency response of the PLL 100 by observing how the VCO 116 tracks the frequency deviation of the reference input signal 118.

To do that, first we need to measure the residual FM of the VCO 116 when the reference signal 118 is not modulated. The residual FM indicates the noise floor level of the VCO 116. We then modulate the reference signal 118 in frequency with a low frequency audio signal within the bandwidth of the PLL 100 and start to increase the frequency deviation of the reference signal 118 until the deviation of the VCO is twice the amount of the residual FM of the VCO 116. This low frequency audio modulating signal is our test signal. The purpose to use a small FM deviation on the reference signal 118 is that the gain of the BPFD 330 is not a constant and depends upon how far the output of the BPFD 330 deviates from the DC bias voltage of the BPFD 330 at zero arrival-time difference point 178; and we can't measure the frequency response of the BPFD 330 directly because it is determined by the phase noise which is usually very small in amplitude and spreads over a large bandwidth. We can only measure the frequency response of the BPFD 330 indirectly by adding a small known test signal so that the test signal is small enough not to affect the gain of the BPFD 330 too much but is still large enough above the noise floor to be observed. The smaller the test signal, the easier it is to observe the twin natural frequencies effect. Since the mismatch between the two enable signals is usually very small for a well-balanced BPFD 330, assuming the mismatch is only 0.1 nsec and if the test signal and noise are small and the enable signal lasts only 0.2 nsec for one of the PFD and 0.1 nsec for the other, then the gain mismatch between the two PFD will be 100%. As a result, the higher one of the natural frequency will be located at 1.4 times the frequency of the lower one. If we use a larger test signal that causes a larger frequency deviation on the reference signal 118 and assume the enable signal now lasts as long as 1 nsec for one of the PFD and 1.1 nsec for the other, then the gain mismatch is very little and the twin natural frequencies effect will be difficult to observe. It is thus important to set the level of the test signal as low as possible.

The twin natural frequencies effect does not normally occur to a current PFD 336 that uses extra delay in the reset path to stay away from the zero arrival-time difference point 178. One reason is, as explained before, that the matching of flip-flops is usually good, the other reason is that since the two input signals will always arrive at the decision circuit with a slight timing offset so that the charge pumps, 194 and 196, are always actively pumping out and sinking in almost equal amount of currents for almost every comparison cycle. Because the amplitudes of the up and down spikes of the current PFD 336 are mostly equal, the gain of the current PFD 336 is thus a constant and the two natural frequencies will be so close to one another and they simply become only one natural frequency. (The amplitude of the up and down spikes IS the gain of the PFD.) Only when the amplitudes of the up and down spikes are very different, for example, when the output of the charge pump is biased near the Vcc or 0 ground voltage, then the current PFD 336 will exhibit the same twin natural frequencies effect as the BPFD 330. Since it is abnormal to bias the current PFD 336 at these extremes, nobody has paid attention to this twin natural frequencies effect. This is why the twin natural frequencies effect has never been reported before and no engineer has ever doubted the definition for the gain of the PFD for so long. The gain of the current PFD 336 is a constant which is determined by the size of the up and down spikes at the charge pump output and which is also usually very close to Vcc/(4π). The glitch has made the PFD to work very close to what the existing theory predicted but it is simply a coincident. The glitch of the current PFD 336 has simply covered up the real nature of the PFD.

Although the twin natural frequencies effect does not cause any problem when the PLL 100 is used to generate a stable frequency, it can distort the baseband signal when the PLL 100 is used as a modulator or demodulator in analog applications. This problem occurs because the gain of the BPFD (or the time period of the final enable signal 305) is different between when the reference signal 118 is leading and when the VCO signal 120 is leading. For example, when the PLL is used as an FM modulator and when a baseband signal with equal positive amplitude and negative amplitude is modulating the VCO tuning voltage, the BPFD with twin natural frequencies will respond differently to the positive baseband signal and the negative baseband signal. As a result, the reference signal 118 will lead the signal from VCO 120 by an arrival-time difference that is different from the arrival-time difference when the VCO signal 120 leads the reference signal 118 even though the baseband input signals, that generate the arrival-time differences for the two input signals 118 and 120, have equal amount of positive and negative amplitude. In other words, the positive baseband signal causes a different frequency deviation with the negative baseband signal so that the modulated signal is distorted. To overcome this problem, in theory, an AND logic gate or an OR logic gate can be used to combine the arrival-time difference signals from both of the outputs of Exclusive-OR gates 210 and 224, instead of using the enable signal selection circuit 286, to generate the final enable signal 305 for the charge pump 188 so that the resulting final enable signal 305 will always have the same time period as long as the arrival-time difference is equal regardless of which signal is ahead. Or simply using only either one of the arrival-time difference signal from the output of Exclusive-OR gates, 210 or 224, will also suffice. Although the time period of the final enable signal 305 will not be as precise, these alternative methods of generating the final enable signal 305 will reduce the distortion when a BPFD is used for analog applications. As always, the delay time between the final enable signal 305 and the final polarity input signal 307 at the inputs of single-ended charge pump 188 must be controlled to ensure that the whole time period of final enable signal 305 can still fall within the time period window of the final polarity selection signal 307 with plenty of safe margin.

The mismatching of the propagation delay time among the flip-flops can have a very profound impact on the operation of the BPFD. For example, assuming that both the VCO flip-flops 124 and 218 of the BPFD 330 in FIG. 19 are faster than the reference flip-flops 122 and 220, the VCO flip-flops will have a shorter propagation delay than the reference flip-flops. The result of this mismatch is as shown in FIG. 20. In this figure, assuming that the propagation delay of the reference flip-flop is $T_R$ 246 and the propagation delay of the VCO flip-flop is $T_V$ 248 and the reference signal 118 is ahead of the VCO signal by the amount of T 250. Unfortunately, the time period of the arrival-time difference signal will be reduce to $T-(T_R-T_V)$ 252 when the reference signal 118 is leading. On the other hand, when the VCO signal 120 is leading by the same amount of time T 250, the time period of the arrival-time difference signal will be increased to $T+(T_R-T_V)$ 254. As a result, the VCO 116 of the PLL 100 using this BPFD 330 will have no trouble to track the reference signal 118 when the reference signal 118 is stepping down in frequency. The BPFD 330 has a lot of gain when the signal from VCO 116 is leading but the VCO 116 of the PLL 100 might have a trouble to track the reference signal 118 when the reference signal 118 is stepping up in frequency. The BPFD 330 loses a lot of gain in this direction and the gain could even vanish totally so that the VCO 116 might have a problem to track the reference signal 118 when the reference signal 118 is stepping up in frequency, especially when the frequency is near the maximum operating frequency.

The mismatching of propagation delay affects not only the tracking capability but also the maximum operating frequency. Assuming that the amount of mismatch of propagation delay between the flip-flops $T_R-T_V$ shown in FIG. 20 is equal to the propagation delay time of a single logic gate and the maximum operating frequency of a perfectly matched BPFD is 1/(10× single logic gate delay), then the basic PFD 280 part of this BPFD 330 with mismatching of a propagation delay time of a single logic gate will have a slower operating frequency of 1/(11× single logic gate delay) while the complementary PFD 282 part of the same BPFD 330 will have a faster operating frequency of 1/(9× single logic gate delay). Since the operating speed of the BPFD 330 is the slower of the two, the mismatching can severely reduce the operating speed.

Unlike the double-ended charge pump output, the matching of charging and discharging current is not as critical for the single-ended charge pump output. Nevertheless, the charging and discharging current can not be different by too much. A mismatch of charging and discharging current can still distort the linearity of the BPFD 330. Since the VCO 116 usually needs to be tuned over a large voltage range, the voltage on the low pass filter 186 will also vary over a large voltage range if it is driving the VCO 116 directly. The large tuning voltage range on the low pass filter will, unfortunately, affect the amount of charging and discharging current from the voltage charge pump. As shown in FIG. 9, for a single-ended voltage charge pump 188 driving a simple RC low pass filter, the output current from the charge pump output will be equal to $(V_{cc}-V_{LPF})/R$ when the charge pump 188 is pumping current out to the low pass filter and equal to $(0-V_{LPF})/R$ when the charge pump 188 is sinking in current from the low pass filter. It is thus clear that the $V_{LPF}$ must be biased at a constant Vcc/2 in order to maintain the same amount of charging and discharging currents at all time.

In order to reduce the mismatch of the charging and discharging current, an OPAMP 256 configured as a non-inverting DC amplifier shown in FIG. 21 comprising of an OPAMP 256, feedback resistor R2 258 and gain setting resistor R3 260 and a bias voltage of Vcc/2 138, is used to provide a fixed bias for the charge pump 188 and some voltage gain for the voltage difference between the bias voltage 138 and the voltage on the low pass filter 186. Assuming the VCO tuning range is Vtune 264, since the OPAMP 256 provides a DC gain of A 262, the voltage variation at $V_{LPF}$ will be reduced to Vtune/A so that the mismatch of charging and discharging current is thus greatly reduced by a factor of the voltage gain of the OPAMP 256.

It is even possible to replace the feedback resistor 258 in FIG. 21 with a capacitor 265 and to use the OPAMP 256 as an active integrator with an infinite DC gain, as shown in FIG. 22, so that there will be no voltage variation at $V_{LPF}$ 186 at all and the charging and discharging current will always be the same throughout the whole VCO tuning range. The use of OPAMP 256 to bias the charge pump output of BPFD 330 will affect both the gain and the frequency response of the loop. Unfortunately, it will make the calculation for the PLL 100 much more complicated. The OPAMP 256 will make the charge pump output of BPFD 330 staying at the ideal bias point 138 all the time during the acquisition and lock period. As a result, the performance of the PLL 100 is always at its best. Without the OPAMP 256, the bias of the charge pump output of BPFD 330 can change as much as the VCO tuning voltage and the BPFD can be trapped at the point that produce no gain at all during the acquisition period. For example, when the VCO 116 is slammed to be near the Vcc during the acquisition period, the gain of the BPFD 330 will then become −Vcc to almost zero when the OPAMP 256 is not used. At this point, the BPFD 330 will not have the strength to speed up the VCO 116 if it has to. As a result, the acquisition performance of the PLL 100 will degrade and even deteriorate to a point that it won't be able to go into the locked condition.

The performance of the BPFD totally depends upon the matching of the flip-flops and the charge pump output 188. The charge pump 188 must pump out current and suck in current with the same slew rate even when operated at the maximum operating frequency. Unequal slew rate will affect the gain of the BPFD and the performance of BPFD can be degraded significantly just like the problem caused by unbalanced flip-flops.

Theoretical Analysis

The basic PLL 100 as shown is FIG. 1 can be analyzed as follows.

Suppose a simple RC low pas filter is used as the loop filter with a transfer function H(s), $$H(s) = \frac{1}{1+RCS} \qquad \text{equ. 1}$$

The open loop gain of the PLL 100 is defined as $$G(s)H(s) = \frac{K_{VCO}}{S} * K_d * \frac{1}{1+RCS} \qquad \text{equ. 2}$$

Where the $K_{VCO}$ is the VCO sensitivity and $K_d$ is the gain of the phase detector. So that the characteristic equation of the loop is:

$$S*(1+RCS)+K_{VCO}*K_d=0 \qquad \text{equ. 3}$$

Comparing with a standard 2nd order equation, $$S^2+2\zeta\omega_n S+\omega_n^2=0 \qquad \text{equ. 4}$$

We know that $$\omega_n^2 = K_{VCO}*K_d/(RC) \qquad \text{equ. 5}$$

And the damping factor $\zeta$ is $$\zeta=1/(2*\omega_n*RC) \qquad \text{equ. 6}$$

Since the $K_{VCO}$ has the unit of rad/(sec*Volt) and RC time constant has the unit of sec/rad and the $K_d$ has the unit of Volt, we conclude that the equation 5 is accurate and all the units are correct. So we can calculate the natural frequency of the PLL precisely with this equation. In all the books about PLL, the gain of the phase detector is defined to have a unit as Volt/rad, as a result, the equation 5 will not work at all. All the authors of these books have to argue that 1/sec=rad/sec in order to convince themselves and everybody else that their formula works. It is simply false. 1/sec is just not the same as rad/sec. One is used to measure how many cycles have passed in a second and the other is to measure how many phase angles has passed in a second. These two units are used to describe the same oscillatory motion but with a very different prospect.

The phase detector's gain simply should have the unit of Volt as we described before and it is proved again here in the theoretical calculation. The correct way to describe a PLL should then be shown as in FIG. 23 comprising of an arrival-time detector 266, a loop filter 114 and a VCO 116, and as a feedback loop with an arrival-time detector which detects the arrival-time difference 268 between the two input signals. The output of the arrival-time detector 266 is a voltage which is a function of the amplitude, frequency and phase of the input signals.

This phase detector definition problem started long before the PFD was developed. The old analog PLL had exactly the same problem. The phase detector used in the analog PLL is a multiplier that produces the multiplication product of two input signals. The result of the multiplication is a voltage that is the function of the amplitude, frequency and phase of input signals, and should carry the Volt as the unit, instead of the Volt/rad, just like the PFD. The problem of the analog PLL is actually easier to see. For example, for an analog PLL using a mixer as the phase detector as shown in FIG. 24. Suppose the two signals are $V_{ref}*SIN(\omega_1 t+\theta_1)$ 270 and $V_{vco}*COS(\omega_2 t+\theta_2)$ 272 and the mixer's gain is $K_m$ 274, then the output of the mixer will be $\frac{1}{2}*K_m*V_{ref}*Vvco*[SIN((\omega_1+\omega_2)t+\theta_1+\theta_2)+SIN((\omega_1-\omega_2)t+\theta_1-\theta_2)]$ 276. Since the first SIN term will be filtered out by the loop filter so that the second SIN term will be the only signal reaches the VCO. So that the mixer's output can be simplified to:

$$K_d = \frac{1}{2}*K_m*V_{ref}*V_{vco}*SIN((\omega_1-\omega_2)t+\theta_1-\theta_2) \quad \text{equ. 7}$$

And both $K_d$, the phase detector output and $\frac{1}{2}*K_m*V_{ref}*V_{vco}$ which is defined as the gain of the phase detector has the unit of Volts while the last term $SIN((\omega_1-\omega_2)t+\theta_1-\theta_2)$ is a constant and is dimensionless. In the traditional analysis, the frequency $\omega_1$ and $\omega_2$ are assumed to be equal when the loop is in locked condition so that the equation 7 can be further simplified to $$K_d = \frac{1}{2}*K_m*V_{ref}*V_{vco}*SIN(\theta_1-\theta_2) \quad \text{equ. 8}$$

And when the loop is locked so that the phase error is small, the equation 8 can be simplified even further to $$K_d = \frac{1}{2}*K_m*V_{ref}*V_{vco}*(\theta_1-\theta_2) \quad \text{equ. 9}$$

The above equation 9 is a result of many steps of simplification and since θ1−θ2 is the phase error and has the unit of radiant so that in order for the $K_d$ to still carry the unit of Volts, the gain of the phase detector must now carry the unit of Volt/rad even though it was defined as Volt in the beginning. It is thus clear that in order to force the concept of the "phase detector" to be accepted, the phase detector's gain is forced to carry the unit of Volt/rad despite the fact that it actually has nothing to do with the phase of the signal.

Equation 7 truly describes the multiplication operation of the mixer and its output is the function of the amplitude, frequency and phase of the input signal so that the mixer is truly an arrival-time detector instead of a phase detector, just like the PFD. When the analog PLL was first developed eighty years ago, it was used in the radio communications. In this application, an Automatic Gain Control (AGC) circuit and an Automatic Frequency Control (AFC) circuit were also used to regulate the amplitude and frequency of the signal. Only when both the amplitude and frequency of the signal were regulated, then the analog PLL had a chance to lock in the phase. Since both the AGC and AFC were a feedback control loop with a narrow bandwidth, they were unable to prevent the high frequency amplitude noises and frequency noises from reaching the analog PLL circuit. And once the high frequency amplitude noises and frequency noises reached the analog PLL, they all became the phase noise because the mixer of the analog PLL was unable to identify the source of the noises. All the amplitude and frequency noises looked the same as the phase noises to the mixer. This is exactly what the equation 7 is telling us.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

ALTERNATIVE EMBODIMENT

The BPFD with a dead-zone in the preferred embodiment 330 typically has a dead-time $T_{dead}$ 179 which is about ⅓ of the slew time 168. The dead-zone 175 is, however, an undesired state since the BPFD is dead without gain when the BPFD is operating within the dead-zone. Although operating the BPFD in the dead zone yields the best noise performance, as we can see from the equation 5, the natural frequency of the PLL will be zero when the gain of the BPFD is zero so that the PLL will not be very responsive to outside disturbance since there is no working loop gain to maintain the loop while the BPFD is in the dead-zone. As explained earlier, the dead-zone 175 is caused by the slew rate limitation of the logic device and the input threshold of the logic gates. When the arrival-time difference is smaller than the time it takes the output of the OR logic gate 244 to rise above the input threshold of the charge pump 188, there will be no output from the charge pump 188 and the charge pump 188 will be dead. In the preferred embodiment 330, the time period of the final enable signal 305 is exactly equal to the difference of arrival-time between the two input signals which can vary from 0 to infinity. As a result, the dead-zone 175 is inevitable. In order to minimize the dead-zone 175, we need to increase the time period of the final enable signal 305 so that it will have a minimum time period needed to overcome the input threshold of the single-ended charge pump 188 and all the other logic gates.

With the increase of minimum time period to the final enable signal 305, the dead-zone 175 and even the entire linear state 173 can be eliminated completely as in the second embodiment 334 shown in FIG. 25. In this second embodiment 334, since the polarity output of flip-flop 122 of the PFD 280 carries the arrival-time difference information between the two input signals plus four times the propagation delay of a single logic gate due to the reset path of the flip-flop, the polarity output signal 192 can also be used as the enable signal for the charge pump. If we use the polarity output signal 192 from the flip-flop 122 also as the enable signal, we are basically adding four times the propagation delay time of the single logic gate to the desired arrival-time difference signal between the two input signals. As a result, the minimum time period of the final enable signal 305 is now four times the propagation delay of a single logic gate which is more than a propagation delay time of a single logic gate that is typically needed to overcome the input threshold of the logic gates and which is also longer than the typical slew time 168 of the charge pump 188. The typical slew time 168 of the charge pump 188 is about three times the propagation delay of a single logic gate. Since the slew time 168 of the charge pump 188 and input threshold of the logic gates can vary greatly according to the design of the logic gate, if the minimum time period of four times the propagation delay of a single logic gate is not enough to overcome the slew time 168, the polarity output signal 192 from flip-flop 122 should then be stretched to whatever length is needed. Since the polarity output signal 192 has a minimum time period of four times the propagation delay of a single logic gate, it will be very easy to stretch for more, if needed. As a result, the transfer characteristics of the BPFD in the second embodiment 334 have only two stable output states, the Positive High state 174 and the Negative High state 176 as shown in FIG. 26 and this BPFD 334 without a dead-zone 175 and without the linear state 173 has become a perfect arrival-time detector. The center of the decision threshold of the BPFD 334 in the second embodiment is shifted to the left side by the amount of (single logic gate delay time)/2 332 as explained earlier if the propagation delay of all the signal paths and flip-flops are matched perfectly. Since there is no dead-zone 175 and no linear state 173, this BPFD 334 in the second embodiment will always send out large correction pulses to the loop filter 114 all the time so that the phase noise of the VCO 116 could be increased and the average clock jitter could be higher, fortunately, since the BPFD 334 has s lot more gain so that a loop filter with a larger time constant can now be used to reduce the noises from the charge pump output. As a result, phase noise caused by the BPFD 334 in the second embodiment can have the same phase noise performance as the BPFD 330 in the preferred embodiment and the design of the second embodiment is a perfect design for the phase-frequency-arrival-time detector. The gain of the perfect arrival-time detector 334 is +/−Vcc/2 while the gain for the current PFD 336 is only +/−Vcc/(4*π) which is only 1/(2*π) of the gain of the perfect arrival-time detector 334. The BPFD 334 in the second embodiment as a perfect arrival-time detector thus offers a lot of more gain for the PLL so that the PLL will simply perform better in every respect.

Since the polarity signal output 192 will be used as both the enable signal and the polarity signal so that the flip-flop 122 will have a lot more loading than flip-flop 124, as a result, it will be very difficult to balance the flip-flop 122 and 124. A solution for the balancing problem as shown in FIG. 25 is to use the polarity signal output 192 from the output of reference flip-flop 122 only for driving the polarity selection circuit 284 while the complementary reference flip-flop output 220 is used for the enable selection circuit 286. Since both the reference flip-flop 122 and complementary reference flip-flop 220 carry the same information with opposite polarity, the loading problem is solved and the flip-flops can be balanced easily. Since the enable signal now has a minimum time period of four times the propagation delay of a single logic gate, a slight mismatch in the propagation paths between the final polarity signal 307 and final enable signal 305 will not affect the accuracy of the output and the charge pump 188 is very forgiving to slight mismatching between the two input signals. The complementary PFD 282 part of the BPFD 334 will simply mirror the basic PFD 280.

An OR logic gate 244 and two AND logic gate with an inverting input, 240 and 243, are used as the enable signal selection circuit 286 for the design in the second embodiment. This design for the enable signal selection is quite simple, we simply use the same polarity signal from the flip-flops as the enable signal so that the enable signal will be always equal to the polarity signal. We don't need to worry about the slight timing mismatch between the two signal since the there is a minimum time period of four times the propagation delay of a single logic gate with both signals already.

The final enable signal 305 of the BPFD 334 now has a minimum time period of four times the propagation delay of a single logic gate; as a result, the linear state 173 and the OFF state (dead zone 175) of the BPFD output are completely eliminated. However, without the linear state 173, the phase noise will inevitably always be higher unless a loop filter with a larger time constant is used. It is desirable in some applications, such as the PC clock, to use an enable signal with just enough amount of minimum time period to overcome the input threshold of the logic gates so that the dead-zone 175 is completely eliminated while the linear state 173 is still intact and the transfer characteristics of BPFD with this design will have only three stable output states, the Positive High state 174, the Negative High state 176 and the Linear state 173 as shown in FIG. 27. The BPFD with only three stable output states, which is the third embodiment 338 as shown in FIG. 28, becomes a PFD without a dead-zone and offers both adequate phase noise and phase jitter at the same time and is ideal for the PC clock application since the gain of the BPFD is lower when the PLL is locked so that a loop filter with a small time constant will suffice and the filter can be fabricated inside the IC easily.

To implement the third embodiment 338, we will need to stretch the arrival-time difference signal 190 to become the desired enable signal by adding a small amount of time period to overcome the input threshold of logic devices; however, it is very difficult to stretch a small amount of time period for the arrival-time difference signal 190 since the time period of arrival-time difference signal can vary from 0 to infinity. It will be easier to obtain the desired time period for the enable signal by reducing the time period of the polarity signal 192 with the enable signal width reducing circuit as shown in FIG. 29. With the enable signal width reducing circuits, 316 and 317, the time period of the final enable signal 305 is reduced by the amount of two times the propagation delay of a single gate due to the inverters 318 and 320. The two capacitors 324 and 326 will reduce the time period of the final enable signal 305 even more and the capacitance of these two capacitors will need to be adjusted according to whatever is needed. It might take some iteration to find the optimal value for the capacitance. Two inverters 346 and 348 are needed for the polarity signal to ensure that the final polarity signal 307 has a time period window with enough safe margins for the final enable signal 305 to fall in without error. Although it is not impossible, it is quite difficult in practice to completely eliminate the dead-zone 175 without losing the linear state 173.

There is also another way to build a perfect arrival-time detector as the second embodiment 334. This new design is shown in FIG. 30 as the fourth embodiment 340. In this design, the same polarity selection circuit 284 used in all the previous embodiments is used to determine which signal has arrived first, however, the OR logic gate 238 is no longer needed for this design since the final polarity signal 307 fed to the single-ended charge pump 188 is not coming from the polarity determining flip-flops 122 and 218 of the PFDs. Instead, we will only use the accurate polarity signal output selected from the outputs of polarity determining flip-flops, 122 and 218, as a switch control signal for the polarity signal switch to select either one of the output from the non-polarity determining flip-flops, 220 and 124, of the PFDs and to feed the selected signal from the polarity signal switch as the final polarity selection signal 307 for the single-ended charge pump 188. The polarity signal switch is made of the AND gate 350, an AND gate with inverting inputs 352 and a NOR gate 354. The OR gate 360 and OR gate with inverting inputs 362 are used to generate the enable signal.

In this design, the polarity output from each PFD to be sent to the charge pump 188 is taken from the non-polarity determining flip-flops, 124 and 220, that usually don't carry the arrival-time difference information and do generate erroneous glitches, instead of from the polarity determining ones, 122 and 218, that carry the arrival-time difference information and produce accurate polarity output, although we still need these accurate polarity output signals from the polarity determining flip-flops, 122 and 218, to generate an accurate switching control signal. For the basic PFD 280, the polarity output is now taken from the VCO flip-flop 124 while for the complementary PFD 282, the polarity output is taken from the reference flip-flop 220. We also need to use the same circuit of enable signal width reducer, 316 and 317, to reduce the time period of the erroneous polarity output from the non-polarity determining flip-flops, 124 and 220, to control the size of the glitch. The transfer characteristic for a BPFD using the erroneous non-polarity determining flip-flop outputs from each PFD is as shown in the FIG. 31. This transfer characteristic as shown in FIG. 31 is simply terrible since there are two stable operating points, $t_{error}$ 208 and $-t_{error}$ 209 so that the BPFD can jump back and forth between these two stable operating points and causing significant jitters for the VCO 116. Nevertheless, if we add a minimum time period, which is longer than the sum of slew time 168 and $t_{error}$ 208, to the final enable signal 305, we can eliminate the unstable state and the linear state altogether and the BPFD will have only two stable operating states just like the design of the second embodiment 334. So, the design to use both the accurate polarity determining flip-flop outputs from the PFDs as in the second embodiment 334 and to use both of the erroneous non-polarity determining flip-flop outputs from the PFDs as in the fourth embodiment 340 can achieve the same result but it will be easier to do by using the outputs from accurate polarity determining flop-flop as in the second embodiment 334, besides, the glitches in the BPFD 340 of the fourth embodiment will generate more phase noise than the BPFD 334 of the second embodiment As a result, the second embodiment 334 is the more desirable phase-frequency-arrival-time detector for the phase locked loop.

If we look into the FIG. 31 of the transfer characteristics for the BPFD using the polarity output from the erroneous non-polarity determining flip-flops, it looks like we should be able to bring the two stable operating points, $t_{error}$ 208 and 209, together by adding a small minimum time period to the final enable signal 305 so that the resulting transfer characteristics have the exact same shape as the ideal PFD as shown in FIG. 6. However, since there are actually two glitches with the same amplitude but in opposite polarity occurring at each of the two stable operating points, 208 and 209, the gain of the BPFD will not be zero at these points even if the two stable operating points are brought together perfectly so that the final transfer characteristics will actually be close to FIG. 27 instead of FIG. 6 even if the two stable operating points are merged together precisely by adding a small minimum time period to the final enable signal 305. Although the use of erroneous non-polarity determining flip-flop outputs can produce similar results as the designs to use the outputs from the accurate polarity determining flip-flops, the results are usually inferior due to the glitches.

FIG. 32 shows a BPFD with no dead-zone and no linear state as an arrival-time detector as the fifth embodiment 364. This design contains only the minimum components that are needed to produce a BPFD without a dead-zone and linear state. The polarity decision circuit 284 only includes an OR gate 236 and an AND gate 234 so that the center of the decision threshold is the zero arrival-time difference point 178 and the decision can bounce when the arrival-time difference is within +/−(a single logic gate delay) as explained earlier. The enable selection circuit only includes an OR gate with an inverting input 366. The OR gate with an inverting input 366 will stretch the final enable signal by adding four times the propagation delay of a single logic gate to the arrival-time difference signal so that the dead-zone as well as the linear state are completely eliminated. The OR gate with an inverting input 366 can also be replaced with an Exclusive-NOR gate. If an Exclusive-NOR gate is used to replace the OR gate with inverting input 366, then the BPFD will produce a dead-zone and also the linear state.

FIG. 33 shows a BPFD with a dead-zone as the sixth embodiment 372. This design contains only the minimum of components that are needed to produce a BPFD with a dead-zone. Since a single OR logic gate 368 is used as the polarity selection circuit without the feedback to block the late arrival signal, the decision circuit will not lock in the selection once it is made. As a result, the timing issue between the final enable signal 305 and the final polarity signal 307 is critical. An Exclusive-NOR gate 370 is used to generate the final enable signal 305. Since the final enable signal has exactly the same time period as the arrival-time difference signal, this BPFD in the sixth embodiment 372 will generate a dead-zone.

INDUSTRIAL APPLICABILITY

In the field of consumer electronics there is significant interest in detecting phase, frequency and arrival-time differences between signals, particularly in order to control voltage controlled oscillators as part of a phase locked loop circuit. Such circuits would be of considerable utility as, for instance, in synchronizing local clocks in a personal computer.

The invention claimed is:

1. A method of detecting a difference in phase, frequency and arrival-time between signals, said method comprising the steps of:
   providing a first signal (118) and a second signal (120) to input terminals of a first phase frequency detection circuit (280) and a second complementary phase frequency detection circuit (282);
   selecting a polarity signal (307) as an input to a single-ended charge pump (188), said polarity signal (307) being an output signal of said first phase frequency detection circuit (280) when said first signal (118) leads said second signal (120), and an output signal of said second, complementary phase frequency detection circuit (282) when said first signal (118) lags said second signal (120): and,
   generating an enabling signal (305) to enable said single-ended charge pump, said enabling signal (305) being a second output signal of said first phase frequency detection circuit (280) when said first signal (118) leads said second signal (120), and a second output of said second, complementary phase frequency detection circuit (282) when said first signal (118) lags said second signal (120).

2. The method of claim 1 wherein said first phase frequency detection circuit (280) comprises a first reference flip-flop (122), a first VCO flip-flop (124) and a first AND logic gate (126) adapted so as to provide a phase frequency detection circuit capable of driving a single-ended charge pump; and said second, complementary phase frequency detection circuit (282) comprises a second reference flip-flop (220) generating an inverted output, a second VCO flip-flop (218) generating an inverted output and a second AND logic gate (222) adapted so as to provide a phase frequency detection circuit capable of driving a single-ended charge pump.

3. The method of claim 2 wherein said step of selecting a polarity signal (307) further comprises using an output signal of said first reference flip-flop (122) when said first signal (118) leads said second signal (120), and using said inverted output signal of second VCO flip-flop (218) when said first signal (118) lags said second signal (120).

4. The method of claim 3 wherein said step of selecting a polarity signal (307) further comprises providing a polarity selection circuit (284), said polarity selection circuit comprising a third AND gate (234), and a first OR gate (236) and wherein an output from said third AND gate (234) provides an input to said first OR gate (236).

5. The method of claim 4 wherein said step of enabling (305) said single-ended charge pump further comprises providing an enabling circuit (286) comprising a third OR gate (244), thereby providing an phase-frequency-arrival-time detector having only two stable output states, the high, the low and no dead zone.

6. The method of claim 4 wherein said enabling circuit (286) further comprises a fourth AND gate (240) and a fifth AND gate (242).

7. The method of claim 6 wherein said step generating an enabling signal (305) further comprises providing outputs from said first reference flip-flop (122) and said first VCO flip-flop (124) as inputs to a first exclusive-OR gate (210), and providing the output of said first exclusive-OR gate (210) as an input to said enabling circuit (286); and providing inverted outputs from said second reference flip-flop (220) and said second VCO flip-flop (218) as inputs to a second exclusive-OR gate (224), and providing the output of said second exclusive-OR gate (224) as an input to said enabling circuit (286), thereby providing an phase-frequency-arrival-time detector having four stable output states, the high, the low, the linear and a jitterless dead zone 175.

8. The method of claim 6 wherein said step of generating an enabling signal (305) further comprises providing an output from said first VCO flip-flop (124) as an input to said enabling circuit (286); and providing an inverted output from said second reference flip-flop (220) as an input to said enabling circuit (286).

9. The method of claim 8 wherein said step of selecting a polarity signal (307) further comprises providing said output signal of said first reference flip-flop (122) as an input signal to said polarity selection circuit (284); and providing said inverted output signal of said second VCO flip-flop (218) as an input signal to said polarity selection circuit (284); thereby providing an phase-frequency-arrival-time detector having only two stable output states, the high, the low and no dead zone.

10. The method of claim 6 wherein said step generating an enabling signal (305) further comprises providing an output from said first VCO flip-flop (124) as an input to a first enable signal reducer 317; and providing an inverted output from said second reference flip-flop (220) as an input to a second enable signal reducer 316.

11. The method of claim 10 wherein said step of selecting a polarity signal (307) further comprises providing said output signal of said first reference flip flop (122) as an input to first inverter (346), and wherein said first inverter (346) is linked in parallel with a second inverter (348), and wherein the output of said second inverter (348) is an input signal to said polarity selection circuit (284); providing said output signal of said second VCO flip flop (218) as an input to third inverter (350), and wherein said third inverter (350) is linked in parallel with a forth inverter (352), and wherein the output of said forth inverter (352) is an input signal to said polarity selection circuit (284), thereby providing an phase-frequency-arrival-time detector having only three stable output states, the high, the low and a linear zone, but no deadzone.

12. The method of claim 6 wherein said step generating an enabling signal (305) further comprises providing an output from said first reference flip-flop (122) and an output from said first VCO flip-flop (124) as inputs to a forth OR gate (360); and providing an output from said second reference flip-flop (220) and an output from said second VCO flip-flop (218) as inputs to a fifth OR gate (362); and wherein said step of selecting a polarity signal (307) further comprises providing an output signal from said first VCO flip-flop (124) as an input to a first enable signal reducer 317; and providing an inverted output from said second reference flip-flop (220) as an input to a second enable signal reducer 316, thereby providing an phase-frequency-arrival-time detector having only three stable output states, the high, the low and a linear zone, but no deadzone.

13. The method of claim 3 wherein said step of selecting a polarity signal (307) further comprises providing a polarity selection circuit (284), said polarity selection circuit comprising a first OR gate (368); and wherein said step of enabling (305) said single-ended charge pump further comprises providing an enabling circuit (286) comprising a first exclusive OR gate (370), thereby providing an phase-frequency-arrival-time detector having four stable output states, the high, the low, the linear and a jitterless dead zone (175).

14. A circuit for detecting a phase-frequency-arrival-time difference between signals, comprising:
a first signal (118) and a second signal (120);
a single-ended charge pump (188) having a polarity signal (307) input and an enabling signal (305) to enable said single-ended charge pump, and wherein when said first signal (118) leads said second signal (120), said polarity signal (307) is a first output signal of a first phase frequency detection circuit (280) and said enabling signal (305) is a second output signal of said first phase frequency detection circuit (280), and wherein when said first signal (118) lags said second signal (120), said polarity signal (307) is a first output signal of a second, complementary phase frequency detection circuit (282) and said enabling signal (305) is a second output signal of said second, complementary phase frequency detection circuit (282).

15. The circuit of claim 14 wherein said first phase frequency detection circuit (280) comprises a first reference flip-flop (122), a first VCO flip-flop (124) and a first AND logic gate (126) connected so as to provide a phase frequency detection circuit capable of driving a single-ended charge pump; and said second, complementary phase frequency detection circuit (282) comprises a second reference flip-flop (220) generating an inverted output, a second VCO flip-flop (218) generating an inverted output and a second AND logic gate (222) adapted so as to provide a phase frequency detection circuit capable of driving a single-ended charge pump.

16. The circuit of claim 15 wherein said first output signal of said first phase frequency detection circuit (280) is an output signal of said first reference flip-flop (122), and said first output signal of said second, complementary phase frequency detection circuit (282) is an inverted output signal of said second VCO flip-flop (218).

17. The circuit of claim 16 further comprising a polarity selection circuit (284), said polarity selection circuit comprising a third AND gate (234), a first OR gate (236) and wherein an output from said third AND gate (234) provides an input to said first OR gate (236).

18. The circuit of claim 17 further comprising an enabling circuit (286) comprising a third OR gate (244).

19. The circuit of claim 17 further comprising an enabling circuit (286) comprising a fourth AND gate (240) with an inverting input, a fifth AND gate (242) and a third OR gate (244).

20. The circuit of claim 19 further comprising a first exclusive OR gate (210) having said first reference flip-flop (122) and said first VCO flip-flop (124) output signals as inputs, and wherein the output of said first exclusive OR gate (210) is an input to said enabling circuit (286); and a second exclusive OR gate (224) having said second reference flip-flop (220) and said second VCO flip-flop (218) inverted outputs as inputs, and wherein the output of said second exclusive OR gate (224) is an input to said enabling circuit (286), thereby providing an phase-frequency-arrival-time detector having four stable output states, the high, the low, the linear and a jitterless dead zone 175.

21. The circuit of claim 18 wherein the output of said first VCO flip-flop (124) is supplied aas an inputs to said enabling circuit (286) via a first enable signal reducer (317);

and an inverted output from said second reference flip-flop (220) is provided an input to said enabling circuit (286) via a second enable signal reducer (316); and an output signal of said first reference flip-flop (122) is provided as an input signal to said polarity selection circuit (284) via a first and a second inverter (346, 348); and an inverted output signal of said second VCO flip-flop (218) is provided as an input signal to said polarity selection circuit (284) via a third and a forth inverter (346, 348); thereby providing an phase-frequency-arrival-time detector having only two stable output states, the high, the low and no dead zone.

22. The circuit of claim 18 further comprising a fourth OR gate (360) having outputs from said first reference flip-flop (122) and said first VCO flip-flop (124) as inputs, and wherein the output of said fourth OR gate (360) is an input to said enabling circuit (286); and a fifth OR gate with inverting inputs (298) having inverted outputs from said second reference flip-flop (220) and said second VCO flip-flop (218) as inputs, and wherein the output of said fifth OR gate with inverting inputs (298) is an input to said enabling circuit (286); and further comprising a first reducer (317) having said output signal of said first reference flip-flop (122) as an input signal, and wherein an output of said first reducer (317) is using in conjunction with an output of said polarity selection circuit (284) to provide said final polarity 307; and a second reducer (316) having said output signal of said second VCO flip-flop (218) as an input signal, and wherein an output of said second reducer (316) is used in conjunction with an output signal of said polarity selection circuit (284) to provide said final polarity 307; thereby providing an phase-frequency-arrival-time detector having only three stable output states, the high, the low and a linear zone, but no deadzone.

23. The of claim 16 further comprising a polarity selection circuit (284), said polarity selection circuit comprising a first OR gate (368); and an enabling circuit (286) comprising a first exclusive OR gate (370), thereby providing an phase-frequency-arrival-time detector having four stable output states, the high, the low, the linear and a jitterless dead zone (175).

24. A system for detecting a phase-frequency-arrival-time difference between signals, comprising:

means for accepting first signal (118) and a second signal (120);

means for providing a polarity signal (307) to a single-ended charge pump (188) such that said polarity signal (307) is an output signal of a first phase frequency detection circuit (280) when said first signal (118) leads said second signal (120), and an output signal of a second, complementary phase frequency detection circuit (282) when said first signal (118) lags said second signal (120); and means for generating an enabling signal (305) to enable said single-ended charge pump, such that said enabling signal 305 is a second output signal of said first phase frequency detection circuit (280) when said first signal (118) leads said second signal (120), and a second output of said second, complementary phase frequency detection circuit (282) when said first signal (118) lags said second signal (120).

25. The system of claim 24 wherein said first phase frequency detection circuit (280) comprises a first reference flip-flop (122), a first VCO flip-flop (124) and a first AND logic gate (126) adapted so as to provide a phase frequency detection circuit capable of driving a single-ended charge pump; and said second, complementary phase frequency detection circuit (282) comprises a second reference flip-flop (220) generating an inverted output, a second VCO flip-flop (218) generating an inverted output and a second AND logic gate (222) adapted so as to provide a phase frequency detection circuit capable of driving a single-ended charge pump.

26. The system of claim 25 wherein said means for providing said polarity signal (307) further comprises means for selecting an output signal of said first reference flip-flop (122) when said first signal (118) leads said second signal (120), and means for selecting said inverted output signal of second VCO flip-flop (218) when said first signal (118) lags said second signal (120).

27. The system of claim 26 wherein said means for providing said polarity signal 307 comprises a polarity selection circuit (284), said polarity selection circuit comprising a third AND gate (24) and a third OR gate (236) and wherein an output from said third AND gate (234) provides an input to said third OR gate (236).

28. The system of claim 27 wherein said means for generating an enabling signal (305) comprises an enabling circuit (286) comprising a forth OR gate (244).

29. The system of claim 27 wherein said means for generating an enabling signal (305) comprises an enabling circuit (286) comprising a forth AND gate (240), a fifth AND gate (242) and a forth OR gate (244).

30. The system of claim 29 wherein said means for generating an enabling signal (305) further comprises a first exclusive OR gate (210) having outputs from said first reference flip-flop (122) and said first VCO flip-flop (124) as inputs, and wherein the output of said first exclusive OR gate (210) is an input to said enabling circuit (286); and a second exclusive OR gate (224) having inverted outputs from said second reference flip-flop (122) and said second VCO flip-flop (124) as inputs, and wherein the output of said second exclusive OR gate (224) is an input to said enabling circuit (286), thereby providing an phase-frequency-arrival-time detector having four stable output states, the high, the low, the linear and a jitterless dead zone.

31. The system of claim 29 wherein said means for generating an enabling signal (305) further comprises having an output from said first VCO flip-flop (124) as an input to said enabling circuit (286); and an inverted output from said second reference flip-flop (220) as an input to said enabling circuit (286), thereby proving an phase-frequency-arrival-timel detector having only two stable output states, the high, the low and no dead zone.

32. The system of claim 29 wherein said means for generating an enabling signal (305) further comprises an output of said first VCO flip-flop (124) as an input to a first enable signal reducer means (317); and an inverted outputs from said second reference flip-flop (220) as an input to a second enable signal reducer means (316); and wherein said means for selecting said final polarity signal (307) further comprises having said output signal of said first reference flip-flop (122) as an input signal fed via a first and second inverting means (346, 348) as an input signal to said means for selecting a polarity (284); and an output signal of said second VCO flip-flop (218) as an input signal fed via a third and forth inverting means (350, 352) to said means for selecting a polarity (284); thereby providing an phase-frequency-arrival-time detector having only three stable output states, the high, the low and a linear zone, but no deadzone.

33. The system of claim 29 wherein said means for generating an enabling signal (305) a fourth OR gate (360) having outputs from said first reference flip-flop (122) and said first VCO flip-flop (124) as inputs, and wherein the output of said fourth OR gate (360) is an input to said enabling circuit (286); and a fifth OR gate with inverting inputs (298) having inverted outputs from said second reference flip-flop (220) and said second VCO flip-flop (218) as inputs, and wherein the output of said fifth OR gate with inverting inputs (298) is an input to said enabling circuit (286); and wherein said means for selecting a polarity signal (307) further comprises a first reducer means (317) having said output signal of said first reference flip-flop (122) as an input signal, and wherein an output of said first reducer means (317) is using in conjunction with an output of said polarity selection circuit (284) to provide said final polarity 307; and a second reducer means (316) having said output signal of said second VCO flip-flop (218) as an input signal, and wherein an output of said second reducer means (316) is used in conjunction with an output signal of said polarity selection circuit (284) to provide said final polarity 307; thereby providing an phase-frequency-arrival-time detector having only three stable output states, the high, the low and a linear zone, but no deadzone.

34. The system of claim 28 wherein said means for selecting a polarity signal (307) further comprises a polarity selection circuit (284), said polarity selection circuit comprising a first OR gate (368); and wherein said means for enabling (305) said single-ended charge pump further comprises an enabling circuit (286) comprising a first exclusive OR gate (370), thereby providing an phase-frequency-arrival-time detector having four stable output states, the high, the low, the linear and a jitterless dead zone (175).

\* \* \* \* \*